(12) United States Patent
Mitsuhashi

(10) Patent No.: US 9,425,138 B2
(45) Date of Patent: Aug. 23, 2016

(54) SEMICONDUCTOR DEVICE HAVING THROUGH-ELECTRODE

(71) Applicant: ROHM CO., LTD., Kyoto (JP)

(72) Inventor: Toshiro Mitsuhashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 152 days.

(21) Appl. No.: 13/890,674

(22) Filed: May 9, 2013

(65) Prior Publication Data

US 2013/0307155 A1    Nov. 21, 2013

(30) Foreign Application Priority Data

May 15, 2012  (JP) ................................ 2012-111850

(51) Int. Cl.
| | | |
|---|---|---|
| H01L 23/498 | (2006.01) | |
| H01L 23/48 | (2006.01) | |
| H01L 21/768 | (2006.01) | |
| H01L 25/18 | (2006.01) | |
| H01L 23/00 | (2006.01) | |

(52) U.S. Cl.
CPC .... *H01L 23/49827* (2013.01); *H01L 21/76805* (2013.01); *H01L 21/76898* (2013.01); *H01L 23/481* (2013.01); *H01L 25/18* (2013.01); *H01L 24/05* (2013.01); *H01L 24/11* (2013.01); *H01L 24/13* (2013.01); *H01L 2221/68372* (2013.01); *H01L 2224/0401* (2013.01); *H01L 2224/05025* (2013.01); *H01L 2224/11002* (2013.01); *H01L 2224/131* (2013.01); *H01L 2224/13025* (2013.01); *H01L 2224/14181* (2013.01); *H01L 2224/16146* (2013.01); *H01L 2224/94* (2013.01); *H01L 2225/06517* (2013.01); *H01L 2225/06544* (2013.01); *H01L 2225/06572* (2013.01)

(58) Field of Classification Search
None
See application file for complete search history.

(56) References Cited

U.S. PATENT DOCUMENTS

| | | | |
|---|---|---|---|
| 7,094,701 B2 | 8/2006 | Umemoto et al. | |
| 2006/0024966 A1 | 2/2006 | Umemoto et al. | |
| 2006/0073701 A1 | 4/2006 | Koizumi et al. | |
| 2006/0087042 A1* | 4/2006 | Kameyama | H01L 21/76898 257/774 |
| 2006/0108691 A1* | 5/2006 | Kameyama | H01L 21/76898 257/758 |
| 2010/0102454 A1 | 4/2010 | Akiyama | |
| 2011/0089571 A1* | 4/2011 | Matsuo | H01L 21/6835 257/774 |
| 2011/0227227 A1* | 9/2011 | West | H01L 21/76898 257/757 |

(Continued)

FOREIGN PATENT DOCUMENTS

| | | |
|---|---|---|
| JP | H07-254536 A | 10/1995 |
| JP | 2006-032695 A | 2/2006 |

(Continued)

*Primary Examiner* — Steven Loke
*Assistant Examiner* — Juanita Rhodes
(74) *Attorney, Agent, or Firm* — Rabin & Berdo, P.C.

(57) ABSTRACT

A semiconductor device according to the present invention includes a semiconductor substrate, a surface electrode provided on a front surface of the semiconductor substrate through an insulating film, a via, passing through the semiconductor substrate from a rear surface thereof up to the front surface to reach the surface electrode, having a wall including a flange portion inwardly projecting on a front surface portion of the semiconductor substrate, a via insulating film formed on the wall of the via, and a through-electrode embedded inside the via insulating film and electrically connected to the surface electrode, while the via insulating film has portions having different thickness compensating for a step between the flange portion and the remaining portion of the wall, to planarize a contact surface with the through-electrode.

17 Claims, 50 Drawing Sheets

(56) References Cited

U.S. PATENT DOCUMENTS

| | | |
|---|---|---|
| 2012/0061827 A1 | 3/2012 | Fujita |
| 2012/0112361 A1* | 5/2012 | Han .................. H01L 23/49833 257/774 |
| 2012/0199984 A1 | 8/2012 | Fujita et al. |
| 2012/0235305 A1* | 9/2012 | Kim .................... H01L 23/3135 257/774 |
| 2014/0217560 A1 | 8/2014 | Fujita |

FOREIGN PATENT DOCUMENTS

| | | |
|---|---|---|
| JP | 2006-108236 A | 4/2006 |
| JP | 2007-294821 A | 11/2007 |
| JP | 2008-085238 A | 4/2008 |
| JP | 2010-103433 A | 5/2010 |
| JP | 2010-161215 A | 7/2010 |
| JP | 2010-251791 A | 11/2010 |
| JP | 2012-084871 A | 4/2012 |

* cited by examiner

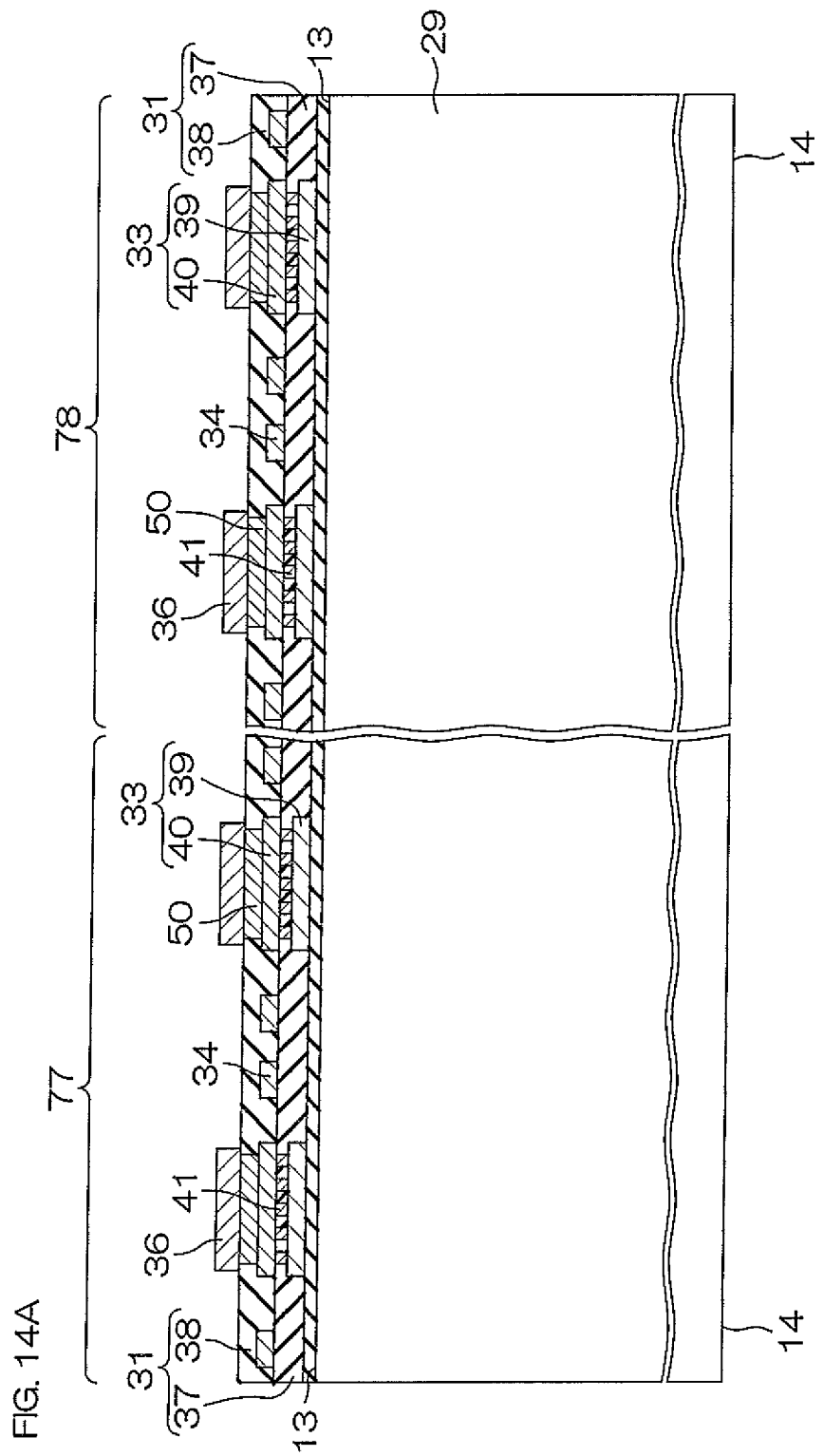

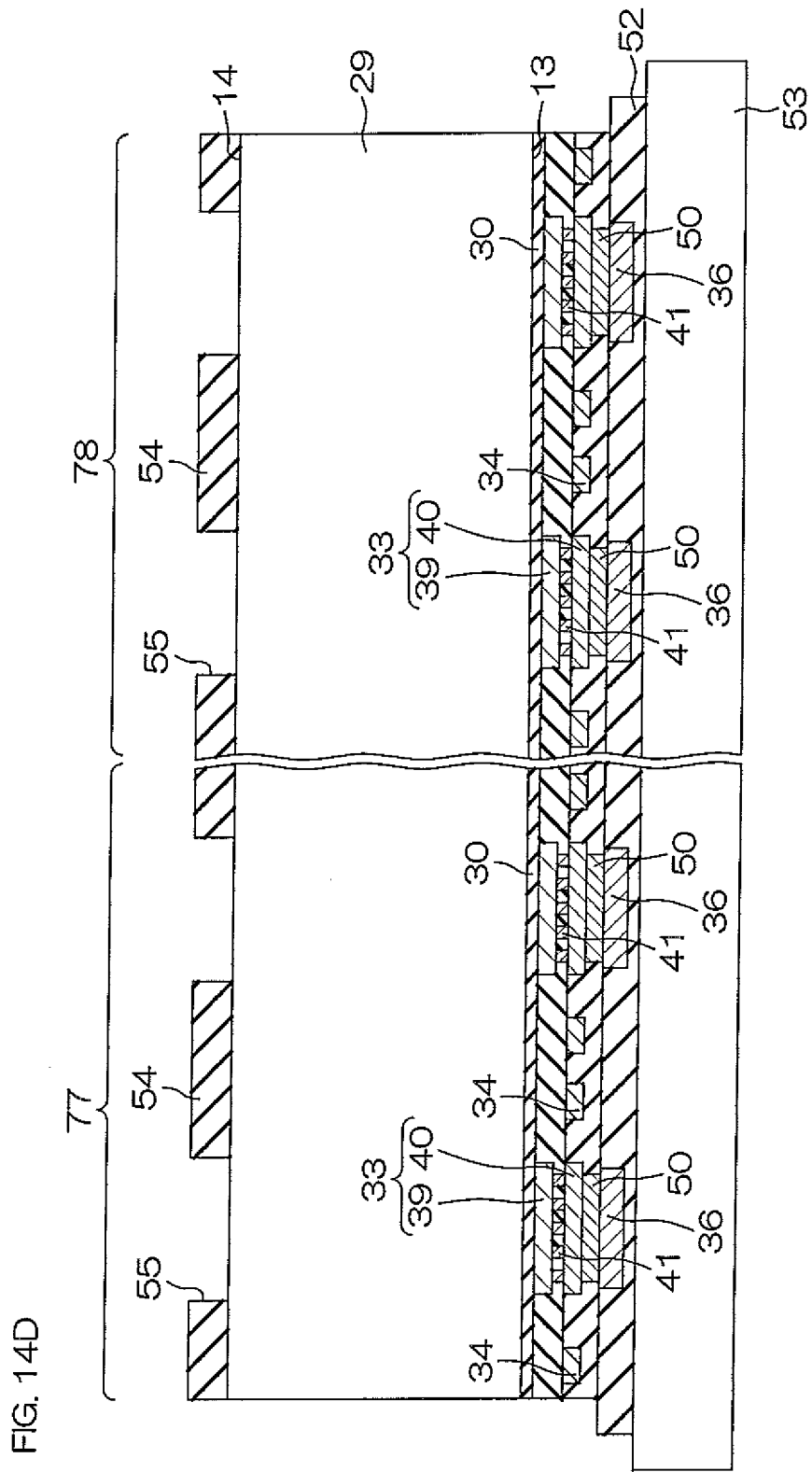

SEMICONDUCTOR DEVICE HAVING THROUGH-ELECTRODE

BACKGROUND OF THE INVENTION

1. Field of the Invention

The present invention relates to a semiconductor device having a through-electrode, a method of manufacturing the same, and an electronic component (a package) including the semiconductor device.

2. Description of Related Art

A technique of forming a miniature, high-capacity and highly functional electronic component by stacking a plurality of semiconductor devices having through-electrodes has recently been developed.

Semiconductor devices having through-electrodes are disclosed in Patent Document 1 (Japanese Unexamined Patent Publication No. 2006-32695) and Patent Document 2 (Japanese Unexamined Patent Publication No. 2007-294821), for example.

SUMMARY OF THE INVENTION

A first object of the present invention is to provide a semiconductor device capable of compatibly attaining refinement of a through-electrode and size reduction of a surface electrode and a method of manufacturing the same.

A second object of the present invention is to provide a semiconductor device capable of preventing a via insulating film from formation of an overhang on an opening end of a via or capable of suppressing the size of such an overhang and a method of manufacturing the same.

A third object of the present invention is to provide a semiconductor device capable of preventing diffusion of Cu from a through-electrode and a method of manufacturing the same.

A fourth object of the present invention is to provide a method of manufacturing a semiconductor device capable of preventing vias from formation of notches when forming the vias by simultaneously etching a plurality of element regions on a semiconductor wafer.

A fifth object of the present invention is to provide an electronic component capable of implementing miniaturization, capacity enlargement and high functionalization by providing a through-electrode on a semiconductor device in high density.

The foregoing and other objects, features and effects of the present invention will become more apparent from the following detailed description of the embodiments with reference to the attached drawings.

DETAILED DESCRIPTION OF THE EMBODIMENTS

Figure 1:
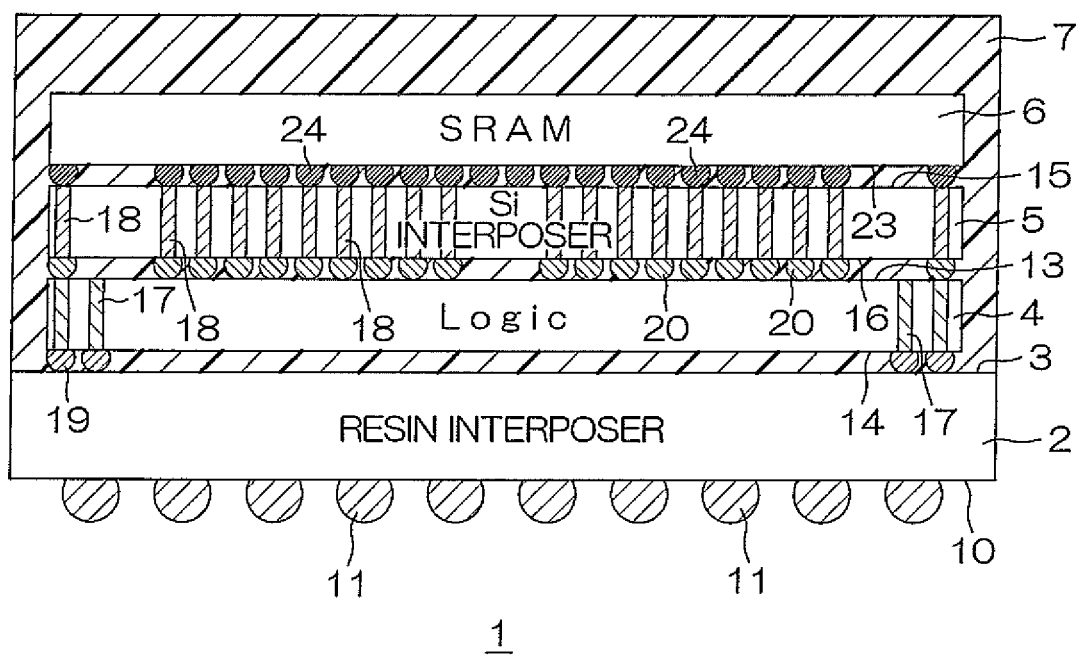
FIG. 1 is a schematic sectional view of an electronic component according to an embodiment of the present invention.

A semiconductor device according to a first aspect of the present invention for attaining the aforementioned first and second objects includes a semiconductor substrate comprised of a semiconductor material, a surface electrode provided on a front surface of the semiconductor substrate through an insulating film, a via passing through the semiconductor substrate from a rear surface thereof up to the front surface to reach the surface electrode, having a wall including a flange portion inwardly projecting on a front surface portion of the semiconductor substrate, a via insulating film formed on the wall of the via, and a through-electrode embedded in the via inside the via insulating film and electrically connected to the surface electrode, while the via insulating film has portions having different thickness thereof compensating for a step between the flange portion and the remaining portion of the wall, to planarize a contact surface with the through-electrode.

The semiconductor device according to the first aspect of the present invention can be manufactured by a method of manufacturing a semiconductor device according to the first aspect of the present invention, including the steps of forming a surface electrode on a front surface of a semiconductor substrate through an insulating film, forming a recess by selectively etching the semiconductor substrate from a rear surface thereof and stopping the etching so that a bottom portion of the recess is positioned in the vicinity of the front surface and the semiconductor substrate is not penetrated, forming a first insulating film on an inner surface of the recess, selectively removing the first insulating film on the bottom of the recess, selectively removing the semiconductor substrate at the bottom of the recess to form a via passing through the semiconductor substrate and to simultaneously selectively form a flange portion of the front surface of the semiconductor substrate at the bottom of the via, forming a second insulating film on an inner surface of the via covering the first insulating film and the flange portion, selectively removing a bottom portion of the second insulating film, and forming a through-electrode electrically connected to the surface electrode by forming an electrode material on the inner surface of or into the via.

According to this method, the via passing through the semiconductor substrate is formed by selectively etching the semiconductor substrate at the bottom of the recess while leaving the first insulating film on the wall (inner surface) thereof. Below the first insulating film, therefore, the wall of the via selectively inwardly projects as the flange portion by the thickness of the first insulating film. Then, the second insulating film is formed in the via, to cover the first insulating film and the flange portion. Thus, the thickness difference compensating for the step between the flange portion and the remaining portion of the wall can be provided on the via insulating film, to planarize the surface of the via insulating film in contact with the through-electrode.

The inner diameter of the via is reduced by the thickness of the insulating film on the position of the flange portion, whereby the area of the through-electrode in contact with the surface electrode can be reduced. Even if the position where the via is formed slightly deviates from the surface electrode, therefore, the through-electrode can be reliably brought into contact with the surface electrode, due to the aforementioned small contact area.

Dissimilarly to a conventional case of regularly designing a surface electrode to be greater in diameter than a via in consideration of alignment accuracy for patterning the via, therefore, the through-electrode can be reliably brought into contact with the surface electrode also when the surface electrode is reduced in size, whereby the flexibility for the size of the surface electrode can be spread.

Thus, in the semiconductor device according to the present invention, the surface electrode can be more reduced in size as compared with the conventional case, when the through-electrode is refined. Consequently, the through-electrode can be provided in high density, whereby a miniature, high-capacity and highly functional semiconductor device can be implemented.

Further, a space between surface electrodes adjacent to each other can be widened due to the size reduction of the surface electrode, whereby the space can be effectively utilized. For example, a wire or the like can be set on the space.

According to a conventional method, a relatively thick insulating film may have been formed on the inner surface of a via, in order to reduce the volume of a through-electrode. If the thickness of the insulating film for the via is increased at a time, however, there is a high possibility that an overhang is formed on an opening end of the via due to influence by the coverage of the insulating film. When the overhang is formed, a sputter seed film is hard to form on the inner surface of the via, and hence a void is easily formed when the through-electrode is formed on the via by plating.

In the method of manufacturing a semiconductor device according to the first aspect of the present invention, therefore, the via insulating film is formed through the two steps of forming the first insulating film and forming the second insulating film, whereby the via insulating film can be prevented from formation of an overhang on the opening end of the via, or the size of such an overhang can be suppressed. Consequently, formation of a void can be prevented when the through-electrode is formed. When the first and second insulating films are set to proper thicknesses, further, the via insulating film exhibits a sufficient thickness as a whole, whereby the volume of the through-electrode can be sufficiently reduced.

Preferably, the via insulating film includes a body portion covering the wall of the via and a rear surface portion covering the rear surface of the semiconductor substrate, and the body portion and the rear surface portion are continuous with each other to follow an opening shape of the via, not to project into the via. In other words, preferably no overhang is formed on a position where the body portion and the rear surface portion of the via insulating film intersect with each other.

In order to more effectively prevent formation of an overhang, the step of forming the first insulating film preferably includes a step of forming a first insulating film including a body portion covering the inner surface of the recess and a rear surface portion covering the rear surface of the semiconductor substrate, for forming the first insulating film so that the body portion and the rear surface portion are continuous with each other without projecting into the recess in the vicinity of the rear surface of the semiconductor substrate in the method of manufacturing a semiconductor device according to the first aspect of the present invention, for example. More specifically, the step of forming the first insulating film preferably includes a step of forming the first insulating film so that the thickness of the body portion is 0.5 µm to 1 µm. Thus, formation of an overhang is prevented when the first insulating film is formed in advance of the second insulating film forming the outermost layer of the via insulating film, whereby the via insulating film can be effectively prevented from formation of an overhang in the final shape.

Preferably in the method of manufacturing a semiconductor device according to the first aspect of the present invention, the step of selectively removing the first insulating film includes a step of tapering a corner portion of the first insulating film where the body portion and the rear surface portion intersect with each other. According to this method, the via insulating film can be more effectively prevented from formation of an overhang in the final shape.

Preferably, the inner diameter of the flange portion of the via is smaller than the diameter of the surface electrode, and the inner diameter of the remaining portion of the wall is greater than the diameter of the surface electrode. More specifically, the inner diameter of the flange portion of the via is preferably 3 µm to 9 µm, and the inner diameter of the remaining portion of the wall is preferably 5 µm to 10 µm.

The via insulating film may be a single-layer film of silicon oxide. Or, the via insulating film may be a multilayer film including a first silicon oxide film and a second silicon oxide film successively stacked from a side closer to the wall, the first silicon oxide film may be formed on a portion of the wall excluding the flange portion, and may have the same thickness as the step, and the second silicon oxide film may be formed to cover the first silicon oxide film and the flange portion. This structure can be manufactured when the first insulating film and the second insulating film are silicon oxide films in the method of manufacturing a semiconductor device according to the first aspect of the present invention. When both of the first insulating film and the second insulating film are silicon oxide films, the first and second insulating films may be integrated with each other so that the via insulating film is a single-layer film of silicon oxide, or the first and second insulating films may not be completely integrated with each other so that the via insulating film is a multilayer film of virtually overlapping silicon oxide films in the semiconductor device as manufactured.

Preferably, the via insulating film is a multilayer film including a silicon oxide film and a silicon nitride film successively stacked from a side closer to the wall, the silicon oxide film is formed on the wall excluding the flange portion, and has the same thickness as the step, and the silicon nitride film is formed to cover the silicon oxide film and the flange portion. In this case, the semiconductor device according to the first aspect of the present invention may include a barrier film arranged between the via insulating film and the through-electrode. The barrier film may be a tantalum film. This structure can be manufactured when the first insulating film is a silicon oxide film and the second insulating film is a silicon nitride film in the method of manufacturing a semiconductor device according to the first aspect of the present invention. The barrier film may be formed in the via after selectively removing the second insulating film and before forming the through-electrode.

According to this structure, the silicon nitride film forming the outermost layer of the via insulating film can reliably inhibit diffusion of Cu from the through-electrode when the through-electrode is made of Cu, even if such diffusion of Cu cannot be inhibited with the barrier film alone. Consequently, the silicon oxide film forming the via insulating film and an element such as a transistor formed on the semiconductor substrate can be inhibited from deterioration.

The semiconductor device according to the first aspect of the present invention may include a wire set between a plurality of surface electrodes adjacent to each other.

The surface electrode may include a multilayer electrode stacked through an interlayer dielectric film.

The semiconductor device according to the first aspect of the present invention may include a front surface bump for external connection arranged on a position immediately above the through-electrode so that the surface electrode is placed between the front surface bump and the through-electrode, or may include a rear surface bump for external connection arranged on an end portion of the through-electrode closer to the rear surface of the semiconductor substrate. The through-electrode may be provided in the form of a column. The front surface of the semiconductor substrate may include an element forming surface provided with a plurality of semiconductor elements.

A semiconductor device according to a second aspect of the present invention for attaining the aforementioned third object includes a semiconductor substrate, a surface electrode provided on a front surface of the semiconductor substrate through an insulating film, a via passing through the semiconductor substrate from a rear surface thereof up to the front surface to reach the surface electrode, a via insulating film formed on a wall of the via, including a silicon oxide film and a silicon nitride film successively stacked from a side closer to the wall, a through-electrode made of Cu embedded inside the via insulating film and electrically connected to the surface electrode, and a barrier film arranged between the via insulating film and the through-electrode.

The semiconductor device according to the second aspect of the present invention can be manufactured by a method of manufacturing a semiconductor device according to the second aspect of the present invention including the steps of forming a surface electrode on a front surface of a semiconductor substrate through an insulating film, forming a via passing through the semiconductor substrate by selectively etching the semiconductor substrate from a rear surface of the semiconductor substrate, forming a via insulating film including a silicon oxide film and a silicon nitride film successively stacked from a side closer to a wall of the via, forming a barrier film in the via on the via insulating film, and forming a through-electrode to be electrically connected to the surface electrode by forming an electrode material made of Cu on the wall of or into the via.

According to this structure, the silicon nitride film forming the outermost layer of the via insulating film can reliably inhibit diffusion of Cu from the through-electrode, even if such diffusion of Cu cannot be inhibited with the barrier film alone. Consequently, the silicon oxide film forming the via insulating film and an element such as a transistor formed on the semiconductor substrate can be inhibited from deterioration.

In the semiconductor device according to the second aspect of the present invention, the insulating film may have an opening exposing a rear surface of the surface electrode, and the via insulating film may enter the opening, to cover an edge portion of the insulating film partitioning the opening.

Preferably in the semiconductor device according to the second aspect of the present invention, the silicon nitride film is formed to reach the rear surface of the surface electrode following the wall of the via, so that the silicon oxide film is not exposed in the opening of the insulating film.

This structure can be manufactured by carrying out a step of forming the silicon oxide film in the via, selectively removing a bottom portion of the silicon oxide film, and thereafter stacking the silicon nitride film on the silicon oxide film in the method of manufacturing a semiconductor device according to the second aspect of the present invention.

When the barrier film is formed by sputtering, for example, the thickness of the barrier film is easily reduced on a bottom portion (in the vicinity of the surface electrode) of the via due to a relatively high aspect ratio resulting from the sputtering. Therefore, the effect of preventing diffusion of Cu with the barrier film may not be expectable. When the silicon nitride film is formed to reach the rear surface of the surface electrode in this case so that the silicon oxide film or the insulating film on the front surface of the semiconductor substrate is not exposed, diffusion of Cu, uninhibitable with the barrier film, can be reliably inhibited.

In the semiconductor device according to the second aspect of the present invention, the silicon oxide film may have an overlap portion extending in the opening of the insulating film toward the side of the silicon nitride film to cover an end portion of the silicon nitride film.

This structure can be manufactured by carrying out a step of continuously forming the silicon oxide film and the silicon nitride film in the via and thereafter selectively continuously removing bottom portions of the silicon oxide film and the silicon nitride film in the method of manufacturing a semiconductor device according to the second aspect of the present invention.

According to this method, the formation of the silicon oxide film and the silicon nitride film and the selective removal of the silicon oxide film and the silicon nitride film are continuously carried out respectively, whereby the number of steps can be reduced. Consequently, manufacturing efficiency can be improved.

An electronic component according to the first aspect of the present invention for attaining the aforementioned fifth object includes an interposer having a plurality of external terminals on a rear surface thereof, the semiconductor device according to the present invention stacked above such that the rear surface thereof is facing to a front surface of the interposer, a second semiconductor device, having a plurality of rear surface bumps, stacked on the front surface of the semiconductor device so that the rear surface bumps are electrically connected to the through electrode, and a resin package sealing the semiconductor device and the second semiconductor device.

According to this structure, the electronic component is loaded with the semiconductor device according to the present invention, whereby miniaturization, capacity enlargement and high functionalization can be implemented by providing the through-electrode on the semiconductor device in high density.

A method of manufacturing a semiconductor device according to a third aspect of the present invention for attaining the aforementioned fourth object includes the steps of forming surface electrodes on a front surface of a plurality of element regions through an insulating film in a semiconductor wafer, provided with the semiconductor device in each of the element region, forming a first via penetrating the semiconductor wafer in a first element region and forming a recess having a bottom positioned in the vicinity of the front surface in a second element region by selectively etching from a rear surface of the semiconductor wafer, forming a first insulating film on an inner surface of the first via and the recess, selectively removing the first insulating film at the bottom in the first via and the recess, forming a second via passing through the second element region by selectively etching the semiconductor wafer at the bottom of the recess, forming a second insulating film in the first via and the second via, selectively removing the second insulating film at the bottom in the first via and the second via, and forming through-electrodes to be electrically connected to the surface electrodes by forming an electrode material on inner surfaces of or into the first via and the second via.

According to this method, the inner surface of the first via of the first element region is protected with the first insulating film when the second via is formed by further etching the recess formed in the second element region. Even if a lower portion of the first via is overetched in the formation of the second via, therefore, the first insulating film can prevent transverse progress of the overetching. Consequently, the first and second vias can be prevented from formation of notches, whereby sputter seed films can be excellently formed on inner surfaces of the vias. Therefore, formation of voids can be prevented when the through-electrodes are formed in the vias by plating, whereby the yield of the through-electrodes is improved. Further, the second insulating film can also be excellently formed, whereby insulativity of the through-electrodes can be reliably ensured.

Preferably, the method of manufacturing a semiconductor device according to a third aspect of the present invention comprise simultaneously forming the first via and the recess by using different etching rates between the first element region and the second element region.

Embodiments of the present invention are now described in detail with reference to the attached drawings.

<Structure of Electronic Component>

Figure 2:
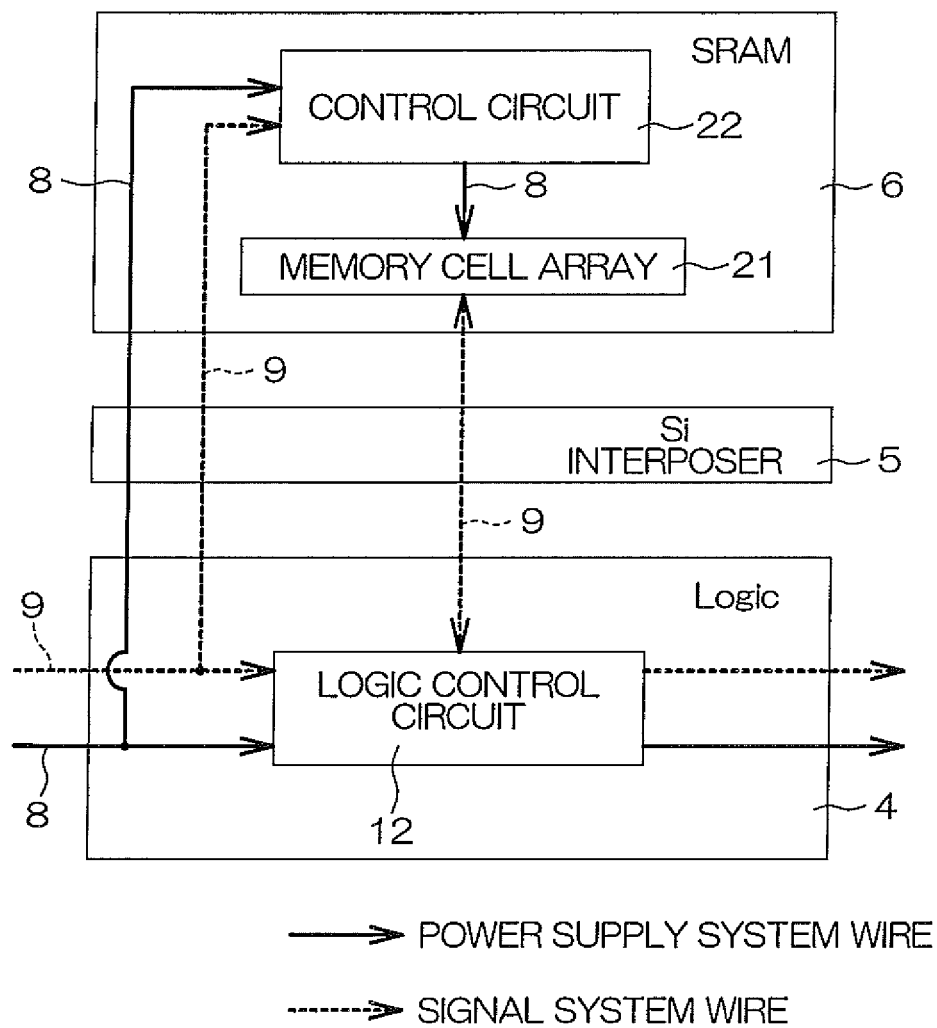
FIG. 2 is a block diagram schematically showing the system structure of the electronic component shown in FIG. 1.

FIG. 1 is a schematic sectional view of an electronic component 1 according to an embodiment of the present invention. FIG. 2 is a block diagram schematically showing the system structure of the electronic component 1 shown in FIG. 1.

The electronic component 1 includes a resin interposer 2, an arithmetic chip 4, an Si interposer 5 and a memory chip 6 successively stacked from a front surface 3 of the resin interposer 2, and a resin package 7, while a power supply system wire 8 and a signal system wire 9 are built into the electronic component 1. The arithmetic chip 4, the Si interposer 5 and the memory chip 6 are examples of a plurality of semiconductor devices stacked on the front surface 3 of the resin interposer 2, and the present invention is not restricted to these.

The resin interposer 2 is formed by a substrate made of resin (epoxy resin, for example), and the arithmetic chip 4 and the like are stacked on the front surface 3 thereof, while a plurality of external terminals 11 are formed on a rear surface 10 thereof. The resin interposer 2 is 14 mm square, and may be 10 mm square to 15 mm square, for example. The thickness of the resin interposer 2 is 0.7 mm, and may be 0.6 mm to 0.7 mm, for example.

The external terminals 11 are employed for electric connection with lands (electrodes) provided on a mounting substrate (a printed wiring board). The external terminals 11, made of a metallic material such as solder, for example, are provided in the form of balls, and arranged in rows and columns at intervals from one another, for example. The external terminals 11 are electrically connected to rear surface bumps 19 (described later) of the arithmetic chip 4 through conductive vias (not shown) passing through the resin interposer 2 between the front surface 3 and the rear surface 10.

The arithmetic chip 4, the Si interposer 5 and the memory chip 6 are identical in size to one another, and so stacked that side surfaces thereof align with one another. The semiconductor chips 4 to 6 are 10 mm square, and may be 6 mm square to 10 mm square, for example. The semiconductor chips 4 to 6 are smaller than the resin interposer 2, and the thickness thereof is 0.05 mm, and may be 0.04 mm to 0.06 mm, for example.

A logic control circuit 12 is built into the arithmetic chip 4 as a semiconductor device provided between the memory chip 6 as a second semiconductor device forming the uppermost layer among the plurality of semiconductor chips 4 to 6 and the resin interposer 2, as shown in FIG. 2. The power supply system wire 8 and the signal system wire 9 of the electronic component 1 are connected to the logic control circuit 12. A plurality of semiconductor elements such as a transistor (a CMOS transistor, for example), a diode, a resistor, a capacitor etc. constituting the logic control circuit 12 are formed on a front surface 13 of the arithmetic chip 4. In other words, the front surface 13 of the arithmetic chip 4 opposed to the memory chip 6 serves as an element forming surface, and the arithmetic chip 4 is stacked on the resin interposer 2 in a posture upwardly directing the element forming surface 13.

The arithmetic chip 4 and the Si interposer 5 as a semiconductor device are provided with a plurality of through-electrodes 17 and a plurality of through-electrodes 18 passing through the arithmetic chip 4 and the Si interposer 5 between the front surface 13 and a front surface 15 and rear surfaces 14 and 16 respectively, and the rear surface bumps 19 and rear surface bumps 20 are provided one by one on end portions of the through-electrodes 17 and 18 closer to the rear surfaces 14 and 16. The rear surface bumps 19 and 20, made of a metallic material such as solder, for example, are provided in the form of balls. The rear surface bumps 19 of the arithmetic chip 4 are electrically connected to the semiconductor elements provided on the front surface 13.

On the other hand, a memory cell array 21 (a cell array of an SRAM: Static Random Access Memory in the embodiment) and a control circuit 22 are built into the memory chip 6 forming the uppermost layer, and the power supply system wire 8 and the signal system wire 9 of the electronic component 1 are connected to the circuits 21 and 22. More specifically, the control circuit 22 is connected to the memory cell array 21 by the power supply system wire 8, while the memory cell array 21 is connected to the logic control circuit 12 of the arithmetic chip 4 by the signal system wire 9. A plurality of semiconductor elements such as a transistor, a diode, a resistor, a capacitor etc. constituting the memory cell array 21 and the control circuit 22 are formed on a rear surface 23 of the memory chip 6. In other words, the rear surface 23 of the memory chip 6 opposed to the arithmetic chip 4 serves as an element forming surface, and the memory chip 6 is stacked on the resin interposer 2 in a posture downwardly directing the element forming surface 23. Further, a plurality of rear surface bumps 24 are provided on the rear surface 23 of the memory chip 6. The rear surface bumps 24, made of a metallic material such as solder, for example, are provided in the form of balls. The rear surface bumps 24 are electrically connected to the semiconductor elements provided on the rear surface 23.

The rear surface bumps 24 of the memory chip 6 are relayed by the through-electrodes 18 and the rear surface bumps 20 of the Si interposer 5, and electrically connected to the through-electrodes 17 and the rear surface bumps 19 of the arithmetic chip 4 at different pitches. Thus, the plurality of stacked semiconductor chips are electrically connected with one another, to be electrically connected to the external terminals 11 of the resin interposer 2.

According to the embodiment, the terminal pitches of the arithmetic chip 4 and the memory chip 6 are different from each other, and hence the Si interposer 5 is arranged between the chips 4 and 6 for electric relaying. If the terminal pitches are absolutely identical to each other, however, the Si interposer 5 may be omitted.

The resin package 7 (made of epoxy resin, for example) seals only the side of the front surface 3 of the resin interposer 2 to expose the rear surface 10 of the resin interposer 2, and entirely covers the arithmetic chip 4, the Si interposer 5 and the memory chip 6, so that the semiconductor chips 4 to 6 are not exposed. The resin package 7 is so formed that side surfaces thereof are flush with those of the resin interposer 2.

Figure 3:
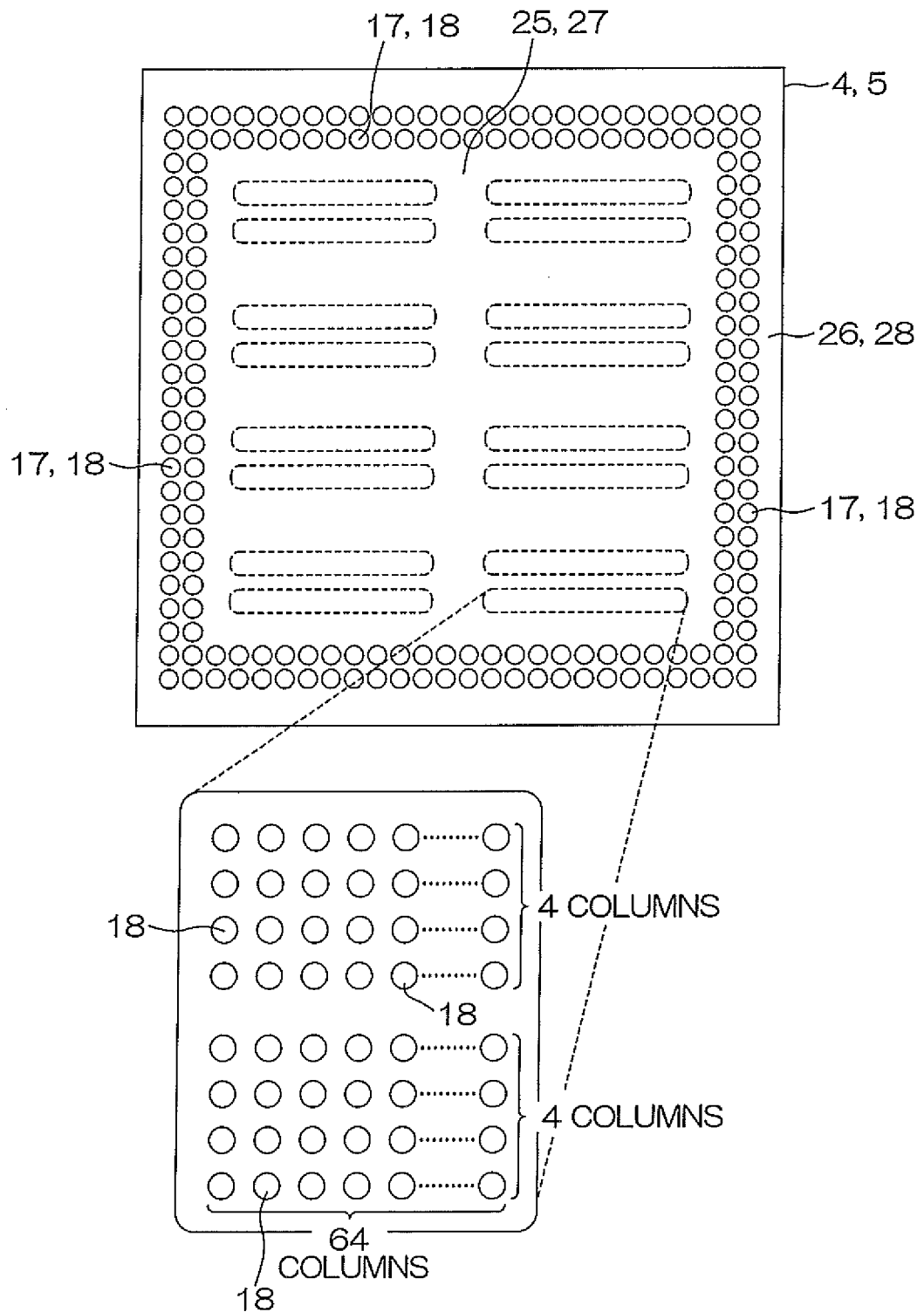
FIG. 3 is a layout diagram of through-electrodes in an Si interposer and an arithmetic chip shown in FIG. 1.

FIG. 3 is a layout diagram of the through-electrodes 17 and 18 in the Si interposer 5 and the arithmetic chip 4 shown in FIG. 1.

According to the embodiment, the through-electrodes 17 and 18 are provided on the arithmetic chip 4 and the Si interposer 5 respectively among the plurality of stacked semiconductor chips 4 to 6, as shown in FIG. 1.

In the arithmetic chip 4, the through-electrodes 17 aligned in a plurality of columns (two columns in the embodiment), for example, are annularly provided along a peripheral edge portion 26 surrounding a central portion 25 of the arithmetic chip 4. Alternatively, the through-electrodes 17 of the arithmetic chip 4 may be irregularly arranged at random, to be annularly provided along the peripheral edge portion 26 of the arithmetic chip 4 as a whole.

Thus, the arithmetic chip 4 can transmit power and electric signals to the memory chip 6 through the through-electrodes 17. In other words, the through-electrodes 17 of the arithmetic chip 4 form the power supply system wire 8 and the signal system wire 9 of the electronic component 1, and the wires 8 and 9 transmit the power and the signals.

In the Si interposer 5, on the other hand, the through-electrodes 18 in a single column, for example, are annularly provided along a peripheral edge portion 28 surrounding a central portion 27 of the Si interposer 5 (the through-electrodes 18 may hereinafter be referred to as through-electrodes 18 of the peripheral edge portion 28), while a plurality of groups, each formed by a plurality of through-electrodes 18, of the through-electrodes 18 are arranged in rows and columns on the central portion 27 surrounded by the peripheral edge portion 28 (the through-electrodes 18 may hereinafter be referred to as through-electrodes 18 of the central portion 27).

The through-electrodes 18 of the peripheral edge portion 28 are arranged immediately above the through-electrodes 17 of the arithmetic chip 4, to be aligned with the through-electrodes 17 of the arithmetic chip 4 respectively.

The groups of through-electrodes 18 of the central portion 27 are divided into a plurality of blocks each formed by a plurality of through-electrodes 18 arranged in rows and columns. More specifically, eight groups of through-electrodes 18 are arranged in two rows and four columns (2 by 4) according to the embodiment, and each group is provided with two blocks each formed by four rows and 64 columns (4 by 64) of through-electrodes 18. In other words, each group is provided with 512 through-electrodes 18 in total. The Si interposer 5 is provided with eight such groups, i.e., 4096 (512 by 8) through-electrodes 18 as a whole.

Thus, the Si interposer 5 can relay electric signals by a bit number (4096 bits in the embodiment) corresponding to the number of the through-electrodes 18 of the central portion 27 between the arithmetic chip 4 (the logic control circuit 12, for example) and the memory chip 6 (the memory cell array 21, for example) through the through-electrodes 18 of the central portion 27, for example. In other words, the through-electrodes 18 of the central portion 27 of the Si interposer 5 form the signal system wire 9 of the electronic component 1, so that the wire 9 bidirectionally transmits/receives electric signals. The arrangement and the number of the through-electrodes 18 are mere examples of the present invention, and can be properly varied with the design of each electronic component 1. For example, the 256 through-electrodes 18 forming each block may be arranged in eight rows and 32 columns (8 by 32).

Further, the Si interposer 5 can relay power and electric signals transmitted from the arithmetic chip 4 to the memory chip 6 (the control circuit 22, for example) through the through-electrodes 18 of the peripheral edge portion 28, for example. In other words, the through-electrodes 18 of the peripheral edge portion 28 of the Si interposer 5 form the power supply system wire 8 and the signal wire 9 of the electronic component 1, so that the wires 8 and 9 transmit the power and the electric signals.

The structure of the arithmetic chip 4 shown in FIG. 1 is now described with reference to five embodiments.

First Embodiment

Figure 4:
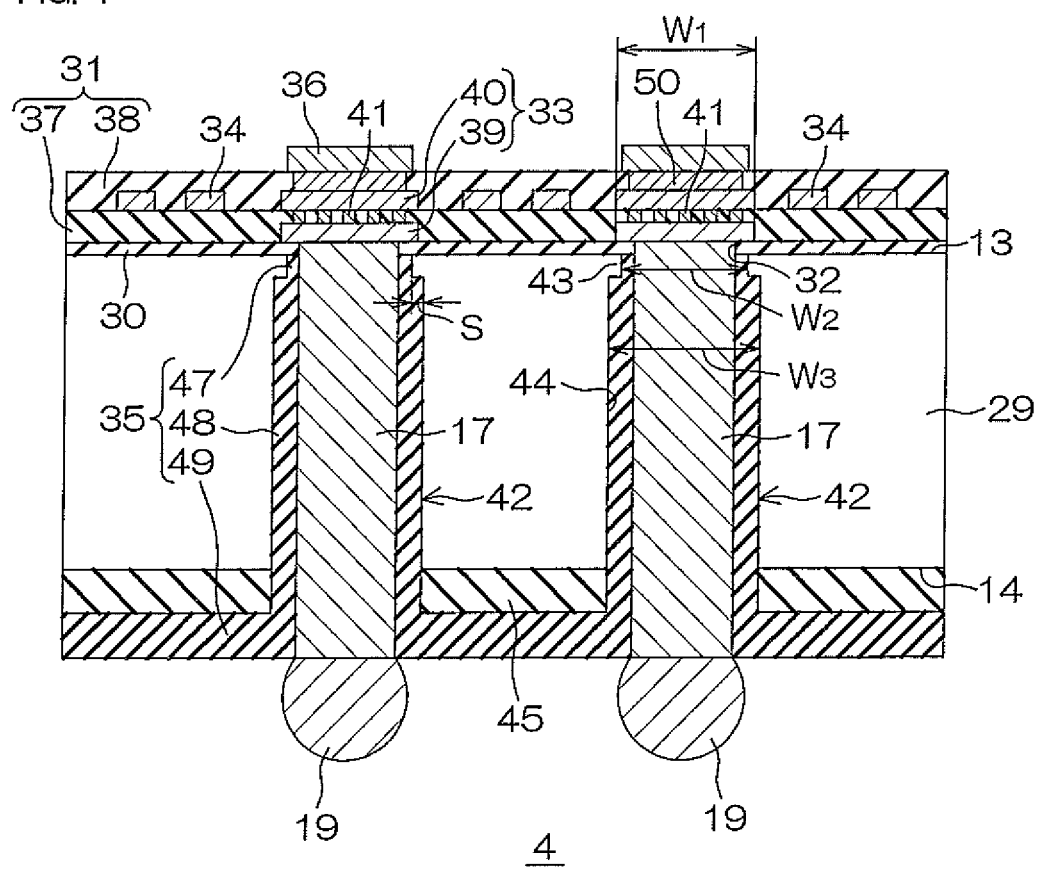
FIG. 4 is a schematic sectional view for illustrating the structure of the arithmetic chip (a first embodiment) shown in FIG. 1.

FIG. 4 is a schematic sectional view for illustrating the arithmetic chip 4 (a first embodiment) shown in FIG. 1.

The arithmetic chip 4 includes an Si substrate 29 as a semiconductor substrate forming the body of the arithmetic chip 4. That is, the Si substrate 29 is comprised of a semiconductor material, i.e., Si. The arithmetic chip 4 further includes a gate insulating film 30, interlayer dielectric films 31, surface pads 33 as surface electrodes, interpad wires 34, vias 42, a via insulating film 35, through-electrodes 17, front surface bumps 36 and rear surface bumps 19.

The Si substrate 29 is a substrate of 30 μm to 50 μm in thickness, for example, while the gate insulating film 30 and a plurality of (in the first embodiment, two) interlayer dielectric films 31 are stacked on a front surface 13 (an element forming surface) thereof in this order. The gate insulating film 30 is integral with a gate insulating film 30 of a transistor (not shown) formed on the front surface 13, and shared by the arithmetic chip 4 and the transistor. The gate insulating film 30 has openings 32 exposing rear surfaces of the surface pads 33.

The surface pads 33 are made of aluminum (Al), and have a multilayer pad structure stacked on the gate insulating film 30 and the interlayer dielectric film (a first interlayer dielectric film 37) located between the gate insulating film 30 and the uppermost interlayer dielectric film (a second interlayer dielectric film 38) respectively.

According to the first embodiment, the surface pads 33 have a two-layer pad structure and include lower pads 39 formed on the gate insulating film 30 and upper pads 40 formed on the first interlayer dielectric film 37, while the lower pads 39 and the upper pads 40 vertically overlapping one another are electrically connected through a plurality of conductive vias 41 passing through the first interlayer dielectric film 37. The surface pads 33 are not restricted to the two-layer structure, but may have a three-, four-, five- or more layer structure, for example. Further, the surface pads 33 may be made of another metallic material such as copper (Cu).

The surface pads 33 are formed oppositely to the openings 32 of the gate insulating film 30 on the insulating films 30 and 37, to block the openings 32. The surface pads 33 have a diameter $W_1$ greater than that of the openings 32 of the gate insulating film 30.

A plurality of interpad wires 34 are selectively set between the upper pads 40 adjacent to one another on the first interlayer dielectric film 37. Alternatively, the interpad wires 34 may be set between the lower pads 39 on the gate insulating film 30.

The vias 42 pass through the Si substrate 29 from the rear surface 14 up to the front surface 13, to reach the surface pads 33. The vias 42 are provided in the form of columns, for example. The vias 42 have peripheral walls 44 including flange portions 43 inwardly extending on a front surface portion (in the vicinity of the front surface 13) of the Si substrate 29. The flange portions 43 form the front surface 13 of the Si substrate 29. That is, the flange portions 43 are formed from the Si substrate 29 and comprise the semiconductor material, i.e., Si.

The via insulating film 35 is formed by a single-layer film of silicon oxide, and provided on the peripheral walls 44 of the vias 42 and the whole region of the rear surface 14 of the Si substrate 29. According to the first embodiment, the via insulating film 35 includes a bottom portion 47 covering the flange portions 43 of the vias 42, a body portion 48 covering the remaining portions (portions other than the flange portions 43) of the peripheral walls 44 and a rear surface portion 49 covering the rear surface 14 of the Si substrate 29. The bottom portion 47, the body portion 48 and the rear surface portion 49 of the via insulating film 35 are formed integrally with one another. The body portion 48 and the rear surface portion 49 are continuous with each other to follow opening shapes of the vias 42, not to project into the vias 42. In other words, no overhangs are formed on the boundary between the body portion 48 and the rear surface portion 49 in the first embodiment. An insulating film 45 (a silicon oxide film, for example) may be interposed between the rear surface 14 of the Si substrate 29 and the rear surface portion 49. The insulating film 45 has been employed as a hard mask for forming the vias 42 on the Si substrate 29.

The body portion 48 and the bottom portion 47 of the via insulating film 35 are formed to be smaller in thickness than the rear surface portion 49. Further, a thickness difference is provided between the body portion 48 and the bottom portion 47, to planarize contact surfaces between the same and the through-electrodes 17 so that no steps corresponding to the steps S are formed on the boundary between the body portion 48 and the bottom portion 47. More specifically, the body portion 48 is 1 μm to 2 μm in thickness, the bottom portion 47 is 0.5 μm to 1 μm in thickness, and the rear surface portion 49 is 3 μm to 5 μm in thickness, for example. Therefore, a thickness difference of about 0.5 μm to 1 μm is provided between the body portion 48 and the bottom portion 47.

The through-electrodes 17 are made of copper (Cu), and embedded in the vias 42 inside the via insulating film 35. Thus, the through-electrodes 17 reach the surface pads 33 (the lower pads 39) through the openings 32 of the gate insulating film 30 of the Si substrate 29, and are electrically connected to the surface pads 33. The through-electrodes 17 are provided in the form of columns, identically to the vias 42. Thus, the through-electrodes 17 and the surface pads 32 are aligned with one another in the thickness direction of the Si substrate 29.

A barrier film (not shown) made of tantalum (Ta), for example, may be formed between the through-electrodes 17 and the via insulating film 35. The through-electrodes 17 and the surface pads 33 may not necessarily be aligned with one another, but the surface pads 33 may be arranged on positions separating from the through-electrodes 17 in plan view, by drawing rewires or the like from end portions of the through-electrodes 17 closer to the front surface 13 of the Si substrate 29, for example.

The front surface bumps 36 are arranged one by one on positions immediately above the through-electrodes 17 on the second interlayer dielectric film 38, so that the surface pads 33 are set between the front surface bumps 36 and the through-electrodes 17. The front surface bumps 36 are electrically connected to the upper pads 40 vertically overlapping the same through conductive vias 50 passing through the second interlayer dielectric film 38. The front surface bumps 36 are connected to the rear surface bumps 20 (see FIG. 1) of the Si interposer 5, for example, in a state where the Si interposer 5 is stacked on the arithmetic chip 4.

The rear surface bumps 19 are provided one by one on the end portions of the through-electrodes 17 closer to the rear surface 14, as hereinabove described.

The aforementioned structure of the arithmetic chip 4 having the peripheral walls 44 including the flange portions is employed also for the Si interposer 5, which is a semiconductor substrate (an Si substrate) provided with the through-electrodes 18.

Figure 5A:
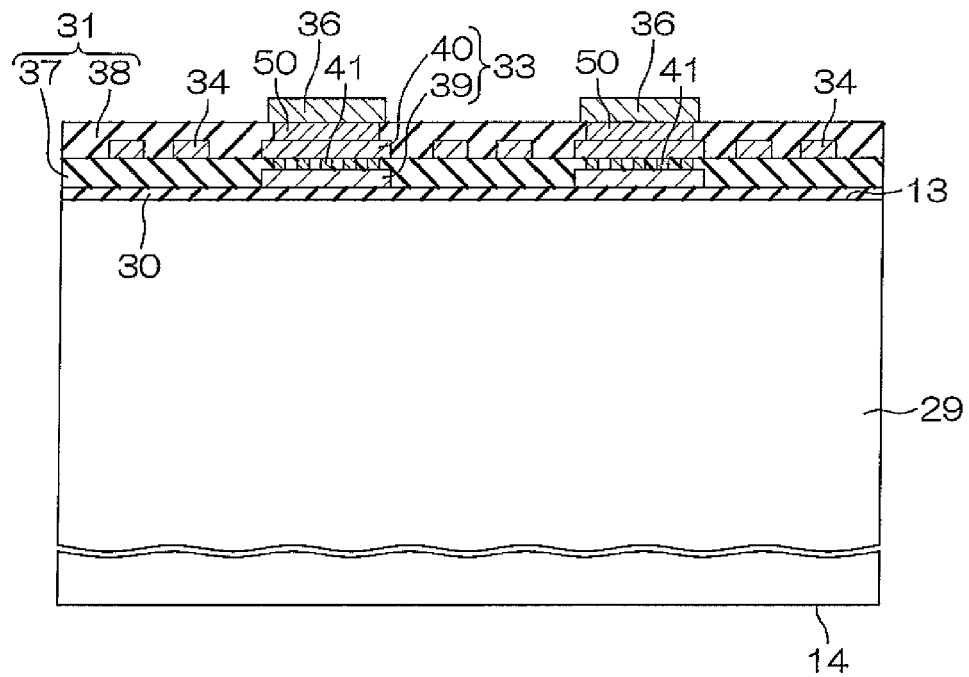
FIGS. 5A to 5N partially illustrate manufacturing steps for the arithmetic chip shown in FIG. 4 in step order.
Figure 5B:
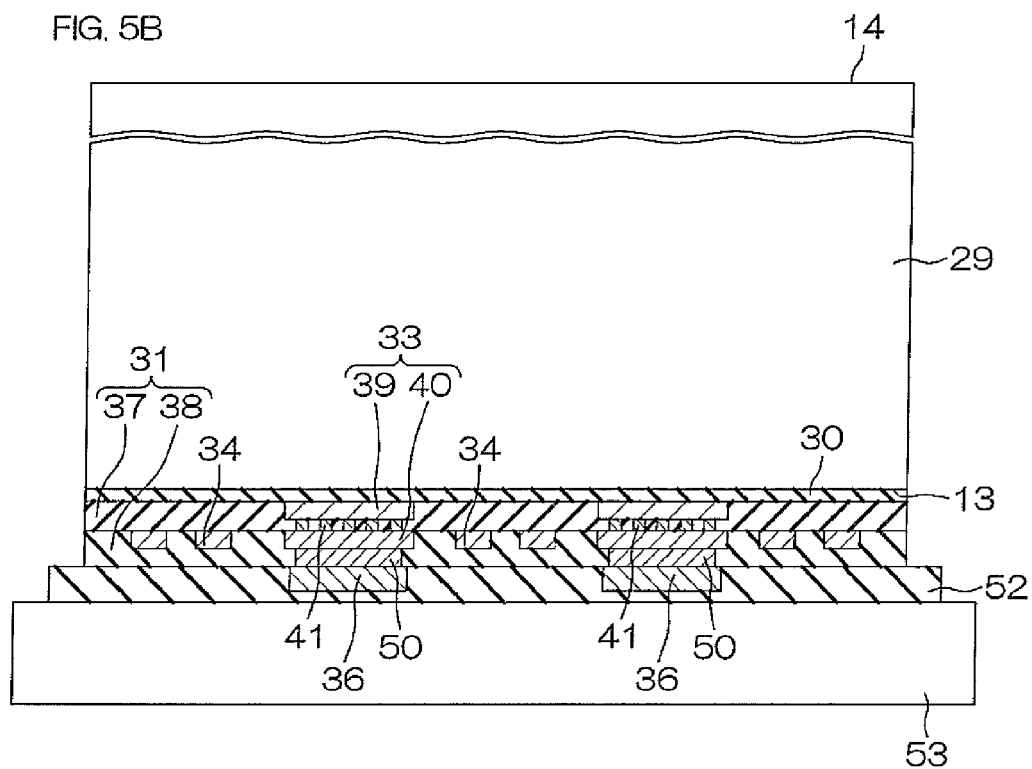
Figure 5C:
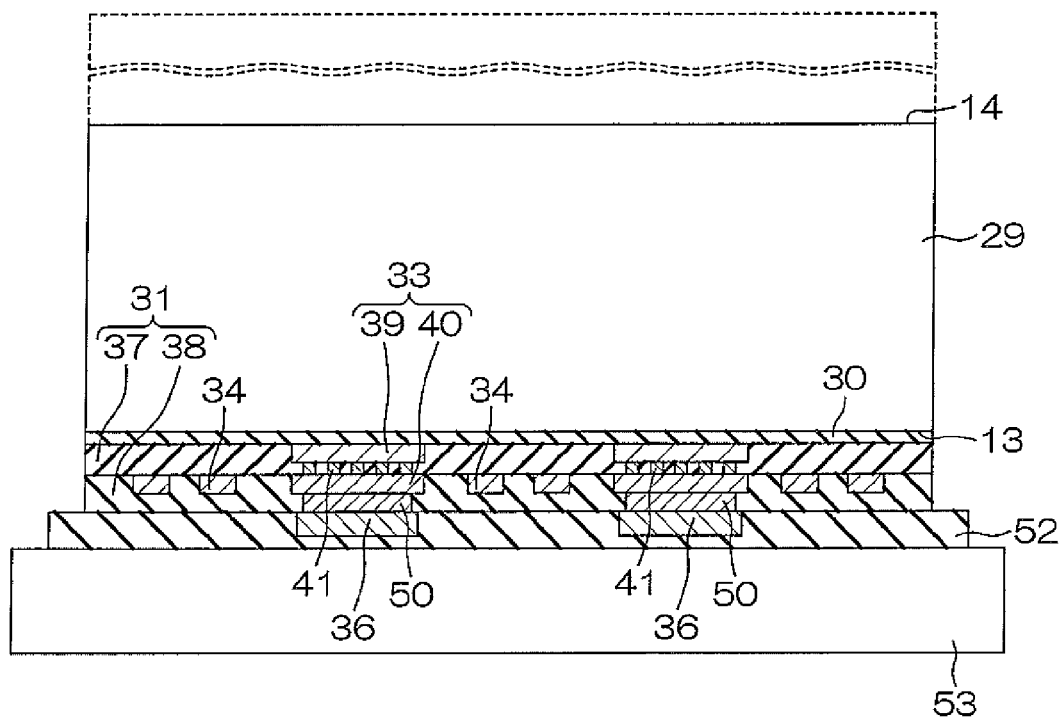
Figure 5D:
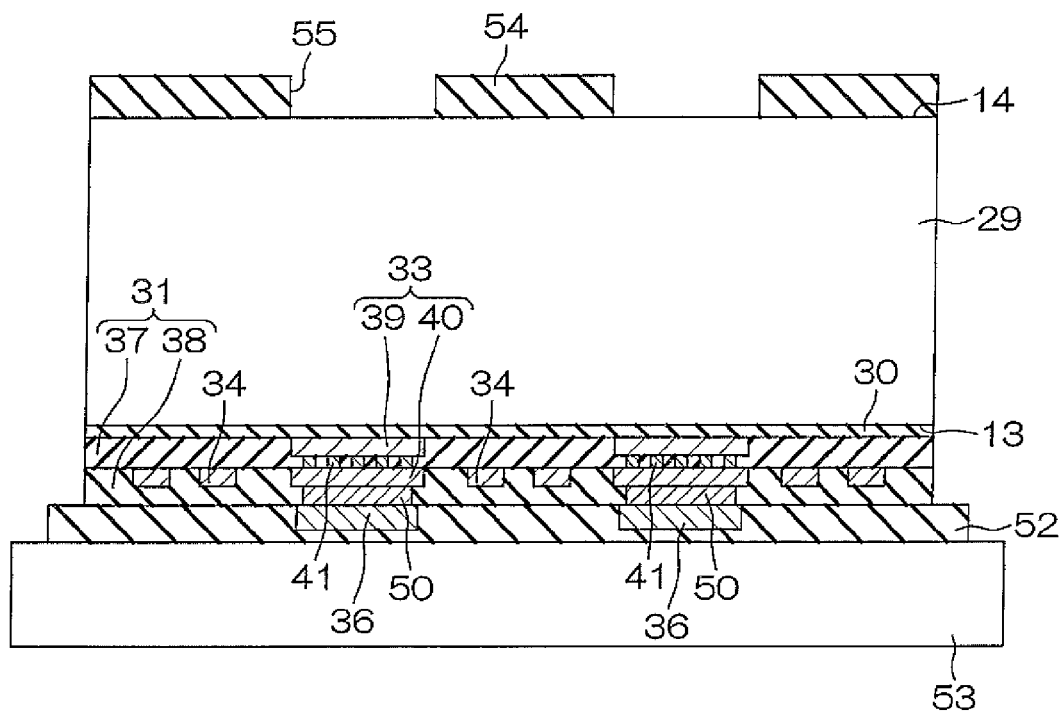
Figure 5E:
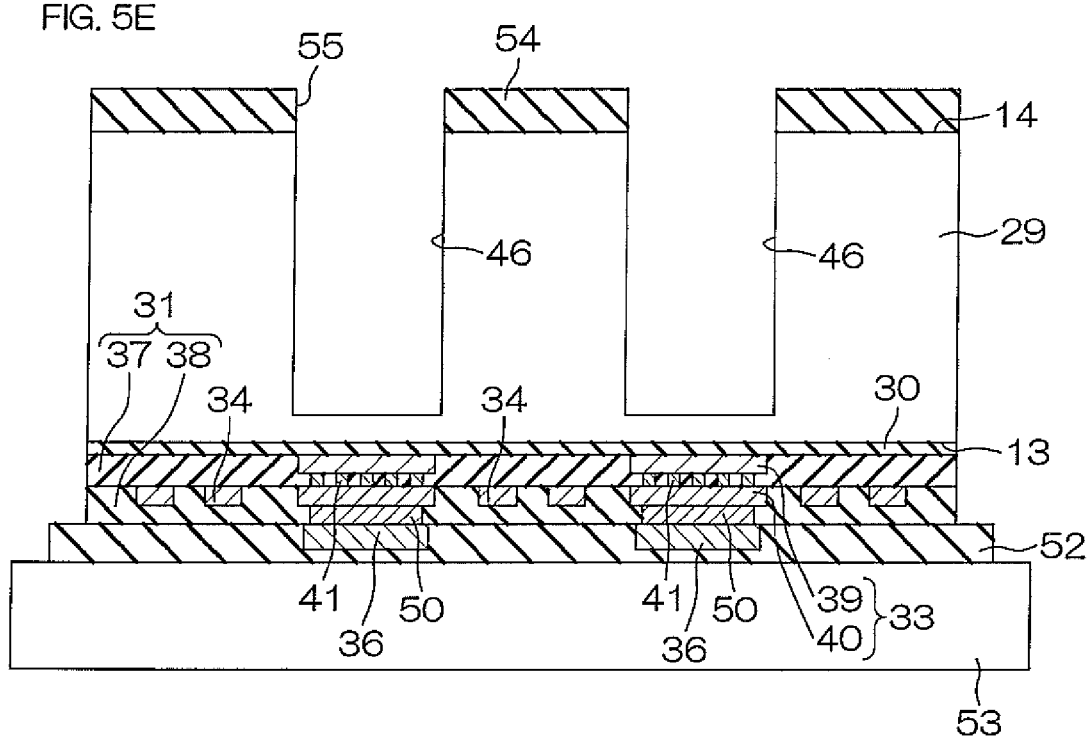
Figure 5F:
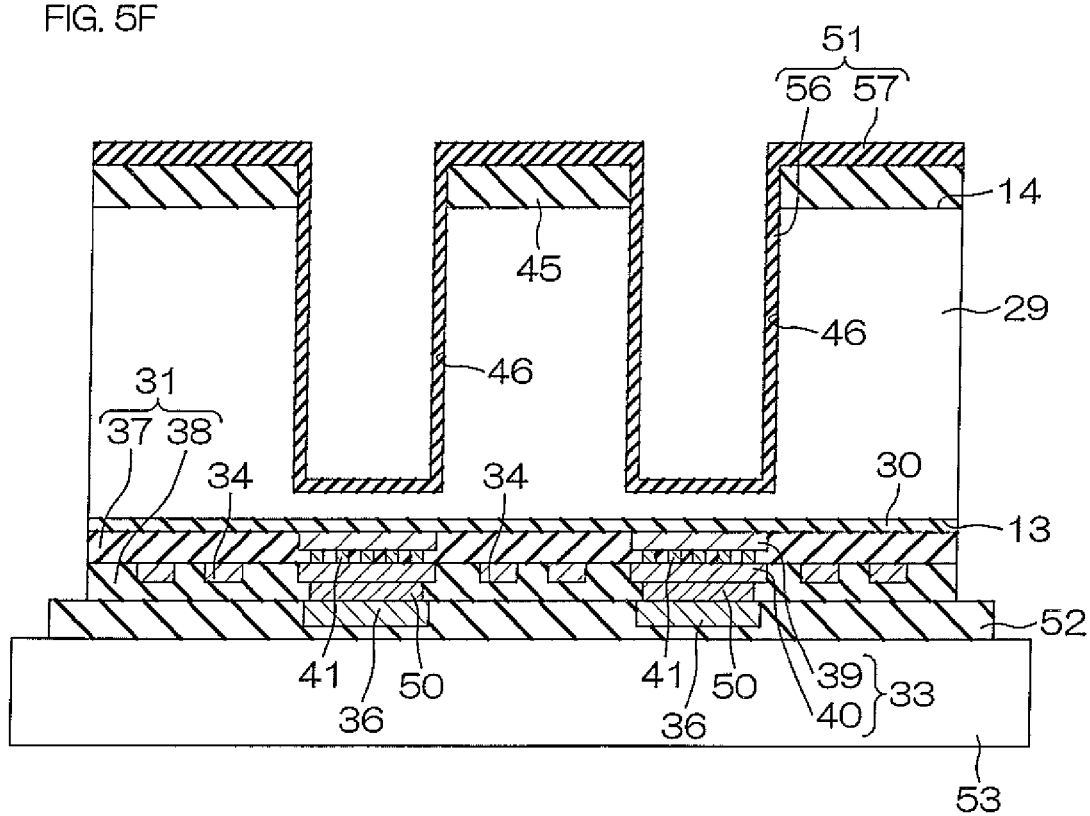
Figure 5G:
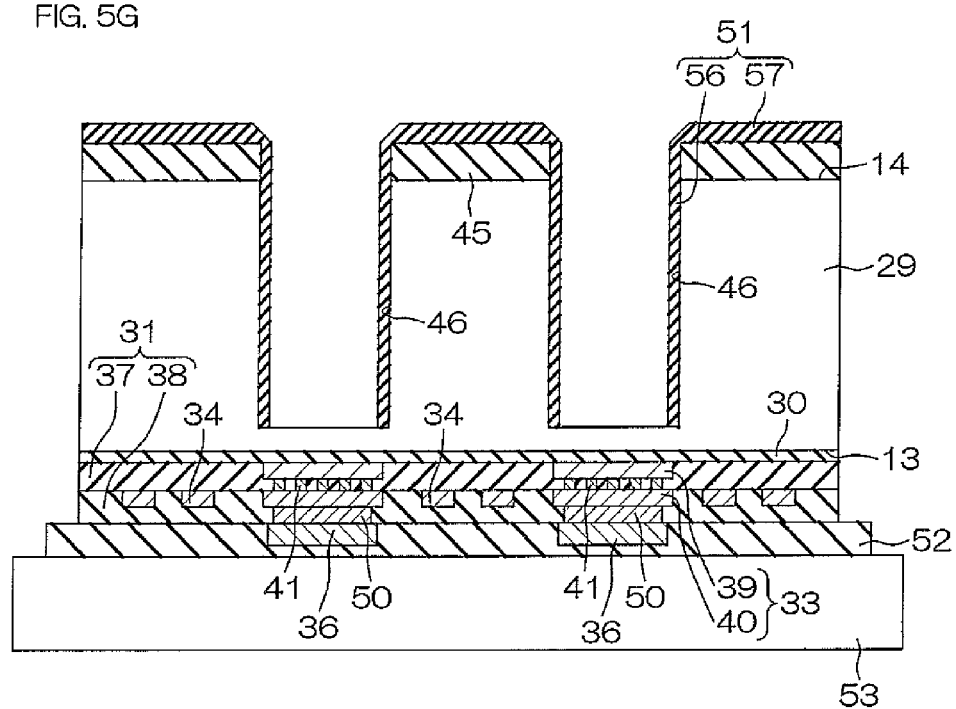
Figure 5H:
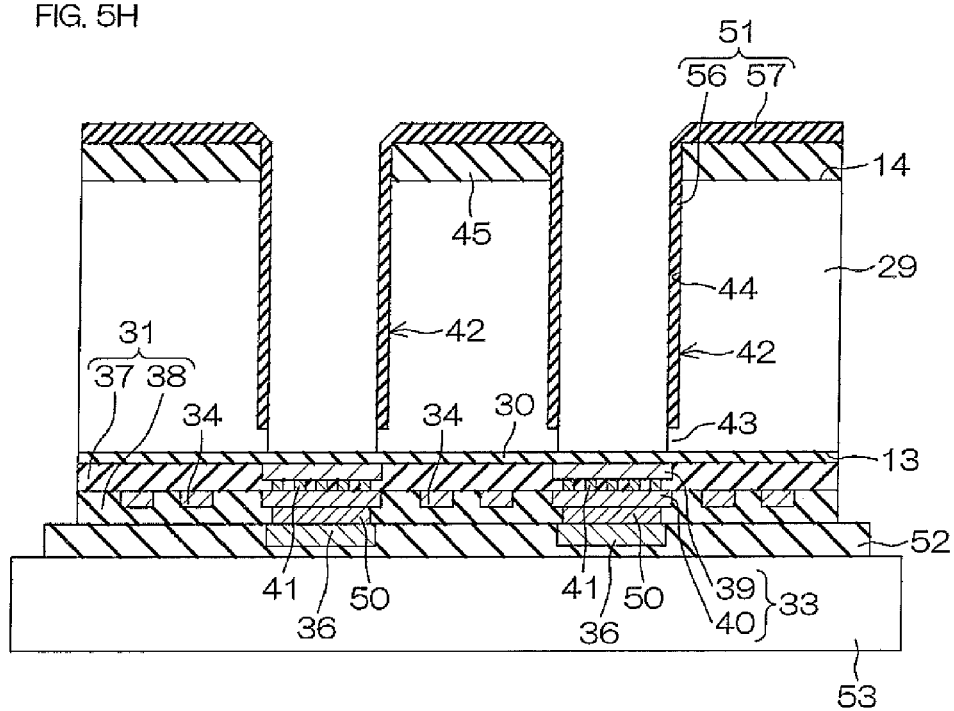
Figure 5I:
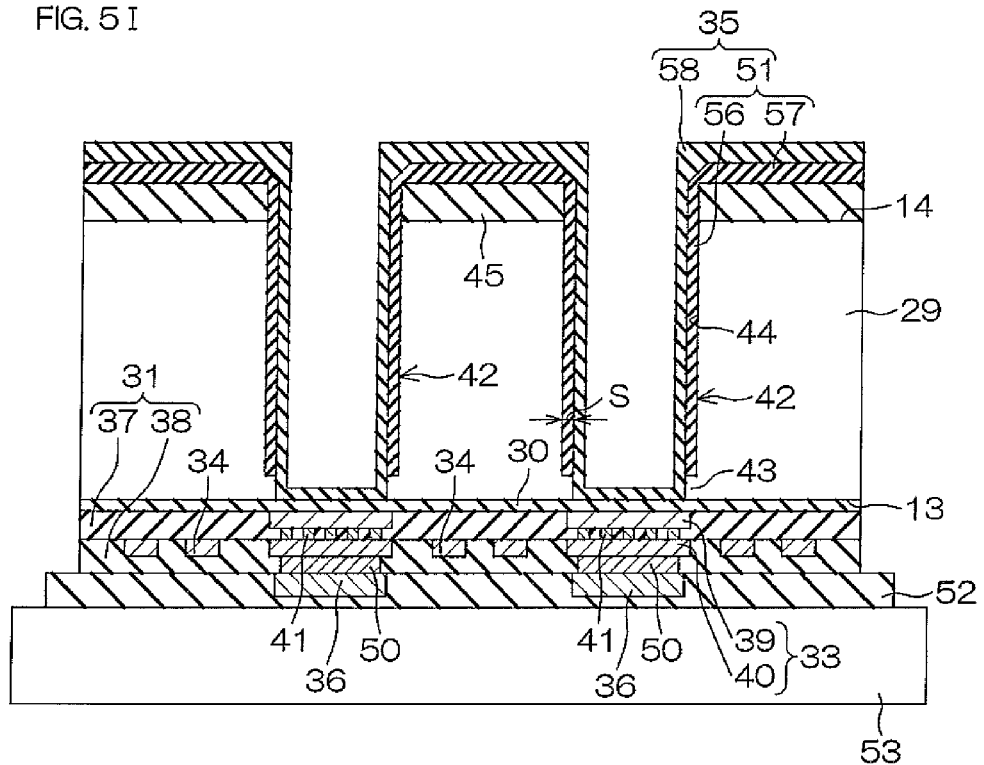
Figure 5J:
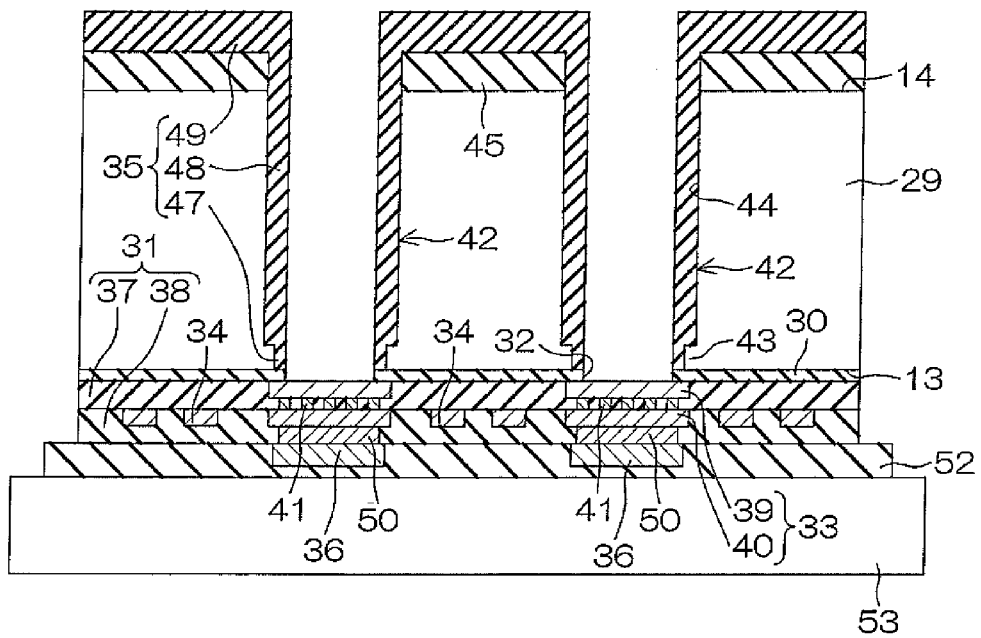
Figure 5K:
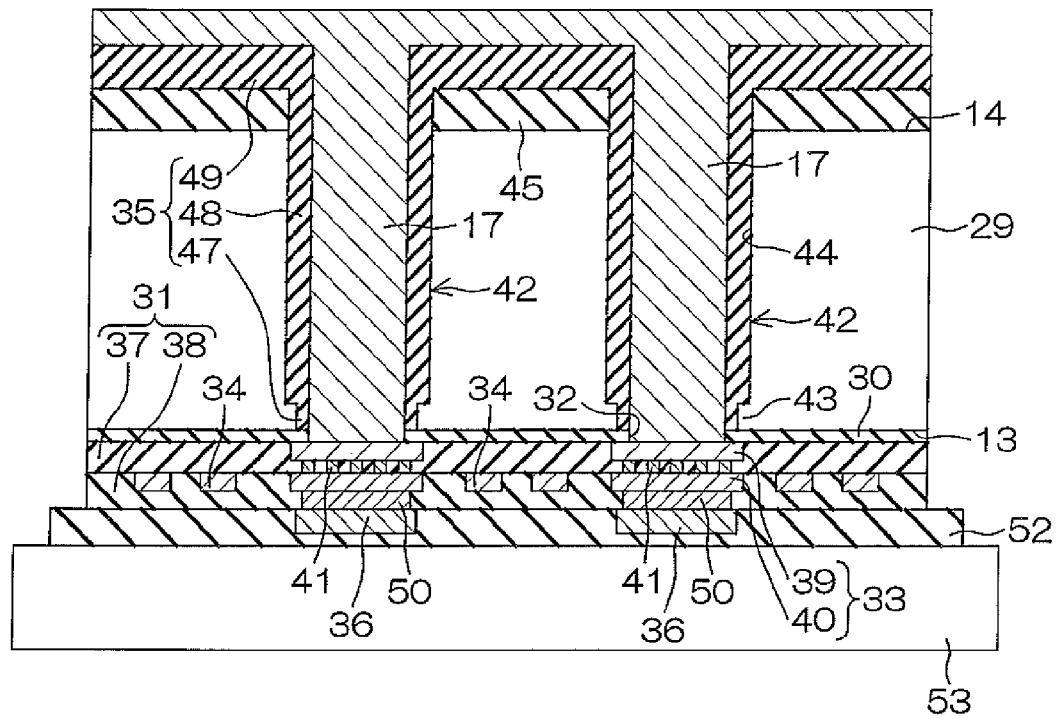
Figure 5L:
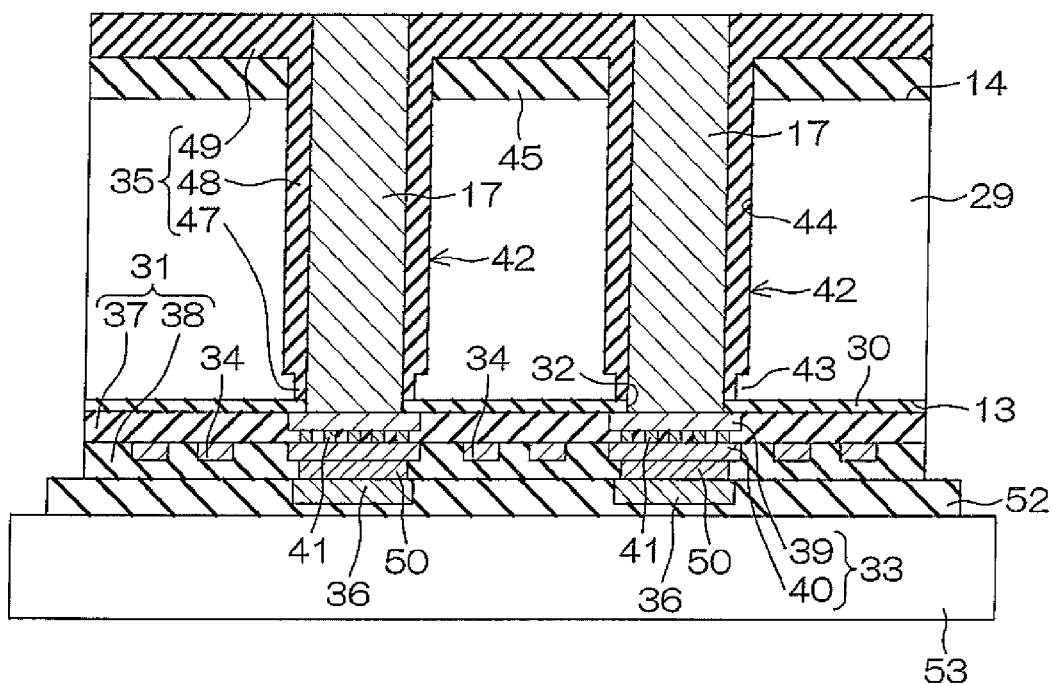
Figure 5M:
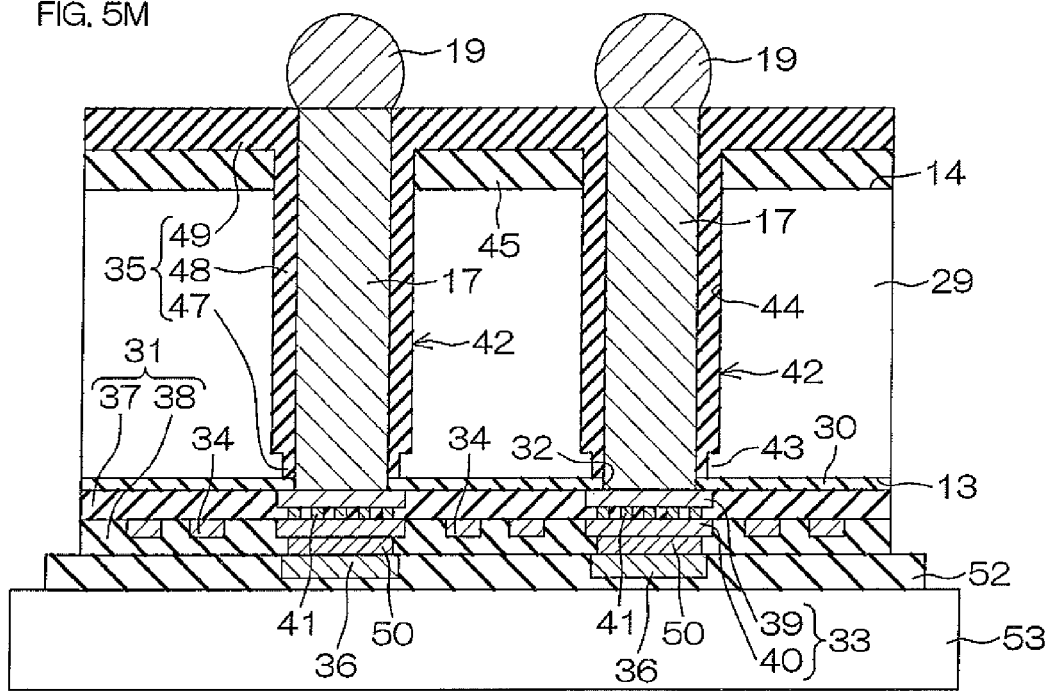
Figure 5N:
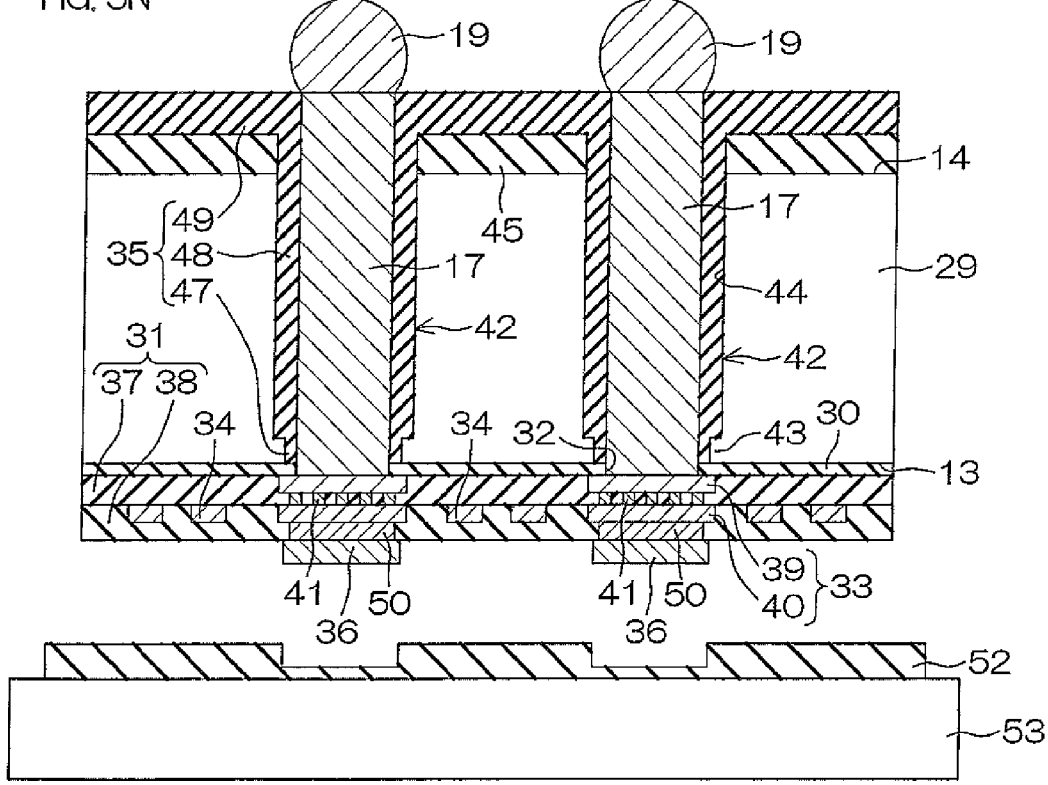

FIGS. 5A to 5N partially illustrate manufacturing steps for the arithmetic chip 4 shown in FIG. 4 in step order.

In order to manufacture the arithmetic chip 4, impurity ions (n-type and p-type ions, for example) are first implanted into the front surface 13 of the Si substrate 29 by a well-known method thereby forming impurity regions constituting the semiconductor elements, although this step is now shown.

Then, the gate insulating film 30 is formed by thermal oxidation, as shown in FIG. 5A. Thereafter the lower pads 39, the first interlayer dielectric film 37, the vias 41, the upper pads and the interpad wires 34, the second interlayer dielectric film 38, the vias 50 and the front surface bumps 36 are successively formed on the gate insulating film 30 by a well-known technique of manufacturing a semiconductor device such as sputtering, photolithography or CVD.

Then, a glass substrate 53 (a support) is bonded to the front surface 13 of the Si substrate 29 through an adhesive 52, as shown in FIG. 5B.

Then, the thickness of the Si substrate 29 is reduced by polishing (back-grinding) the Si substrate 29 from the side of the rear surface 14 with a grinder or the like, for example, as shown in FIG. 5C. According to the first embodiment, the Si substrate 29 of not less than 700 μm in thickness is polished up to a thickness of 30 μm to 50 μm.

Then, a hard mask 54 (a silicon oxide film, for example) selectively having openings 55 on regions for forming the through-electrodes 17 is formed on the rear surface 14 of the Si substrate 29, as shown in FIG. 5D.

Then, the Si substrate 29 is dry-etched from the side of the rear surface 14 by supplying etching gas ($SF_6/O_2$ or the like, for example) to the Si substrate 29 through the hard mask 54, as shown in FIG. 5E. The etching is stopped when reaching the vicinity of the front surface 13, so that the Si substrate 29 is not penetrated. Thus, Si is left in a thickness of about 10 to 15% of the reduced thickness of the Si substrate 29, for example. When the reduced thickness of the Si substrate 29 is 30 μm to 50 μm, Si is left in a thickness of about 5 μm. The etching stop position can be controlled on the basis of the elapsed time from the starting of the etching, for example.

Recesses 46 having bottom portions located in the vicinity of the front surface 13 are formed by the etching. If a plurality of element regions (a first element region 77 and a second element region 78 described later, for example) exhibiting etching rates different from each other are present in the plane of a semiconductor wafer of the Si substrate 29, the etching may be stopped when the recesses 46 having the bottom portions located in the vicinity of the front surface 13 are formed on an element region exhibiting the highest etching rate. In other words, no element regions are penetrated by the etching in the plane of the semiconductor wafer in the step shown in FIG. 5E.

Then, a first insulating film 51 is formed on inner surfaces (bottom walls and peripheral walls) of the recesses 46 and the rear surface 14 of the Si substrate 29 by PECVD while leaving the hard mask 54 employed for forming the recesses 46 as the insulating film 45, as shown in FIG. 5F. The first insulating film 51 is made of silicon oxide, for example. In the step shown in FIG. 5F, the first insulating film 51 is so formed that a body portion 56 covering the peripheral walls of the recesses 46 and a rear surface portion 57 covering the rear surface 14 of the Si substrate 29 are continuous with each other without projecting into the recesses 46 in the vicinity of the rear surface 14 of the Si substrate 29. For example, the first insulating film 51 is preferably so formed that the thickness of the body portion 56 is 0.5 µm to 1 µm. At this time, differences are caused between the thicknesses of the body portion 56 and the rear surface portion 57 as well as those of bottom wall portions and edge portions of the bottom walls of the recesses 46, due to influence by coverage of the PECVD. The thickness differences are generally in order of the rear surface portion 57>the body portion 56>the bottom wall portions>the edge portions. When the body portion 56 is 0.5 µm to 1 µm in thickness, therefore, the thickness of the rear surface portion 57 is 2 µm to 3 µm.

Formation of overhangs is prevented by relatively thinly forming the first insulating film 51 in advance of formation of a second insulating film 58 (described later) forming the outermost layer of the via insulating film 35 as in the step shown in FIG. 5F, whereby the via insulating film 35 can be effectively prevented from formation of overhangs in the final shape.

Then, portions of the first insulating film 51 located on the bottom walls of the recesses 46 are selectively removed by etchback, as shown in FIG. 5G. Thus, the bottom walls of the recesses 46 are exposed.

Then, portions of the Si substrate 29 remaining on the bottom walls of the recesses 46 are etched while leaving the first insulating film 51 on the peripheral walls of the recesses 46, as shown in FIG. 5H. The etching is continued to reach the gate insulating film 30. Thus, the vias 42 passing through the Si substrate 29 are formed, while portions of the front surface portion of the Si substrate 29 remaining under the first insulating film 51 are selectively formed as the flange portions 43 of the peripheral walls 44 of the vias 42 at the same time. In the step shown in FIG. 5H, corner portions of the first insulating film 51 where the body portion 56 and the rear surface portion 57 of the first insulating film 51 intersect with each other are preferably downwardly tapered. When the corner portions of the first insulating film 51 are tapered, the via insulating film 35 can be more effectively prevented from formation of overhangs in the final shape.

Then, the second insulating film 58 is formed on the inner surfaces (the bottom walls and the peripheral walls 44) of the vias 42 and the whole region of the rear surface 14 of the Si substrate 29 by PECVD, as shown in FIG. 5I. Thus, the via insulating film 35 consisting of the first and second insulating films 51 and 58 is formed.

The flange portions 43 are made of Si left immediately under the first insulating film 51 and not removed by the etching for forming the vias 42. Therefore, the thickness of the first insulating film 51 is identical to that of the steps S. When the second insulating film 58 is formed, therefore, no steps are formed on the boundaries between a front surface of the first insulating film 51 and the flange portions 43, but the same form a smooth continuous surface. In other words, the first insulating film 51 can compensate for steps between the flange portions 43 and the remaining portions of the peripheral walls 44. The second insulating film 58 is formed to extend over the front surface of the first insulating film 51 and the flange portions 43 smoothly continuous with one another as described above, to have a planar surface with no steps from opening ends up to bottom portions of the vias 42.

According to the first embodiment, the second insulating film 58 is made of silicon oxide, for example. In other words, both of the first and second insulating films 51 and 58 are silicon oxide films, whereby the via insulating film 35 in the manufactured arithmetic chip 4 is a single-layer film of silicon oxide formed by integration of the first and second insulating films 51 and 58, as shown in FIGS. 4 and 5J to 5N. The first and second insulating films 51 and 58, both made of silicon oxide, may not be completely integrated with each other but may form a multilayer film of virtually overlapping silicon oxide films.

The second insulating film 58 is preferably formed with a thickness exceeding that of the first insulating film 51. The thickness of the second insulating film 58 is so increased that insulating films having sufficient strength and pressure resistance can be formed on edge portions of the vias 42 particularly reduced in thickness in the second insulating film 58. On the other hand, edge portions of the recesses 46 in the first insulating film 51 are reinforced in the formation of the second insulating film 58 even if the same are extremely reduced in thickness, and hence the same cause no particular problem, dissimilarly to the edge portions of the second insulating film 58 still remaining in the final shape.

Then, portions of the via insulating film 35 located on the bottom walls and portions of the gate insulating film 30 located under these portions are selectively removed by etchback, as shown in FIG. 5J. Thus, the surface pads 33 (the lower pads 39) are exposed from the openings 32 of the gate insulating film 30.

Then, a seed film (a multilayer film of Ti and Cu, for example) is sputtered onto the front surface of the via insulating film 35, and Cu is thereafter grown from the seed film by electroplating, as shown in FIG. 5K. Thus, Cu (an electrode material) is charged into the vias 42 inside the via insulating film 35, to form the through-electrodes 17 electrically connected to the surface pads 33.

Then, excess portions (portions outside the vias 42) of the through-electrodes 17 are removed by CMP (Chemical Mechanical Polishing) until the polished surfaces are flush with the rear surface portion 49 of the via insulating film 35, as shown in FIG. 5L.

Thereafter the rear surface bumps 19 are formed one by one on the through-electrodes 17 as shown in FIG. 5M, and the Si substrate 29 is detached from the glass substrate 53 as shown in FIG. 5N, thereby obtaining the arithmetic chip 4 shown in FIG. 4.

According to the first embodiment, as hereinabove described, the inner diameter of the vias 42 is reduced by the thickness of the first insulating film 51 on the positions of the flange portions 43, whereby contact areas between the through-electrodes 17 and the surface pads 33 can be reduced. Even if the positions where the vias 42 are formed slightly deviate from the surface pads 33, therefore, the through-electrodes 17 can be reliably brought into contact with the surface pads 33, due to the aforementioned small contact areas.

Dissimilarly to a conventional case of regularly designing the surface pads 33 to be greater in diameter than the vias 42 in consideration of the alignment accuracy for patterning the vias 42, therefore, the through-electrodes 17 can be reliably brought into contact with the surface pads 33 in the arithmetic chip 4 even if the surface pads 33 are reduced in size, whereby the flexibility for the size of the surface pads 33 can be spread.

Thus, the surface pads 33 of the arithmetic chip 4 can be more reduced in size as compared with the prior art when the through-electrodes 17 are refined. Consequently, the through-electrodes 17 can be provided in high density, whereby a miniature, high-capacity and highly functional semiconductor chip can be implemented.

Further, spaces between the surface pads 33 adjacent to one another can be widened due to the size reduction of the surface pads 33, whereby the spaces can be effectively utilized for setting the interpad wires 34.

According to a conventional method, a relatively thick insulating film may have been formed on the inner surfaces of the vias 42, in order to reduce the volume of the through-electrodes 17. If the thickness of the insulating film for the vias 42 is increased at a time, however, there is a high possibility that overhangs are formed on opening ends of the vias 42 closer to the rear surface 14 due to influence by the coverage of the insulating film. When the overhangs are formed, sputter seed films are hard to form on the inner surfaces of the vias 42. Therefore, voids are easily formed when the through-electrodes 17 are formed in the vias 42 by plating.

According to the first embodiment, therefore, the via insulating film 35 is formed through the two steps of forming the first insulating film 51 and forming the second insulating film 58, whereby the via insulating film 35 can be prevented from formation of overhangs on the opening ends of the vias 42, or the size of such overhangs can be suppressed. Consequently, formation of voids can be prevented when the through-electrodes 17 are formed. When the first and second insulating films 51 and 58 are set to proper thicknesses, further, the via insulating film 35 exhibits a sufficient thickness as a whole, whereby the volume of the through-electrodes 17 can be sufficiently reduced.

The electronic component 1 shown in FIG. 1 is loaded with the aforementioned arithmetic chip 4 and the Si interposer 5, whereby miniaturization, capacity enlargement and high functionalization can be implemented by providing the through-electrodes 17 on the arithmetic chip 4 and the Si interposer 5 in high density.

Second Embodiment

Figure 6:
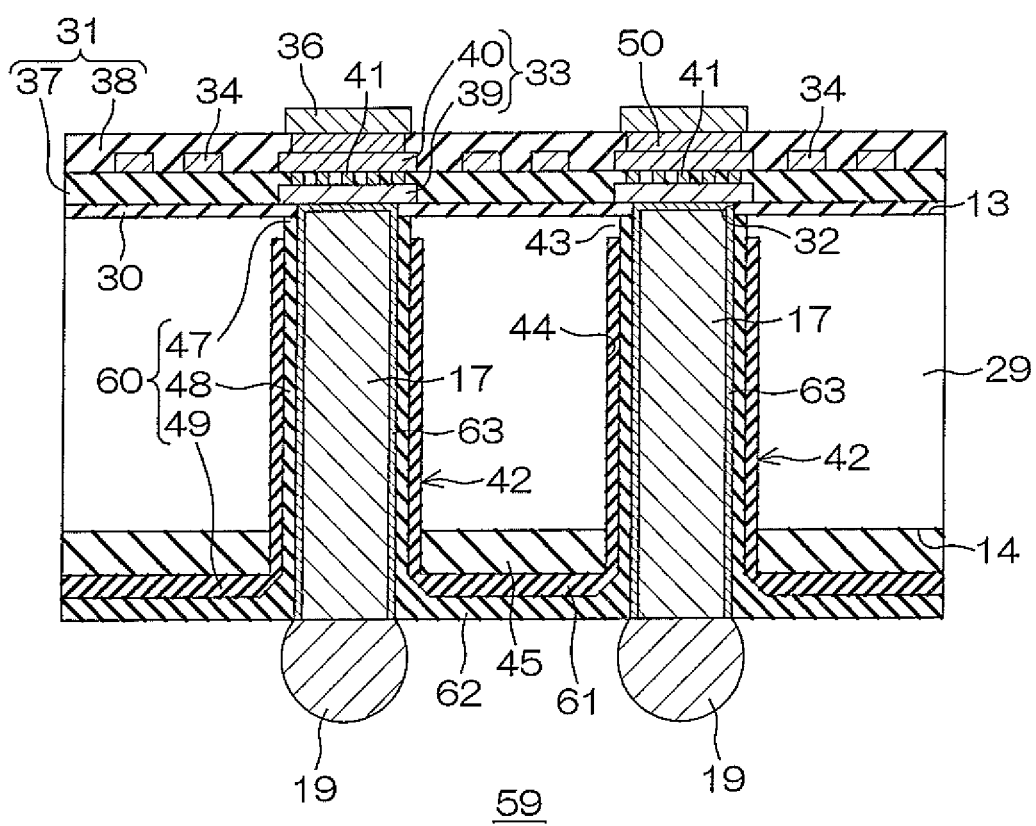
FIG. 6 is a schematic sectional view for illustrating the structure of the arithmetic chip (a second embodiment) shown in FIG. 1.

FIG. 6 is a schematic sectional view for illustrating the structure of the arithmetic chip (a second embodiment) shown in FIG. 1. Referring to FIG. 6, portions corresponding to those shown in FIG. 4 are denoted by the same reference signs.

While the via insulating film 35 is formed by the single-layer film of silicon oxide in the aforementioned first embodiment, a via insulating film 60 of an arithmetic chip 59 according to the second embodiment is a multilayer film including a silicon oxide film 61 and a silicon nitride film 62 successively stacked from a side closer to peripheral walls 44. The silicon oxide film 61 is formed on portions of the peripheral walls 44 excluding flange portions 43, and has the same thickness as steps S. On the other hand, the silicon nitride film 62 is formed to extend over the silicon oxide film 61 and the flange portions 43.

A barrier film 63 is arranged between the via insulating film 60 and through-electrodes 17. The barrier film 63 is a tantalum film, for example.

The remaining structure of the arithmetic chip 59 according to the second embodiment is similar to that of the arithmetic chip 4 according to the aforementioned first embodiment.

Figure 7A:
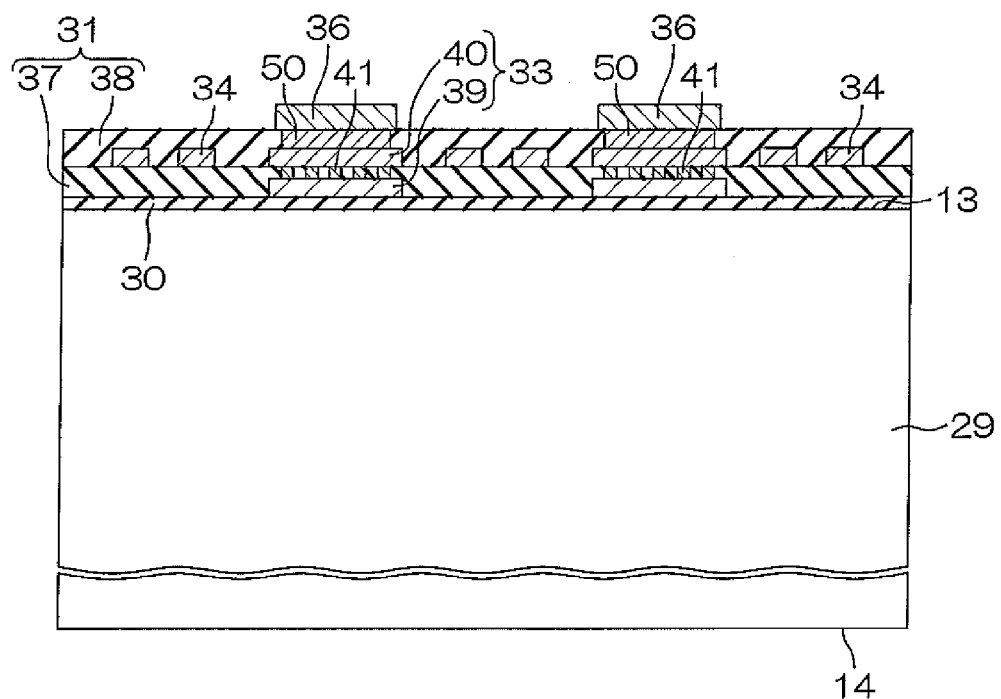
FIGS. 7A to 7N partially illustrate manufacturing steps for the arithmetic chip shown in FIG. 6 in step order.
Figure 7B:
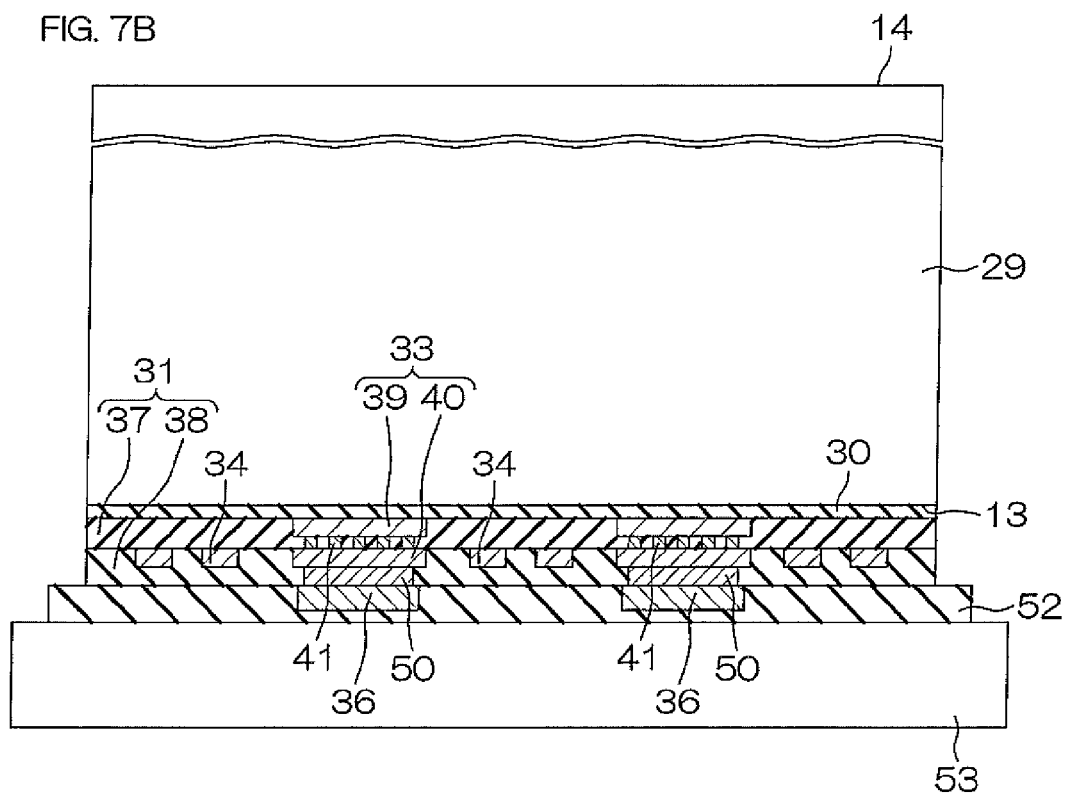
Figure 7C:
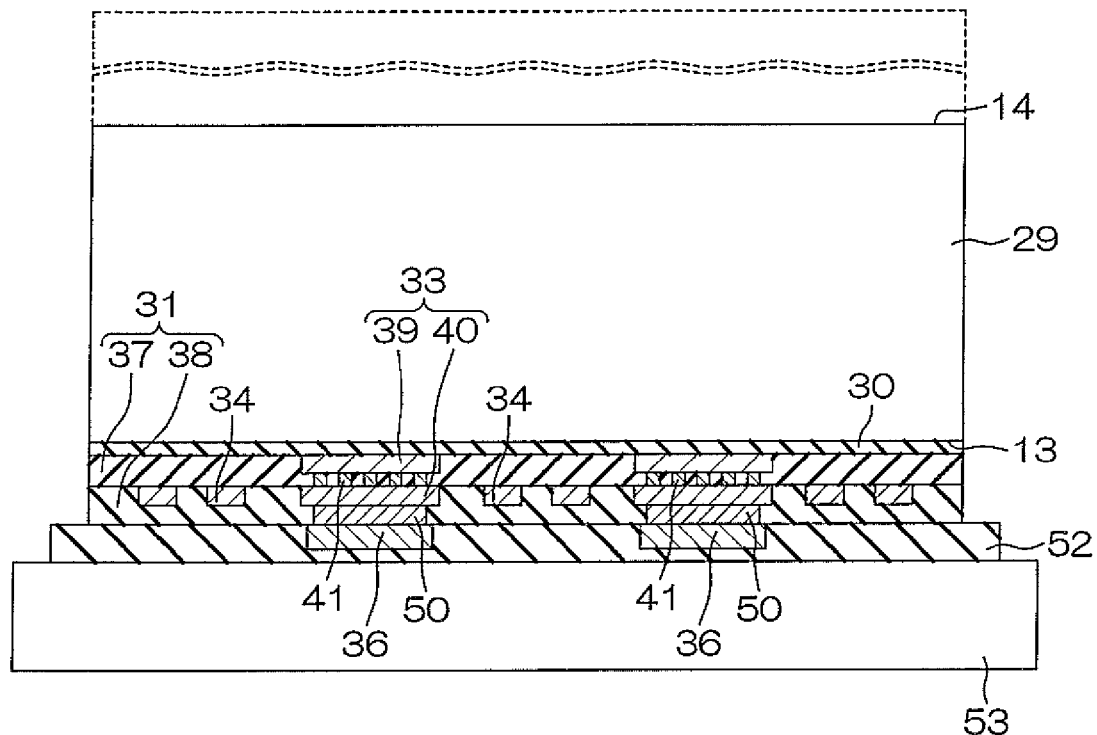
Figure 7D:
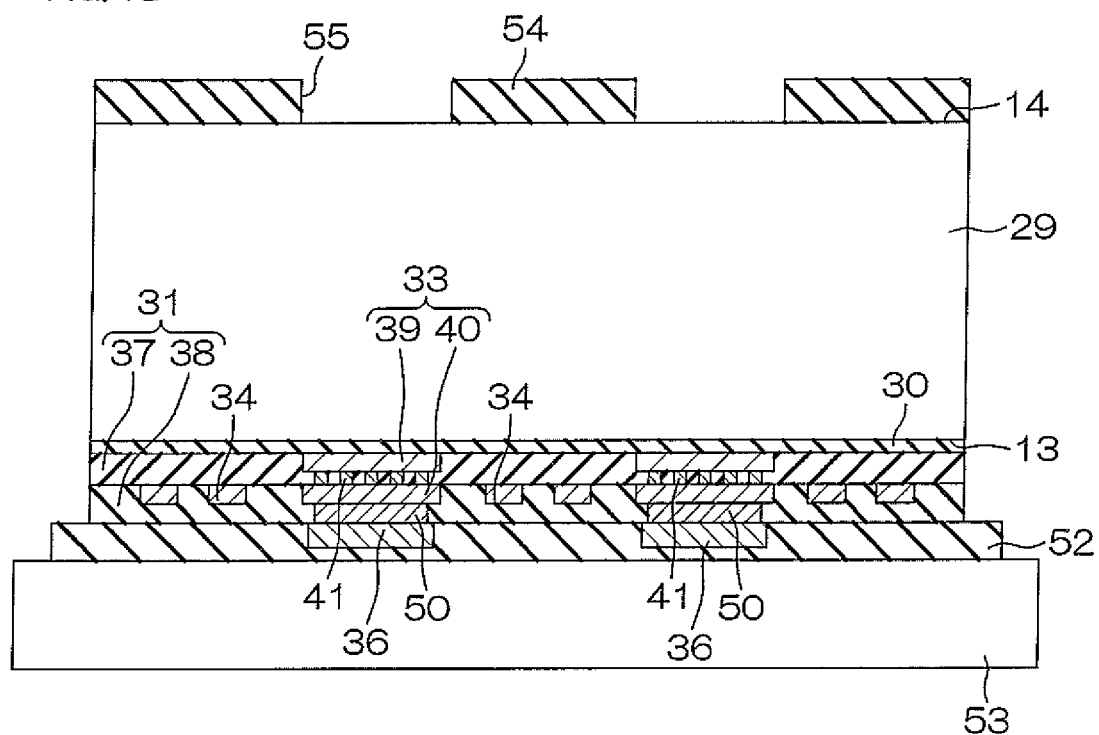
Figure 7E:
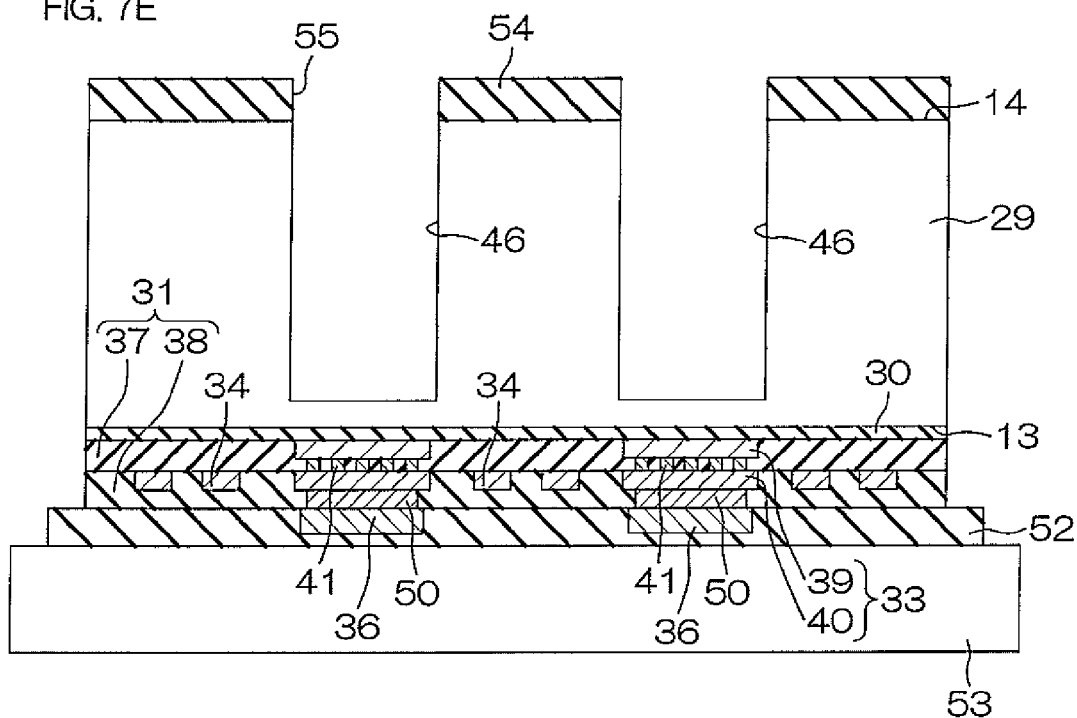
Figure 7F:
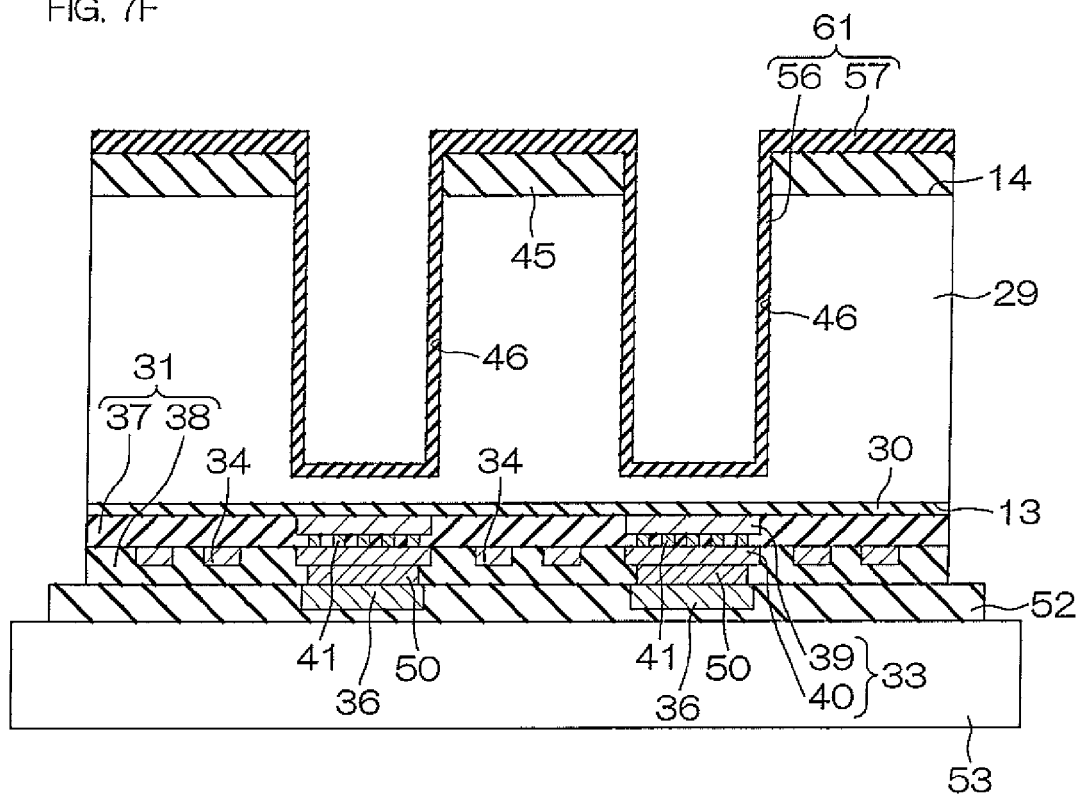
Figure 7G:
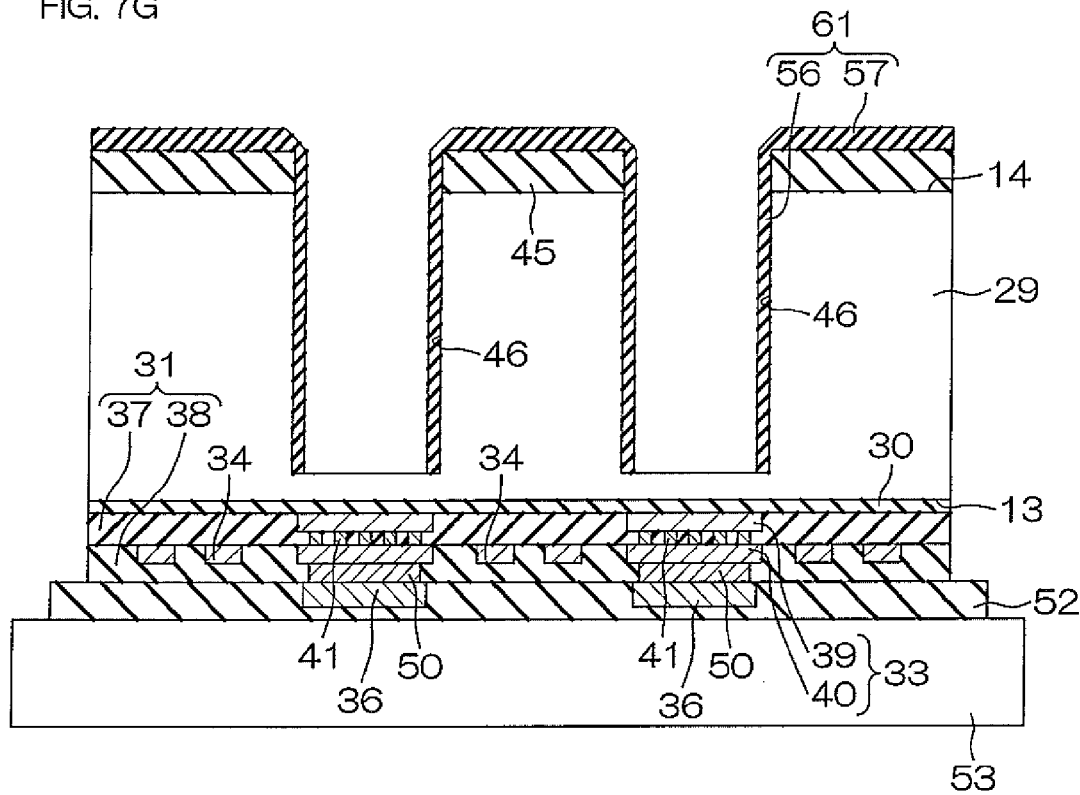
Figure 7H:
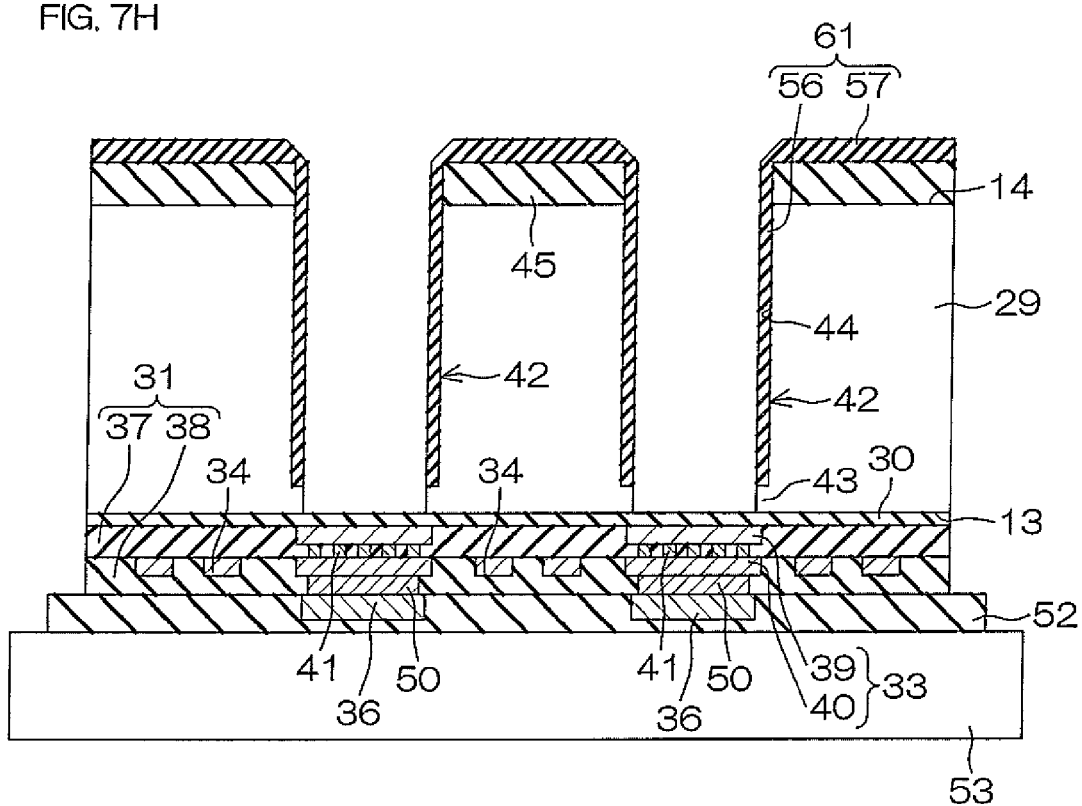
Figure 7:
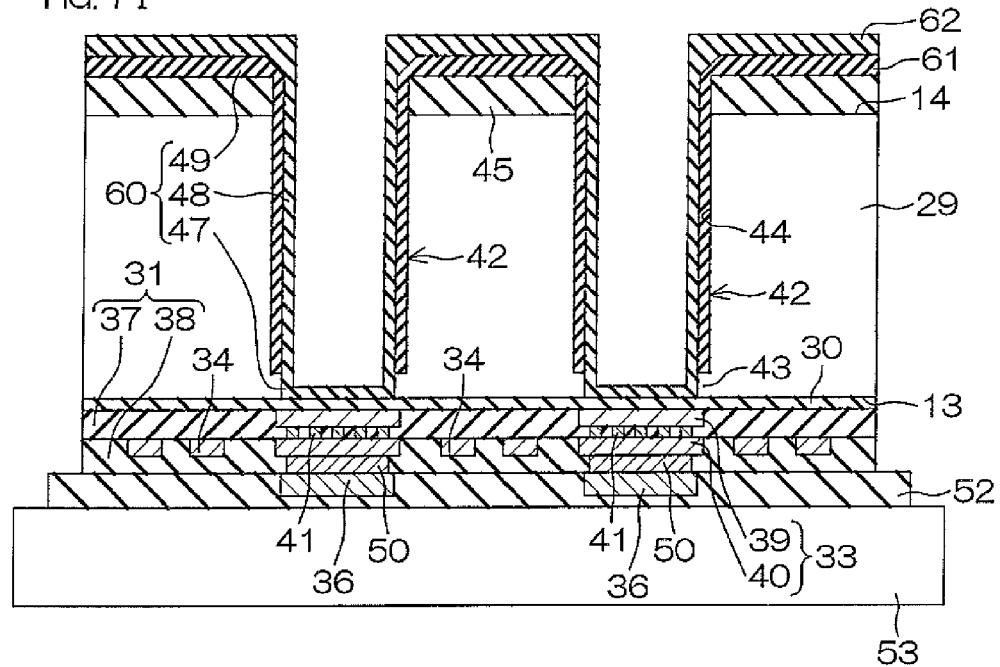
Figure 7J:
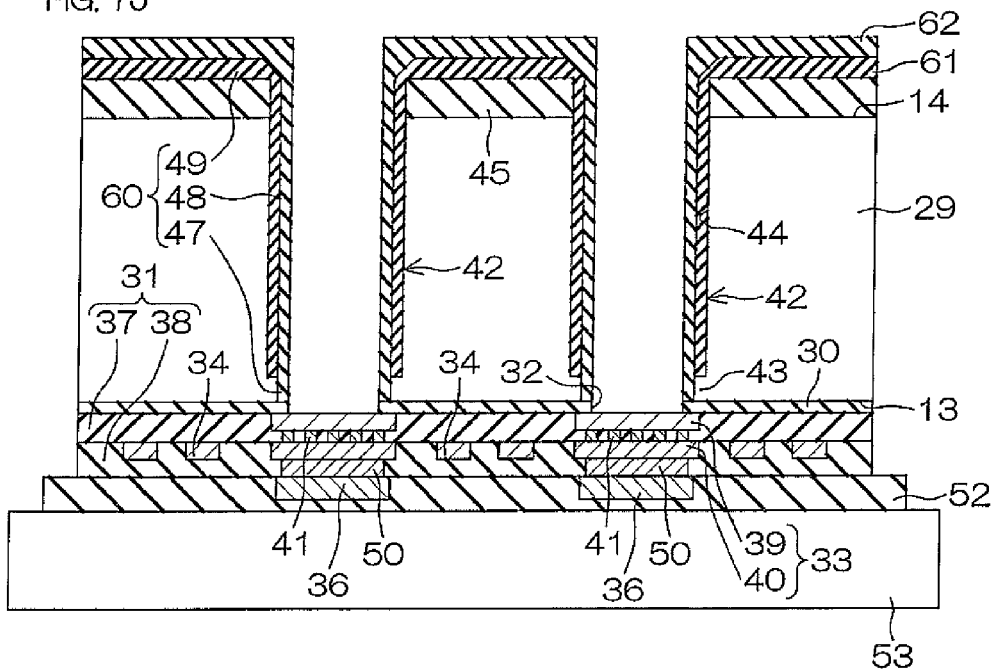
Figure 7K:
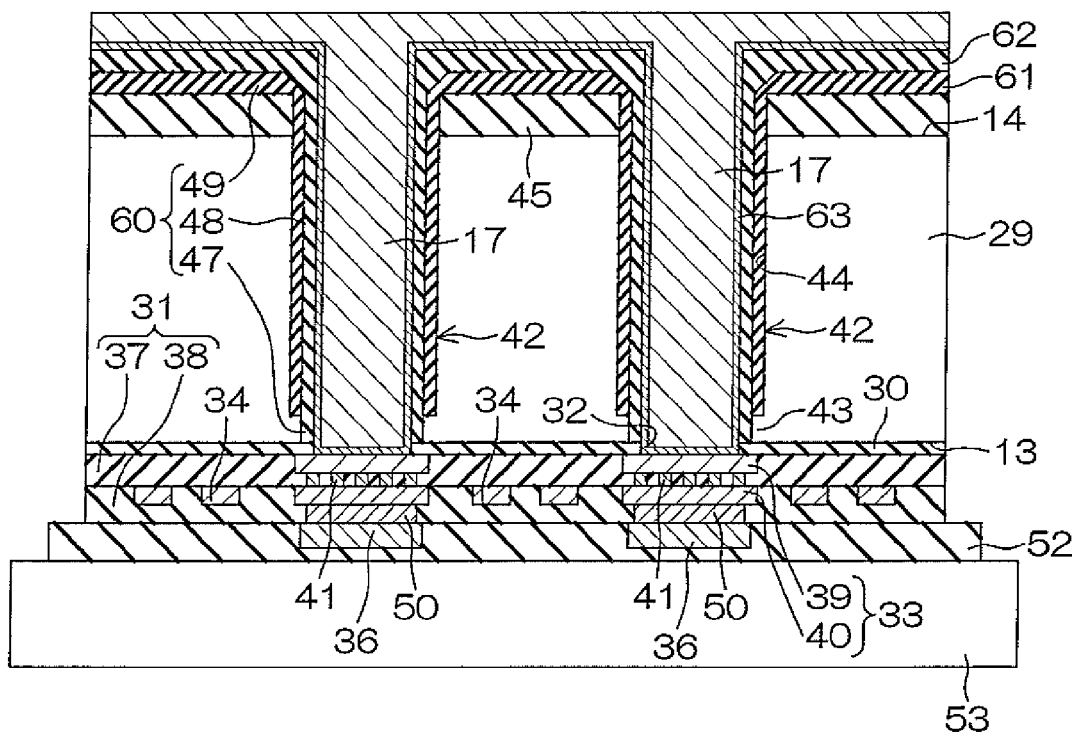
Figure 7L:
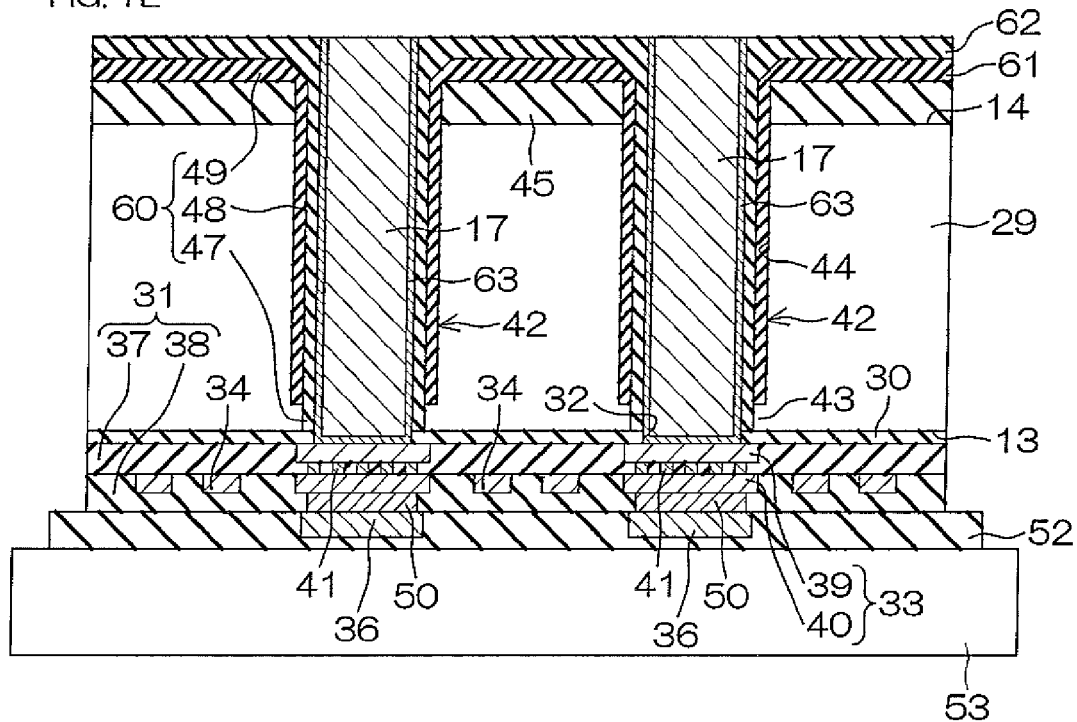
Figure 7M:
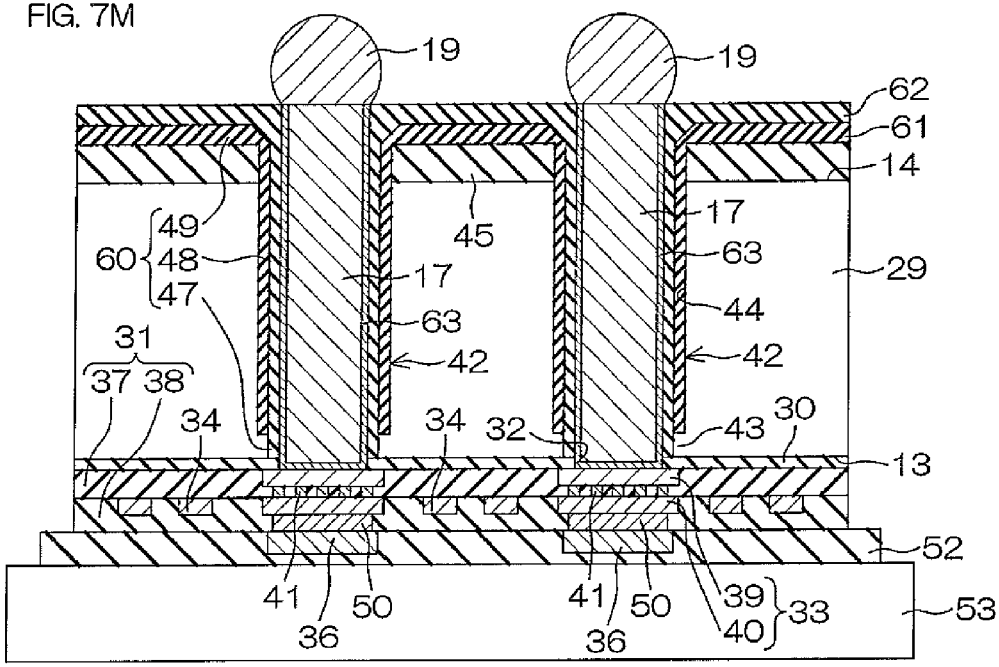
Figure 7N:
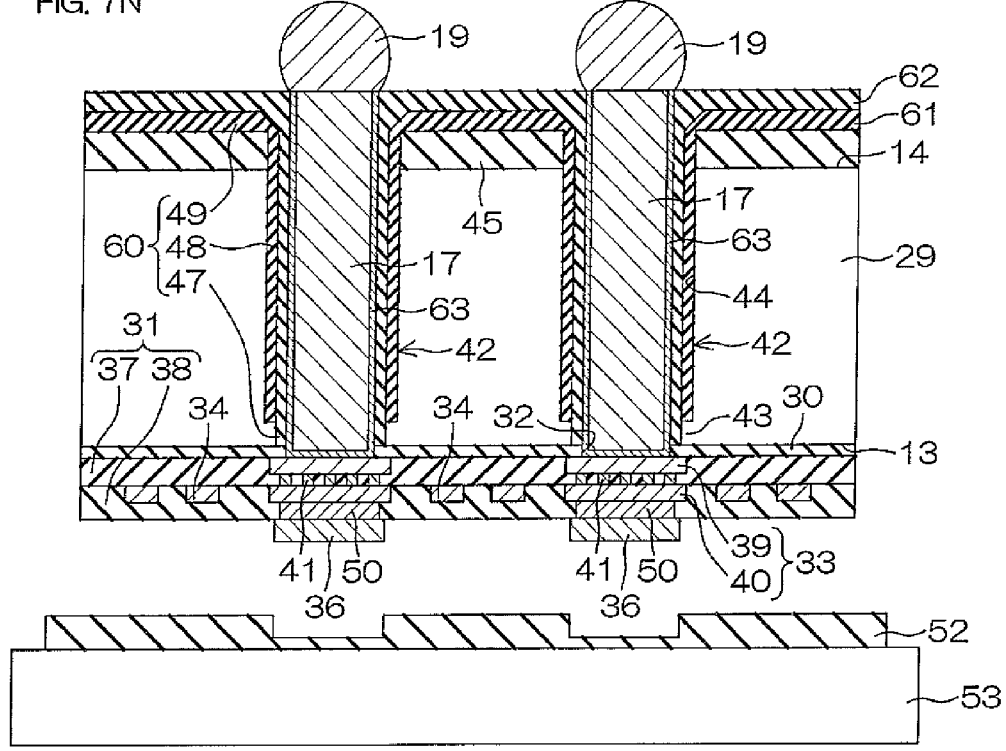

FIGS. 7A to 7N partially illustrate manufacturing steps for the arithmetic chip 59 shown in FIG. 6 in step order.

As shown in FIGS. 7A to 7H, steps up to that of etching portions of an Si substrate 29 remaining on bottom walls of recesses 46 are carried out similarly to those shown in FIGS. 5A to 5H. A first insulating film formed in the step (similar to the step shown in FIG. 5F) shown in FIG. 7F is the silicon oxide film 61.

Then, the silicon nitride film 62 is formed on inner surfaces (bottom walls and the peripheral walls 44) of vias 42 and the whole region of a rear surface 14 of the Si substrate 29 by PECVD, as shown in FIG. 7I. Thus, the via insulating film 60 consisting of the silicon oxide film 61 and the silicon nitride film 62 is formed. The thickness etc. of the silicon oxide film 62 are similar to those of the aforementioned second insulating film 58.

Then, a portion of the silicon nitride film 62 located on a bottom wall and a portion of a gate insulating film 30 located under this portion are selectively removed by etchback, as shown in FIG. 7J. Thus, surface pads (lower pads 39) are exposed from openings 32 of the gate insulating film 30.

Then, the barrier film 63 is formed on a front surface of the via insulating film 60 and a seed film (a multilayer film of Ti and Cu, for example) is thereafter sputtered, as shown in FIG. 7K. Thereafter Cu is grown from the seed film by electroplating. Thus, Cu (an electrode material) is charged into the vias 42 inside the barrier film 63, to form the through-electrodes 17 electrically connected to surface pads 33.

Then, excess portions (portions outside the vias 42) of the through-electrodes 17 and the barrier film 63 are removed by CMP (Chemical Mechanical Polishing) until the polished surfaces are flush with a rear surface portion 49 of the via insulating film 60, as shown in FIG. 7L.

Thereafter rear surface bumps 19 are formed one by one on the through-electrodes 17 as shown in FIG. 7M, and the Si substrate 29 is detached from a glass substrate 53 as shown in FIG. 7N, thereby obtaining the arithmetic chip 59 shown in FIG. 6.

Also according to the second embodiment, functions/effects similar to those of the aforementioned first embodiment can be attained.

According to the arithmetic chip 59, the silicon nitride film 62 forming the outermost layer of the via insulating film 60 can reliably inhibit diffusion of Cu from the through-electrodes 17, when such diffusion of Cu cannot be inhibited with the barrier film 63 alone. Consequently, the silicon oxide film 61 forming the via insulating film 60 and an element such as a transistor formed on the Si substrate 29 can be inhibited from deterioration.

Third Embodiment

Figure 8:
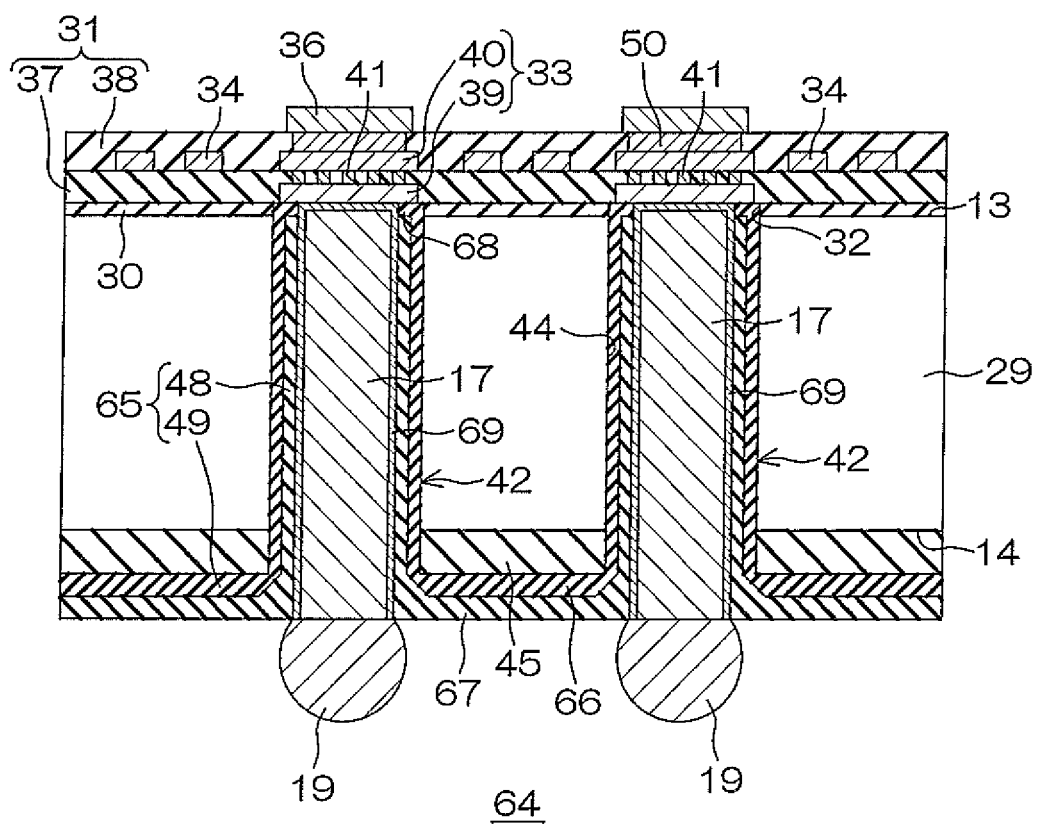
FIG. 8 is a schematic sectional view for illustrating the structure of the arithmetic chip (a third embodiment) shown in FIG. 1.

FIG. 8 is a schematic sectional view for illustrating the structure of the arithmetic chip (a third embodiment) shown in FIG. 1. Referring to FIG. 8, portions corresponding to those shown in FIG. 4 are denoted by the same reference signs.

While the flange portions 43 are formed on the peripheral walls 44 and the steps S are provided on the peripheral walls 44 in the aforementioned first embodiment, peripheral walls 44 are smooth planar surfaces provided with no flange portions 43 in an arithmetic chip 64 according to the third embodiment.

According to the aforementioned first embodiment, the via insulating film 35 is formed to be in contact with edge portions of the gate insulating film 30 partitioning the openings 32 from the side of the rear surface 14 on the outer sides of the openings 32 of the gate insulating film 30. According to the third embodiment, a via insulating film 65 enters openings 32, to cover edge portions of a gate insulating film 30 partitioning the openings 32 from inside the openings 32. The via insulating film 65 is a multilayer film including a silicon oxide film 66 and a silicon nitride film 67 successively stacked from a side closer to the peripheral walls 44. The silicon oxide film 66 has overlap portions 68 extending in the openings 32 of the gate insulating film 30 toward the side of the silicon nitride film 67 to cover end portions of the silicon nitride film 67.

A barrier film 69 is arranged between the via insulating film 65 and through-electrodes 17. The barrier film 69 is a tantalum film, for example.

The remaining structure of the arithmetic chip 64 according to the third embodiment is similar to that of the arithmetic chip 4 according to the aforementioned first embodiment.

FIGS. 9A to 9L partially illustrate manufacturing steps for the arithmetic chip 64 shown in FIG. 8 in step order.

In order to manufacture the arithmetic chip 64, impurity ions (n-type and p-type ions, for example) are first implanted into a front surface 13 of an Si substrate 29 by a well-known method thereby forming impurity regions constituting semiconductor elements, although this step is now shown.

Figure 9A:
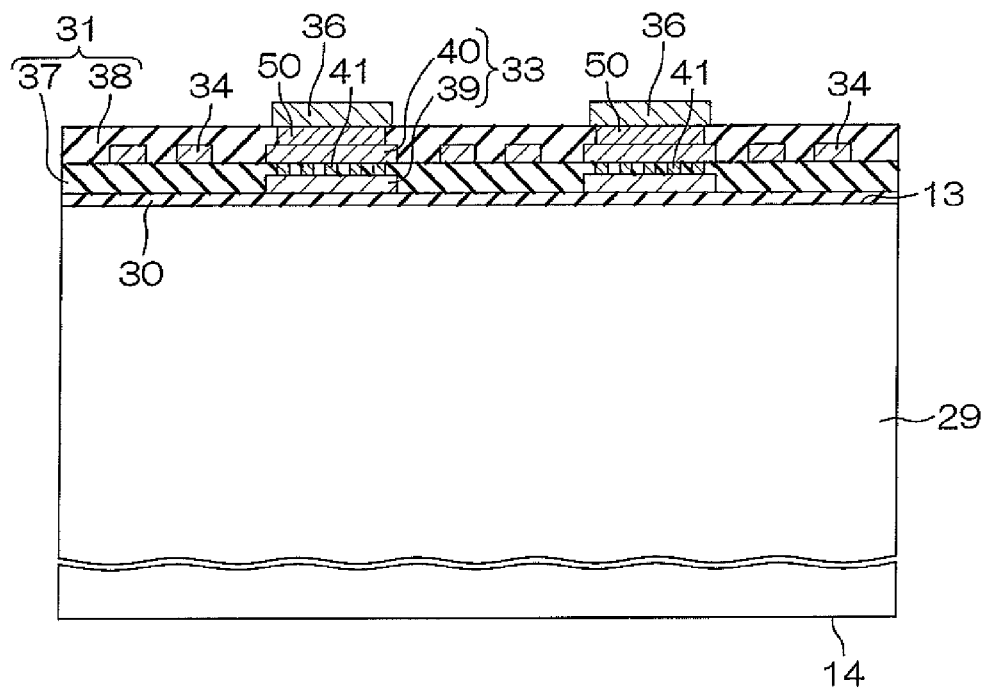
FIGS. 9A to 9L partially illustrate manufacturing steps for the arithmetic chip shown in FIG. 8 in step order.

Then, the gate insulating film 30 is formed by thermal oxidation, as shown in FIG. 9A. Thereafter lower pads 39, a first interlayer dielectric film 37, vias 41, upper pads 40 and interpad wire 34, a second interlayer dielectric film 38, vias 50 and front surface bumps 36 are successively formed on the gate insulating film 30 by a well-known technique of manufacturing a semiconductor device such as sputtering, photolithography or CVD.

Figure 9B:
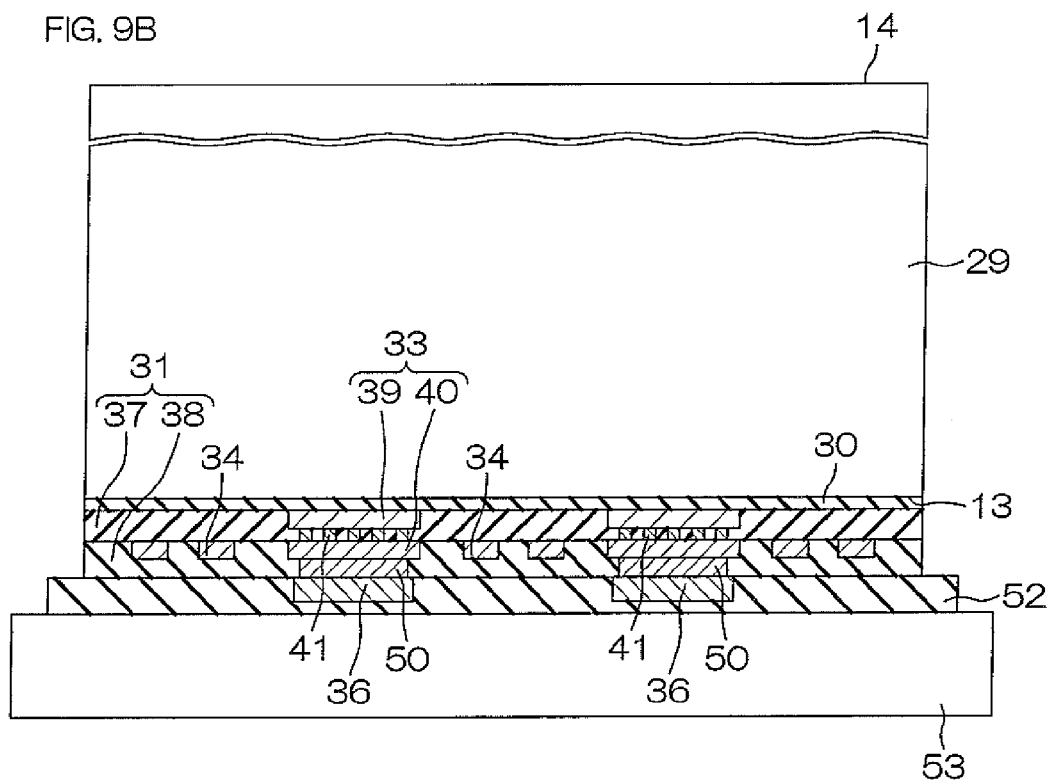

Then, a glass substrate 53 (a support) is bonded to the front surface 13 of the Si substrate 29 through an adhesive 52, as shown in FIG. 9B.

Figure 9C:
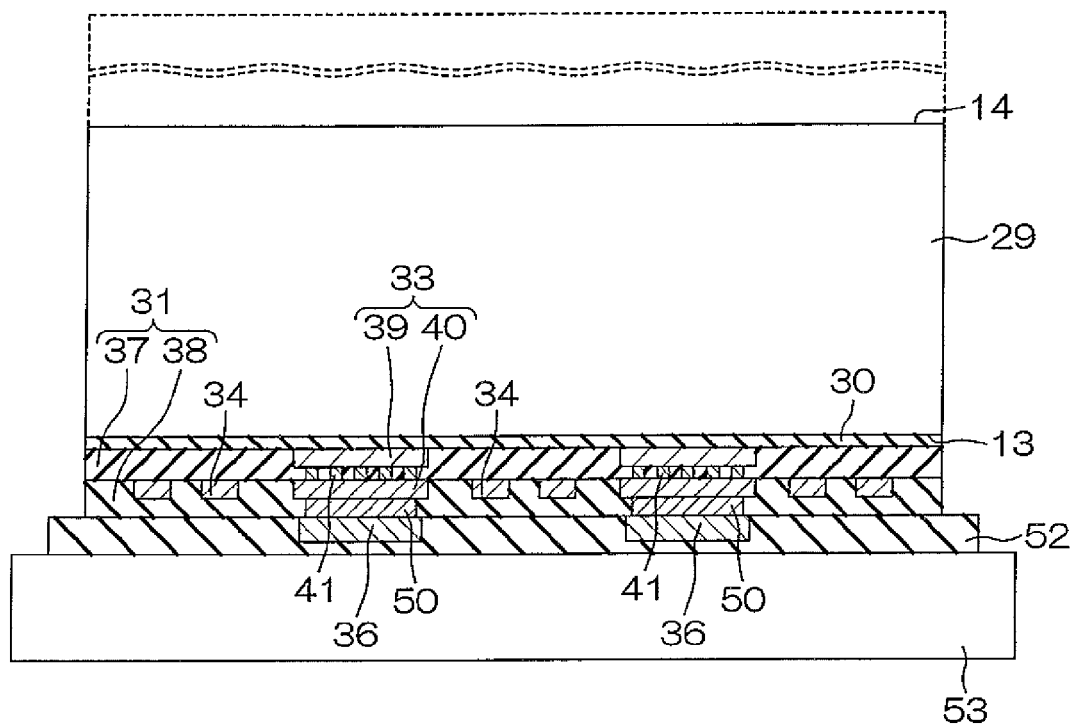

Then, the thickness of the Si substrate 29 is reduced by polishing (back-grinding) the Si substrate 29 from the side of a rear surface 14 with a grinder or the like, for example, as shown in FIG. 9C. According to the third embodiment, the Si substrate 29 of not less than 700 μm in thickness is polished up to a thickness of 30 μm to 50 μm.

Figure 9D:
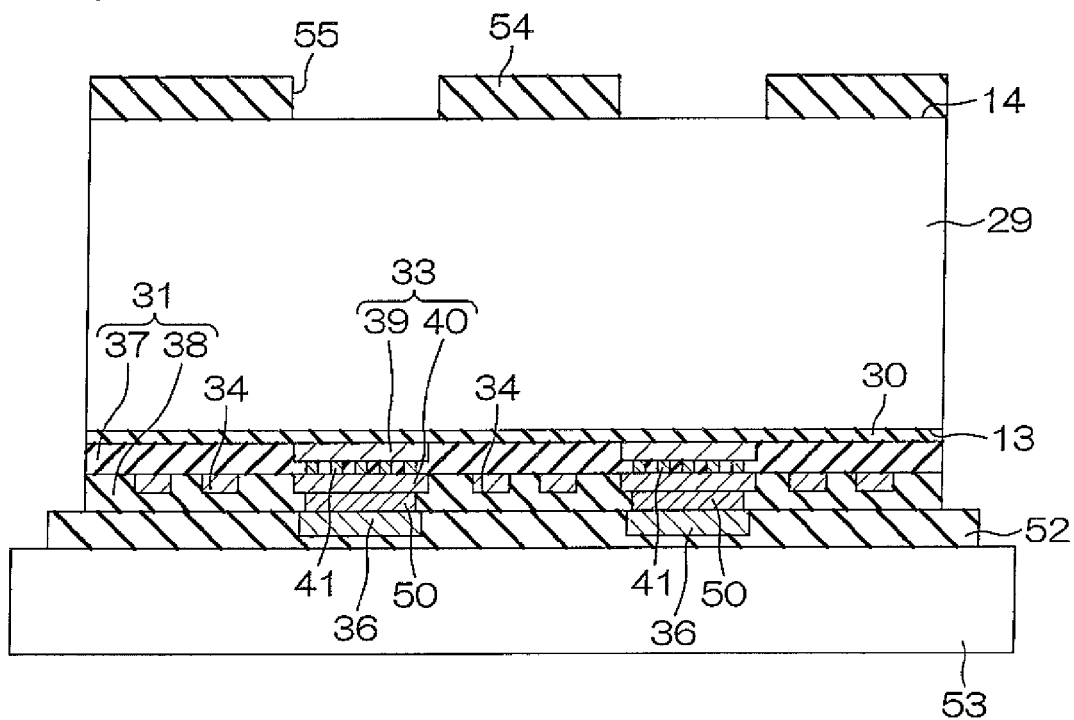

Then, a hard mask 54 (a silicon oxide film, for example) selectively having openings 55 in regions for forming the through-electrodes 17 is formed on the rear surface 14 of the Si substrate 29, as shown in FIG. 9D.

Figure 9E:
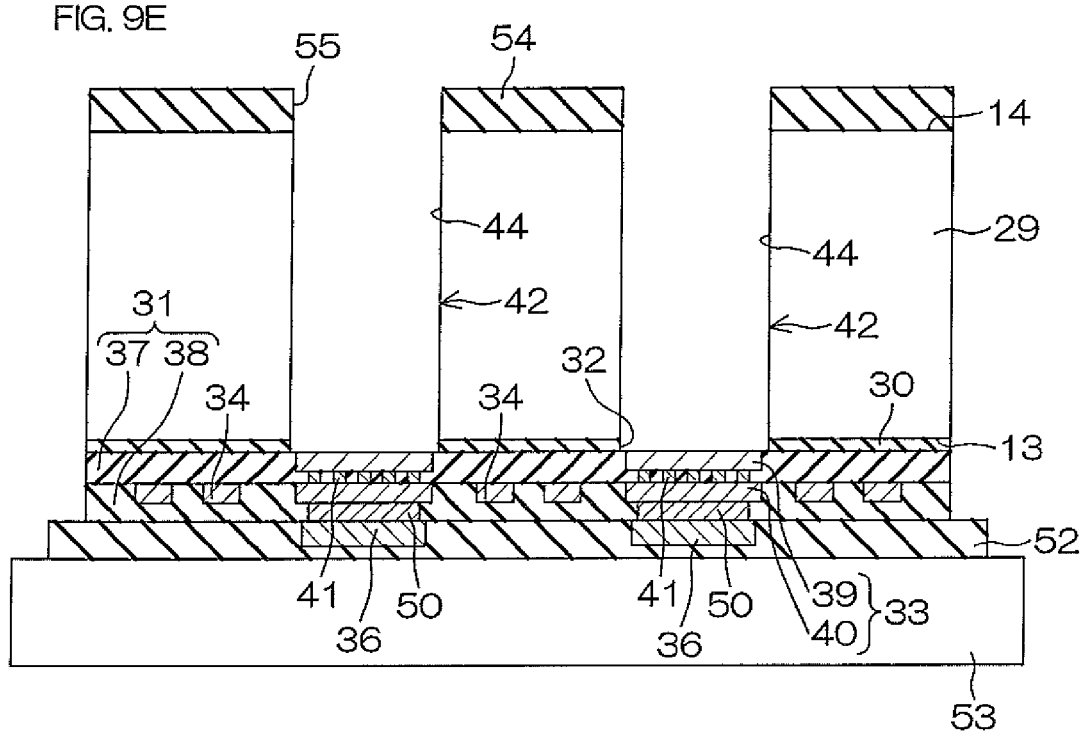

Then, the Si substrate 29 is dry-etched from the side of the rear surface 14 by supplying etching gas ($SF_6/O_2$ or the like, for example) to the Si substrate 29 through the hard mask 54, as shown in FIG. 9E. The etching is continued until the gate insulating film 30 is exposed through the Si substrate 29. Thus, vias 42 are formed on the Si substrate 29. Further, surface pads 33 (the lower pads 39) are exposed in the vias 42 by etching portions of the gate insulating film 30 forming bottom surfaces of the vias 42 thereby forming the openings 32.

Figure 9F:
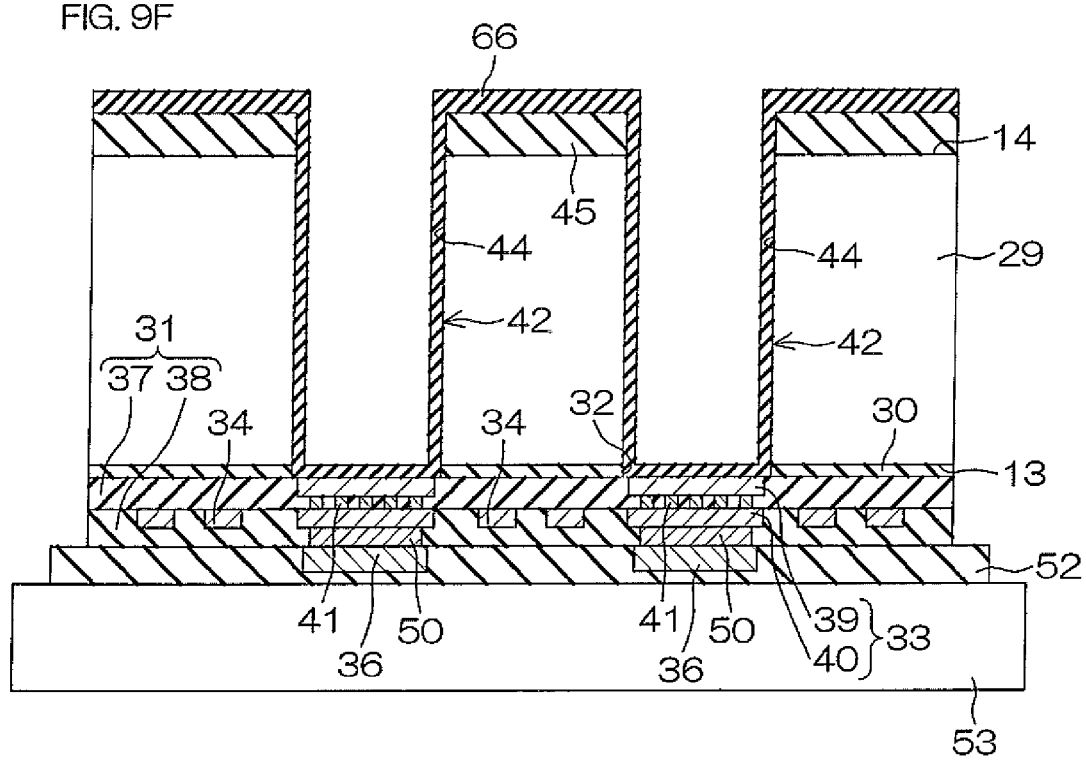
Figure 9G:
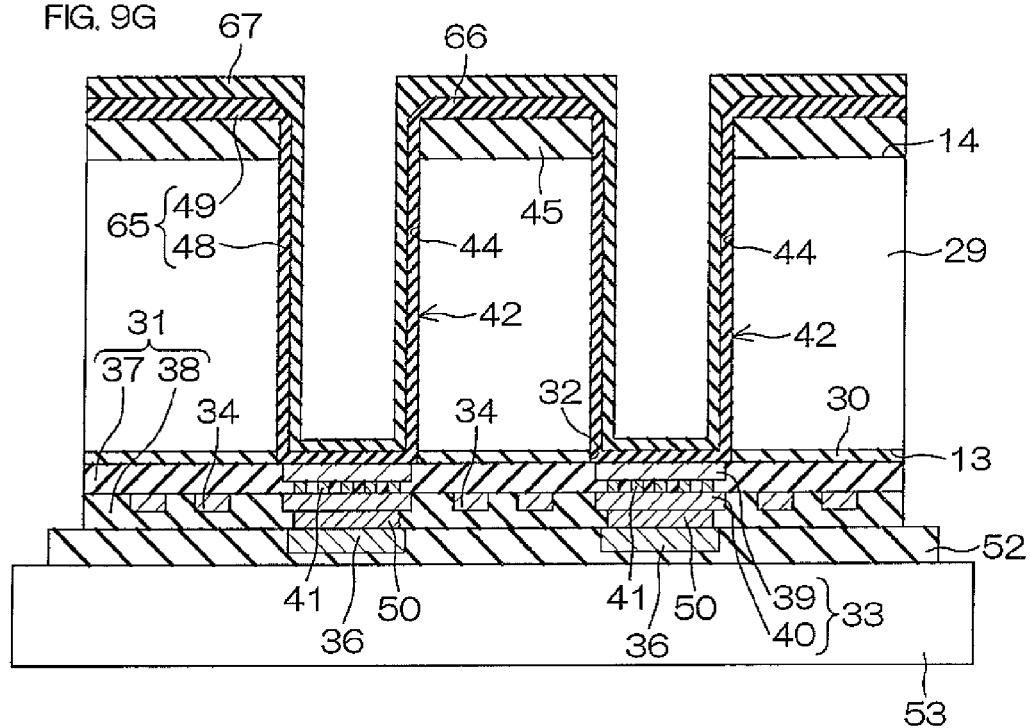

Then, the silicon oxide film 66 and the silicon nitride film 67 are continuously formed on inner surfaces (bottom walls and the peripheral walls 44) of the vias 42 and the whole region of the rear surface 14 of the Si substrate 29 by PECVD while leaving the hard mask 54 employed for forming the vias 42 as an insulating film 45, as shown in FIGS. 9F and 9G. Thus, the via insulating film 65 consisting of the silicon oxide film 66 and the silicon nitride film 67 is formed.

Figure 9H:
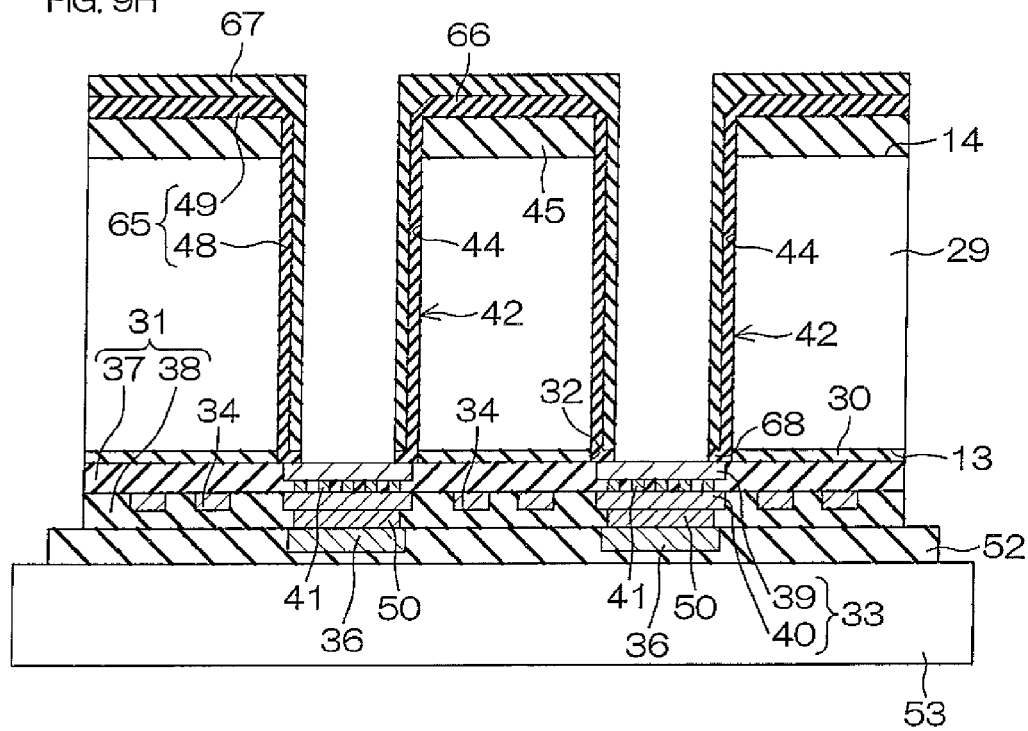

Then, bottom portions (located on the surface pads 33) of the silicon oxide film 66 and the silicon nitride film 67 are selectively continuously removed by etchback, as shown in FIG. 9H. Thus, the surface pads 33 (the lower pads 39) are reexposed in the vias 42. At this time, the bottom portion of the silicon oxide film 66 is partially covered also with portions of the silicon nitride film 67 located on the peripheral walls 44. Therefore, the bottom portion is partially protected by the portions of the silicon nitride film 67 located on the peripheral walls 44 in the etchback, to selectively remain as the overlap portions 68.

Figure 9I:
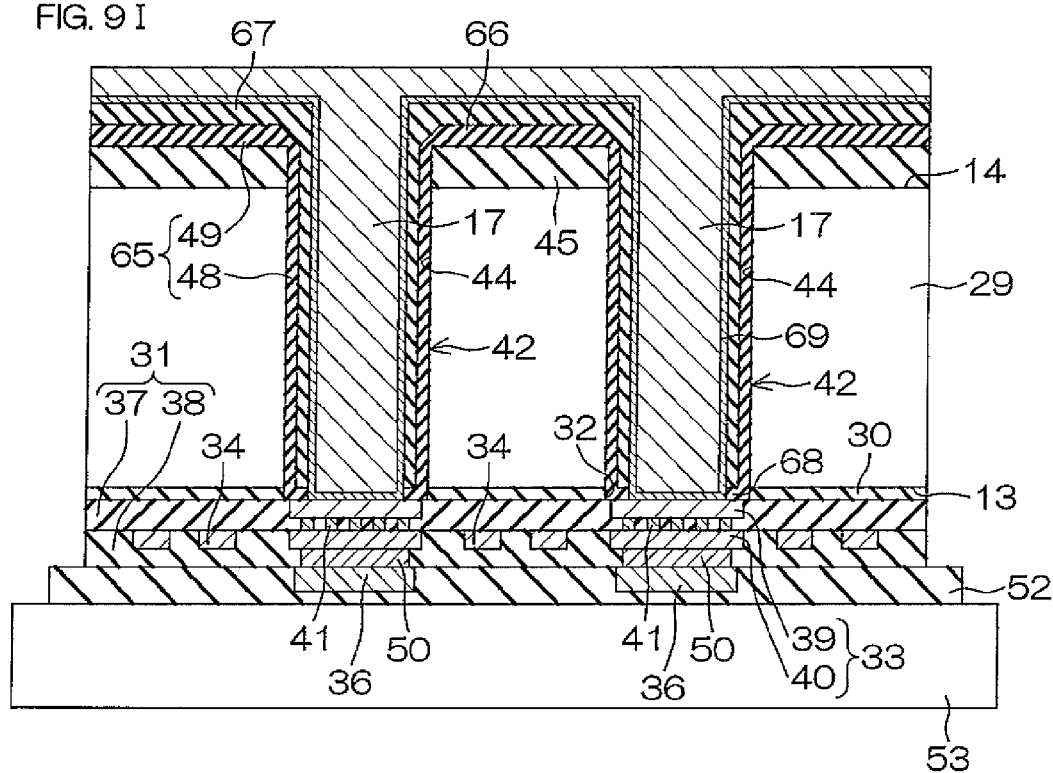

Then, the barrier film 69 is formed on a front surface of the via insulating film 65, and a seed film (a multilayer film of Ti and Cu, for example) is thereafter sputtered, as shown in FIG. 9I. Thereafter Cu is grown from the seed film by electroplating. Thus, Cu (an electrode material) is charged into the vias 42 inside the barrier film 69, to form the through-electrodes 17 electrically connected to the surface pads 33.

Figure 9J:
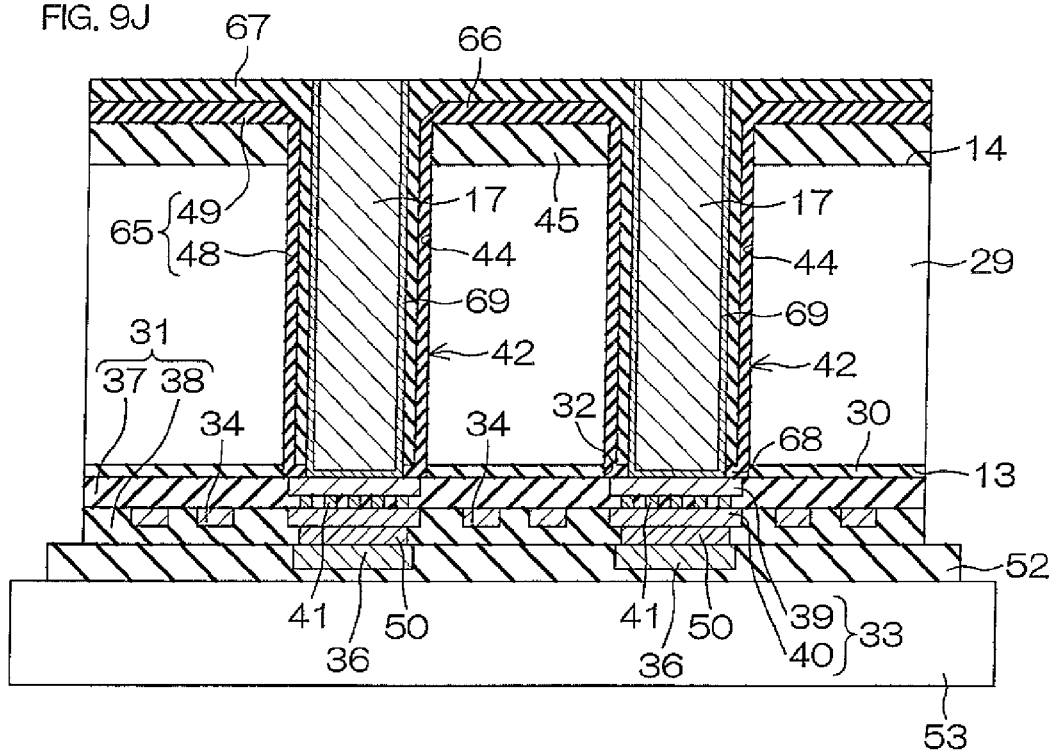

Then, excess portions (portions outside the vias 42) of the through-electrodes 17 and the barrier film 69 are removed by CMP (Chemical Mechanical Polishing) until the polished surfaces are flush with a rear surface portion 49 of the via insulating film 65, as shown in FIG. 9J.

Figure 9K:
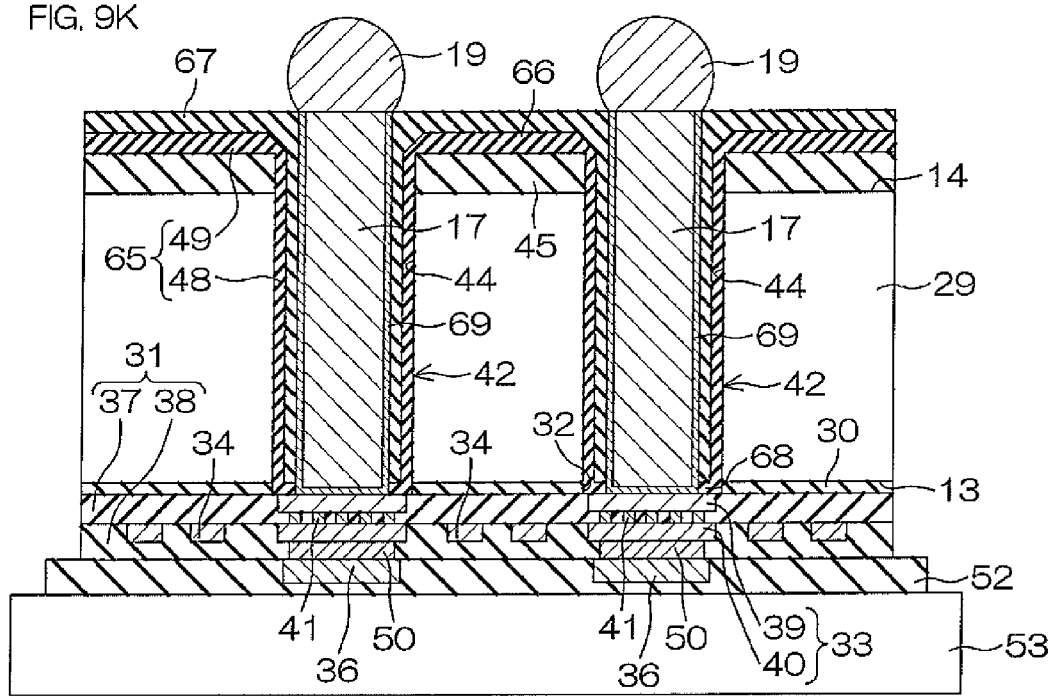
Figure 9L:
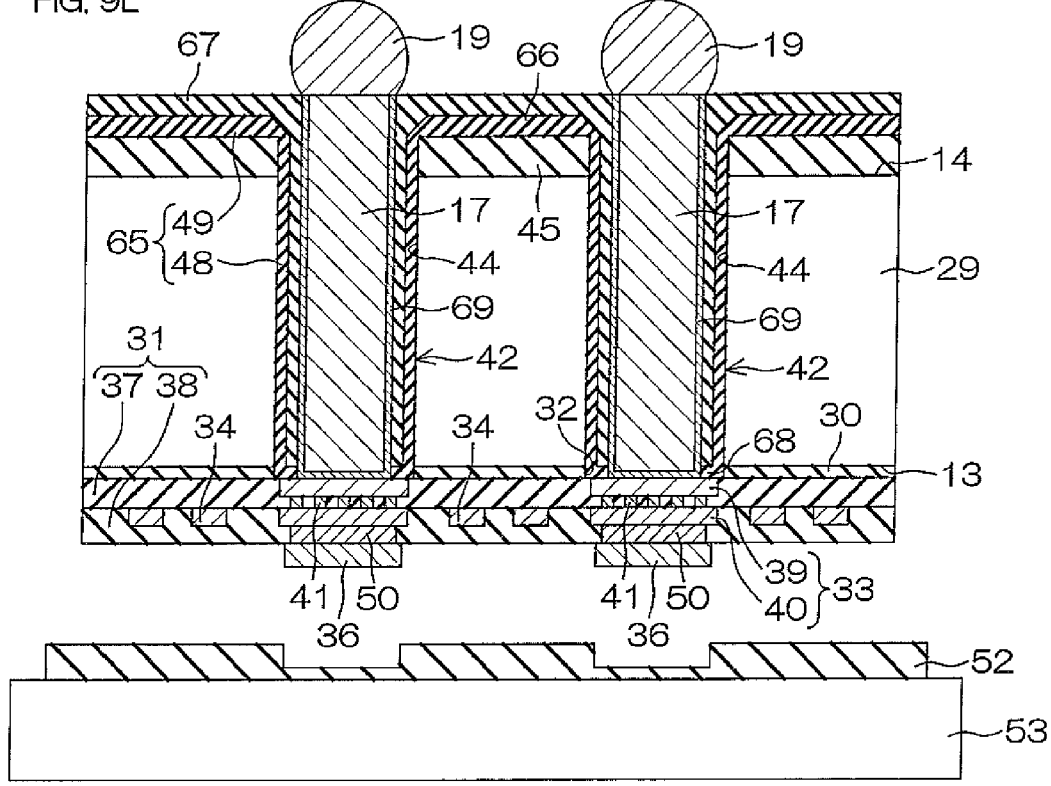

Thereafter rear surface bumps 19 are formed one by one on the through-electrodes 17 as shown in FIG. 9K, and the Si substrate 29 is detached from the glass substrate 53 as shown in FIG. 9L, thereby obtaining the arithmetic chip 64 shown in FIG. 8.

According to the third embodiment, as hereinabove described, the silicon nitride film 67 forming the outermost layer of the via insulating film 65 can reliably inhibit diffusion of Cu from the through-electrodes 17, when such diffusion of Cu cannot be inhibited with the barrier film 69 alone. Consequently, the silicon oxide film 66 forming the via insulating film 65 and an element such as a transistor formed on the Si substrate 29 can be inhibited from deterioration.

Further, the formation of the silicon oxide film 66 and the silicon nitride film 67 (FIGS. 9F and 9G) and the selective removal of the silicon oxide film 66 and the silicon nitride film 67 (FIG. 9H) are continuously carried out, whereby the number of steps can be reduced. Consequently, manufacturing efficiency can be improved.

Fourth Embodiment

Figure 10:
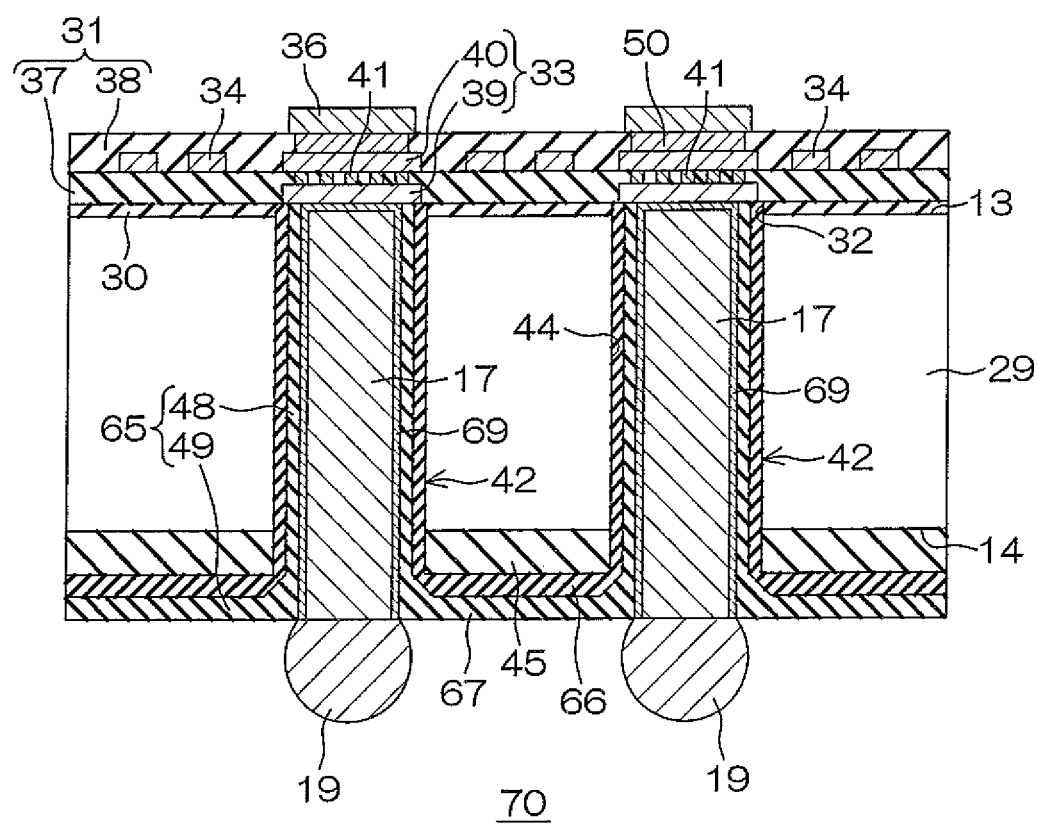
FIG. 10 is a schematic sectional view for illustrating the structure of the arithmetic chip (a fourth embodiment) shown in FIG. 1.

FIG. 10 is a schematic sectional view for illustrating the structure of the arithmetic chip (a fourth embodiment) shown in FIG. 1. Referring to FIG. 10, portions corresponding to those shown in FIGS. 4 and 8 are denoted by the same reference signs.

In the aforementioned third embodiment, the silicon oxide film 66 has the overlap portions 68 extending in the openings 32 of the gate insulating film 30 toward the side of the silicon nitride film 67 to cover the end portions of the silicon nitride film 67. When the barrier film 69 is formed by sputtering in this case, the thickness of the barrier film 69 is easily reduced on bottom portions (in the vicinity of the surface pads 33) of the vias 42, due to a relatively high aspect ratio resulting from the sputtering. Therefore, it is important to cover the portions with the silicon nitride film 67. According to the third embodiment, however, the overlap portions 68 of the silicon oxide film 66 are not covered with the silicon nitride film 67, and hence Cu may diffuse through the overlap portions 68.

In an arithmetic chip 70 according to the fourth embodiment, therefore, a silicon nitride film 67 is formed up to rear surfaces of surface pads 33 following peripheral walls 44 of vias 42, so that a silicon oxide film 66 is not exposed in openings 32 of a gate insulating film 30. In other words, the whole region of the silicon oxide film 66 is covered with the silicon nitride film 67 from inside. Thus, the silicon nitride film 67 is arranged also on portions where the thickness of the barrier film 69 is easily reduced, whereby diffusion of Cu from through-electrodes 17 can be reliably inhibited.

The remaining structure of the arithmetic chip 70 according to the fourth embodiment is similar to those of the arithmetic chips 4 and 64 according to the aforementioned first and third embodiments.

FIGS. 11A to 11M partially illustrate manufacturing steps for the arithmetic chip 70 shown in FIG. 10 in step order.

As shown in FIGS. 11A to 11F, steps up to that of forming the silicon oxide film 66 on inner surfaces (bottom walls and the peripheral walls 44) of the vias 42 and the whole region of a rear surface 14 of an Si substrate 29 are carried out similarly to those shown in FIGS. 9A to 9F.

Figure 11A:
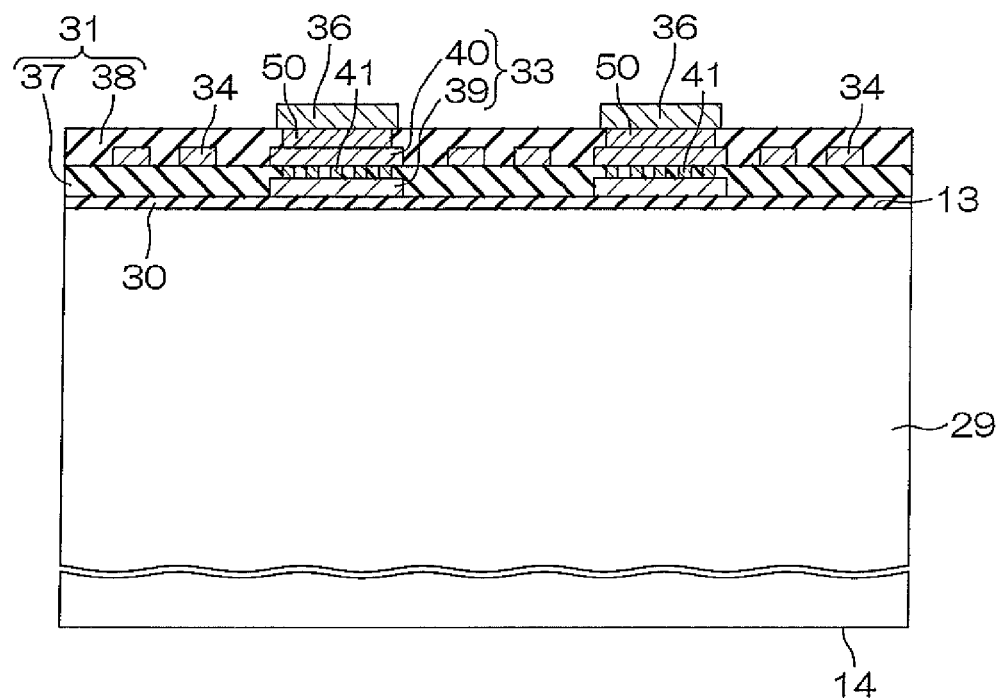
FIGS. 11A to 11M partially illustrate manufacturing steps for the arithmetic chip shown in FIG. 10 in step order.
Figure 11B:
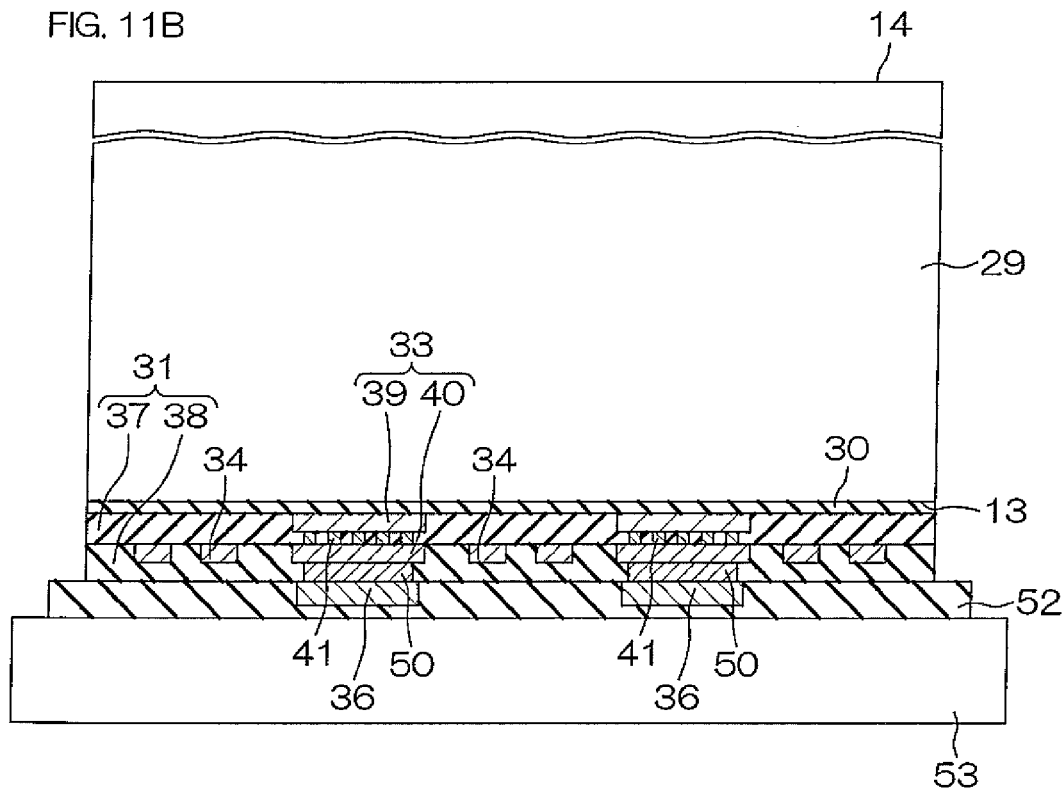
Figure 11C:
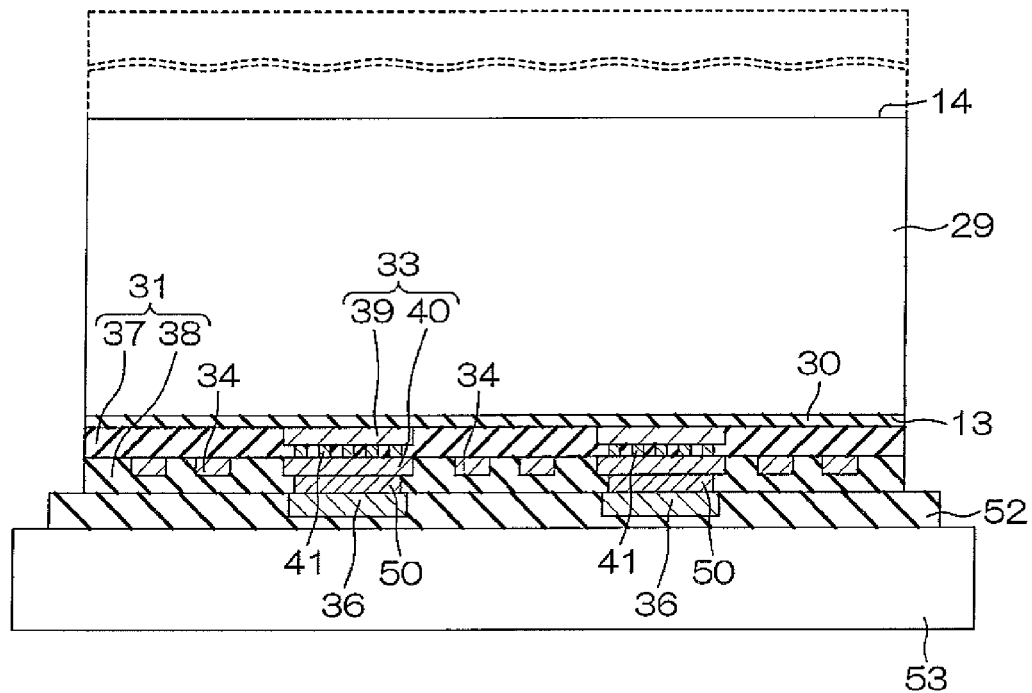
Figure 11D:
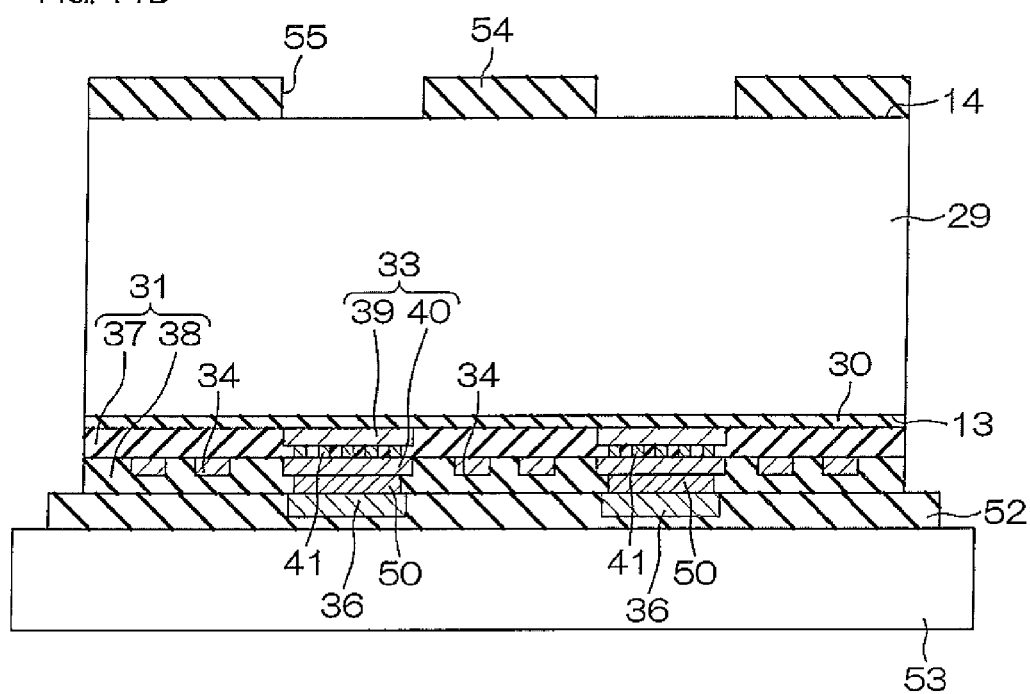
Figure 11E:
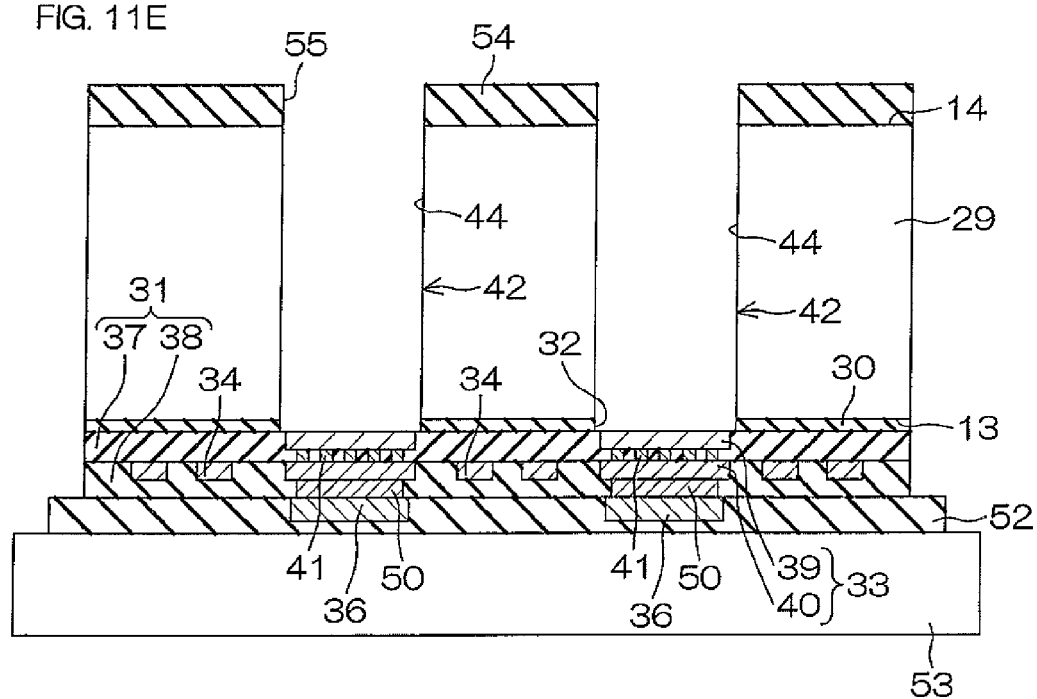
Figure 11F:
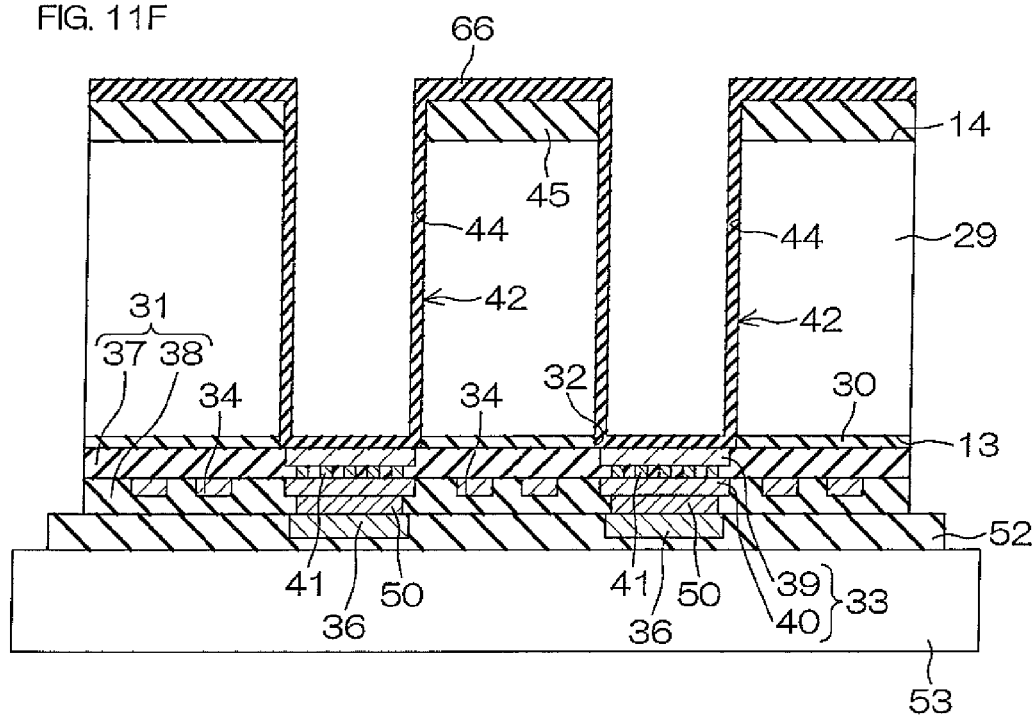
Figure 11G:
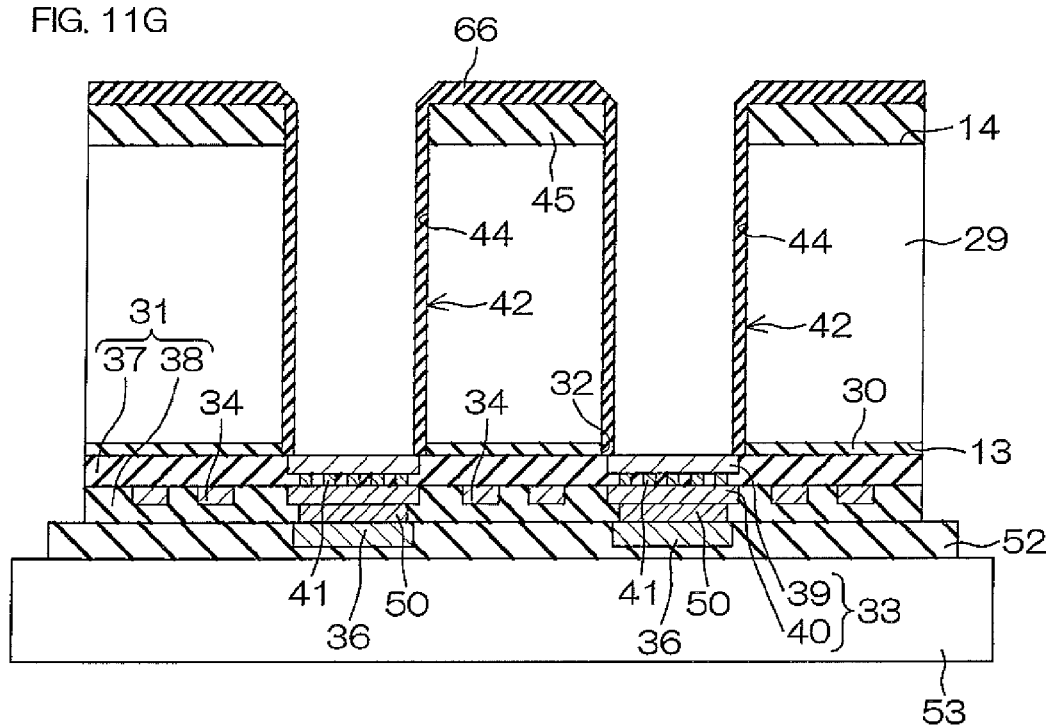

Then, bottom portions (located on the surface pads 33) of the silicon oxide film 66 are selectively continuously removed by etchback, as shown in FIG. 11G. Thus, the surface pads 33 (lower pads 39) are reexposed in the vias 42.

Figure 11H:
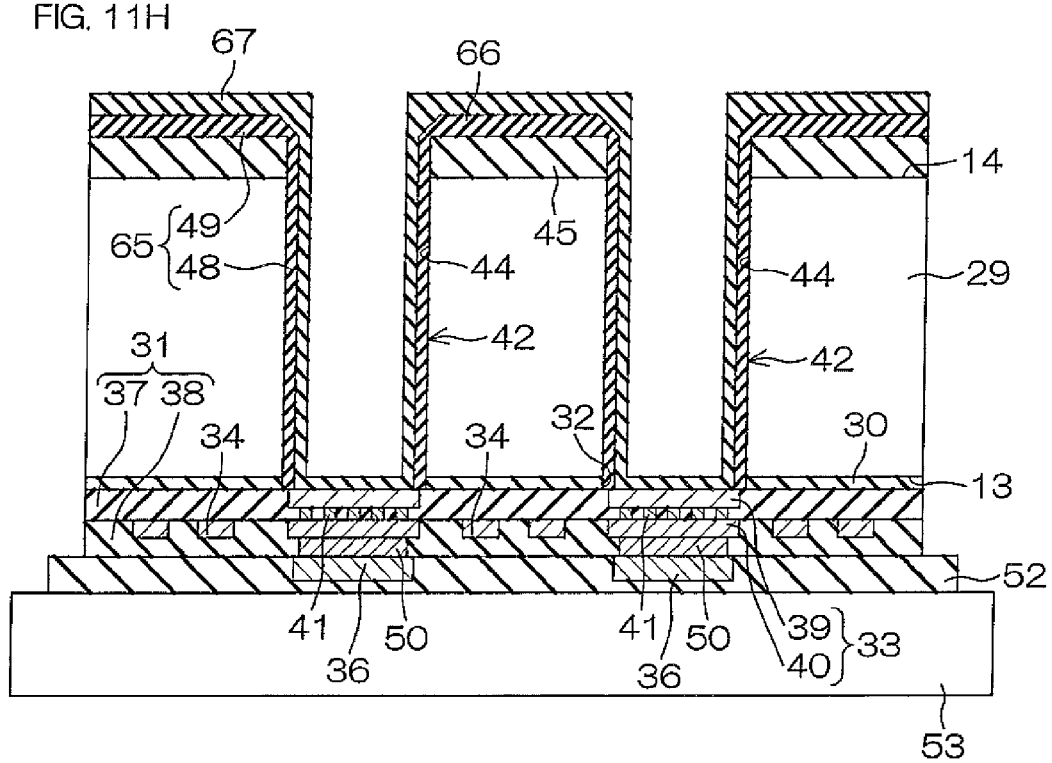

Then, the silicon nitride film 67 is formed on the inner surfaces (the bottom walls and the peripheral walls 44) of the vias 42 and the whole region of the rear surface 14 of the Si substrate 29 by PECVD, as shown in FIG. 11H. Thus, a via insulating film 65 consisting of the silicon oxide film 66 and the silicon nitride film 67 is formed.

Figure 11I:
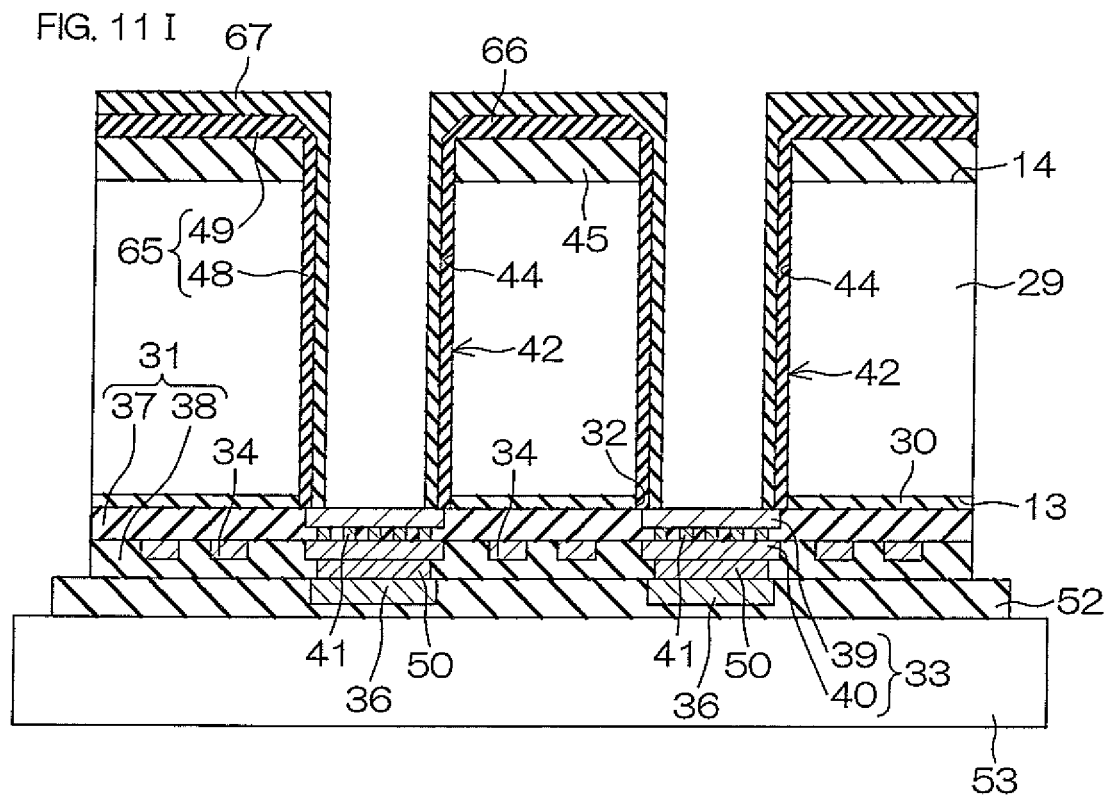

Then, bottom portions (located on the surface pads 33) of the silicon nitride film 67 are selectively continuously removed by etchback, as shown in FIG. 11I. Thus, the surface pads 33 (the lower pads 39) are reexposed in the vias 42.

Figure 11J:
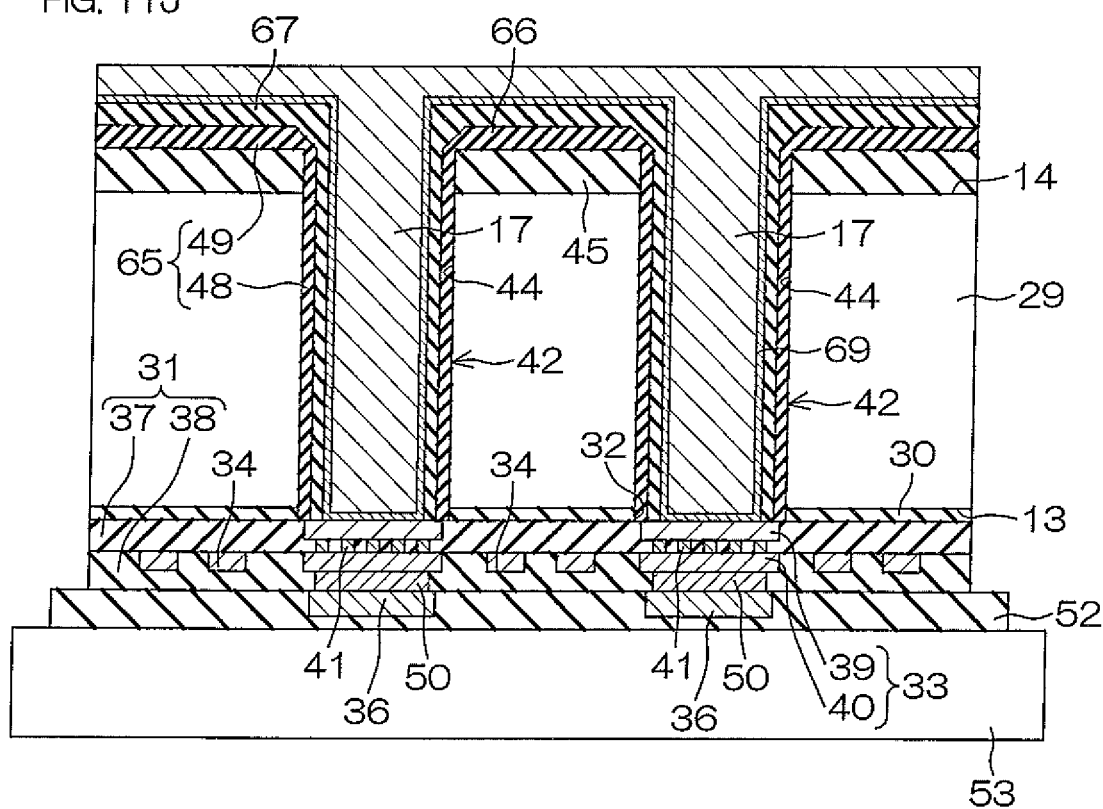

Then, the barrier film 69 is formed on a front surface of the via insulating film 65, and a seed film (a multilayer film of Ti and Cu, for example) is thereafter sputtered, as shown in FIG. 11J. Thereafter Cu is grown from the seed film by electroplating. Thus, Cu (an electrode material) is charged into the vias 42 inside the barrier film 69, to form the through-electrodes 17 electrically connected to the surface pads 33.

Figure 11K:
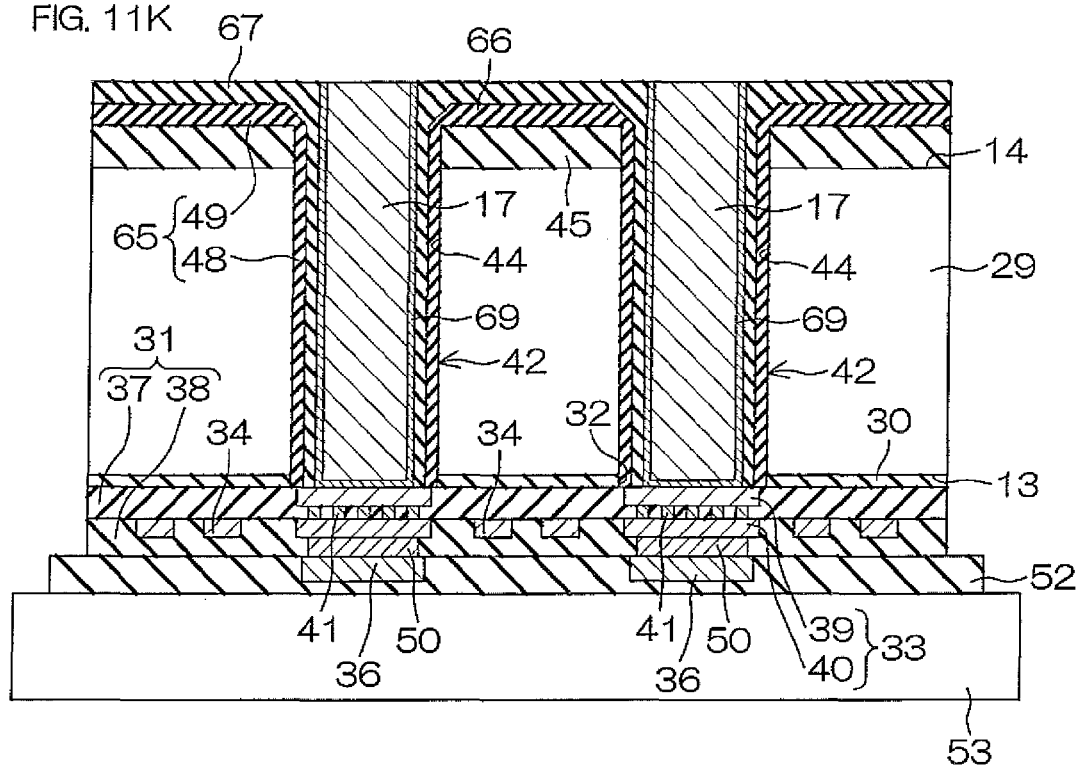

Then, excess portions (portions outside the vias 42) of the through-electrodes 17 and the barrier film 69 are removed by CMP (Chemical Mechanical Polishing) until the polished surfaces are flush with a rear surface portion 49 of the via insulating film 60, as shown in FIG. 11K.

Figure 11L:
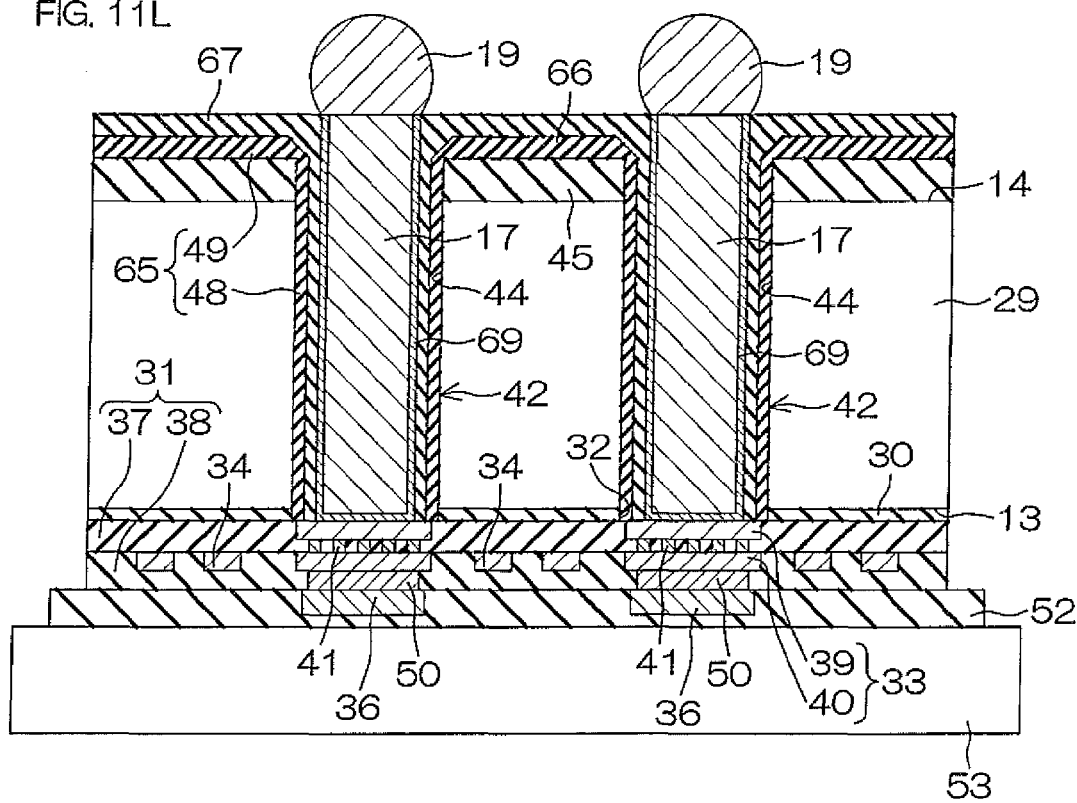
Figure 11M:
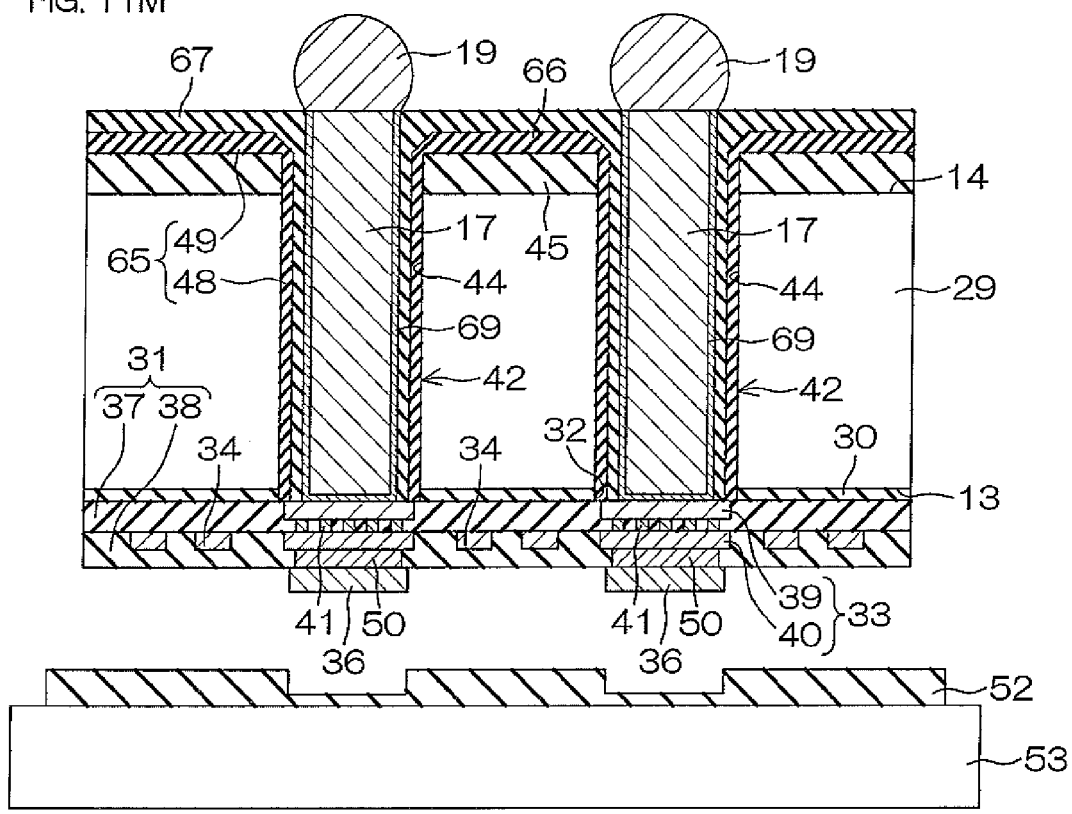

Thereafter rear surface bumps 19 are formed one by one on the through-electrodes 17 as shown in FIG. 11L, and the Si substrate 29 is detached from a glass substrate 53 as shown in FIG. 11M, thereby obtaining the arithmetic chip 70 shown in FIG. 10.

Fifth Embodiment

Figure 12:
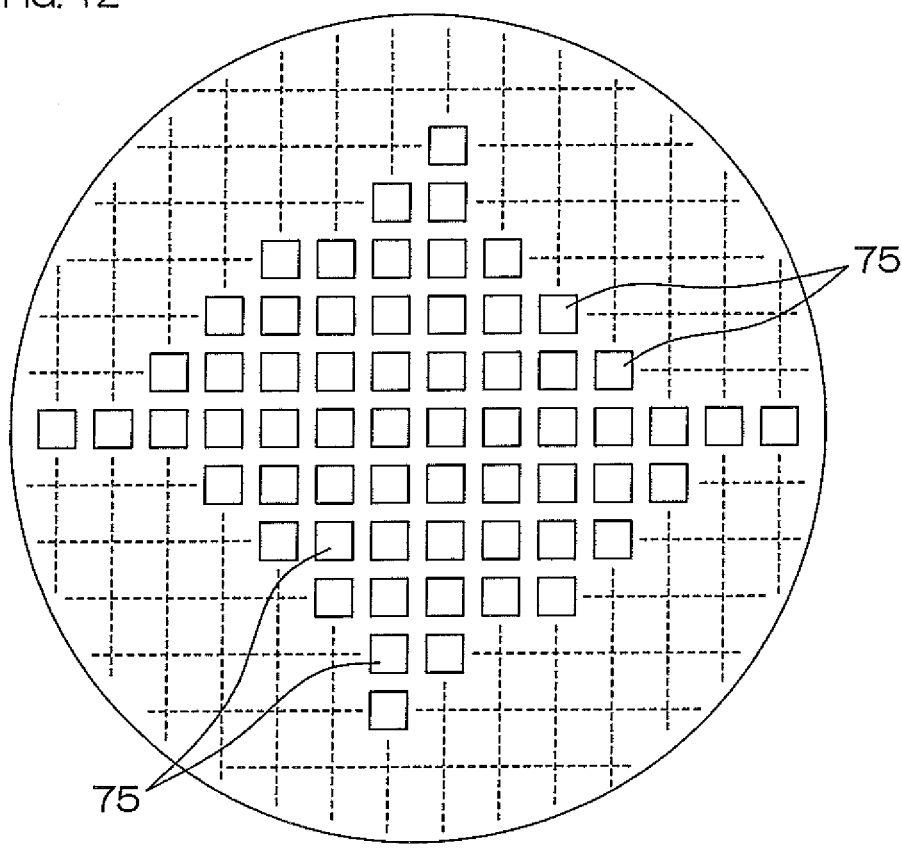
FIG. 12 is a schematic plan view of a semiconductor wafer employed for manufacturing the arithmetic chip (a fifth embodiment) shown in FIG. 1.
Figure 13:
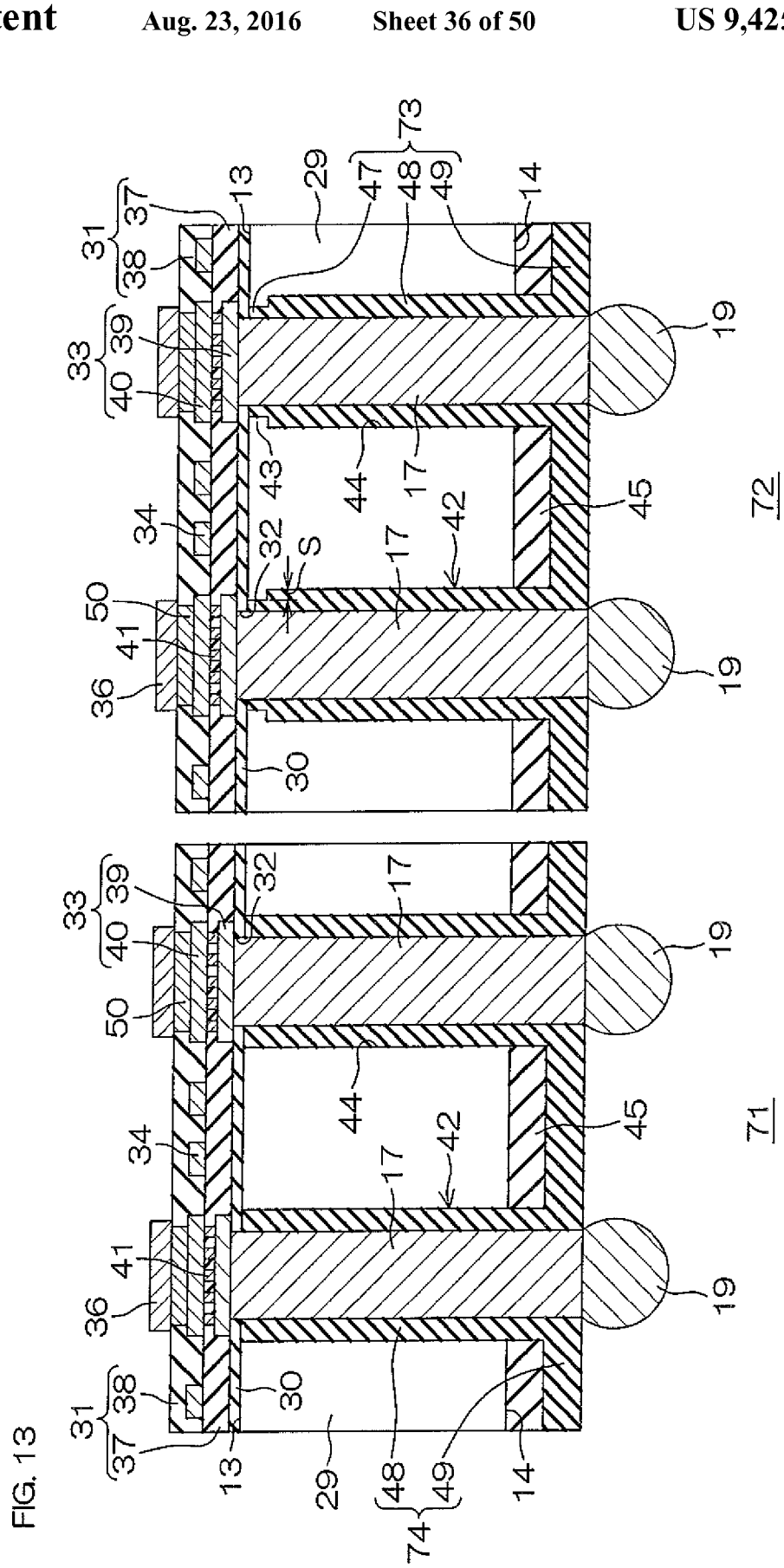
FIG. 13 is a schematic sectional view for illustrating the structure of the arithmetic chip (the fifth embodiment) shown in FIG. 1.

FIG. 12 is a schematic plan view of a semiconductor wafer employed for manufacturing the arithmetic chip (a fifth embodiment) shown in FIG. 1. FIG. 13 is a schematic sectional view for illustrating the structure of the arithmetic chip (the fifth embodiment) shown in FIG. 1. Referring to FIGS. 12 and 13, portions corresponding to those shown in FIG. 4 are denoted by the same reference signs.

According to the fifth embodiment, a first arithmetic chip 71 (a first semiconductor device) and a second arithmetic chip 72 (a second semiconductor device) provided with via insulating films having shapes different from each other are manufactured. The first and second arithmetic chips 71 and 72 are manufactured by employing an Si wafer 76 arrayed with a plurality of element regions 75, for example. The Si wafer 76 forms an Si substrate 29 for the arithmetic chips 71 and 72 as manufactured. Semiconductor chips are formed one by one on the element regions 75 respectively. According to the fifth embodiment, it is assumed that the element regions where the first and second arithmetic chips 71 and 72 are formed respectively are first and second element regions 77 and 78.

Similarly to the arithmetic chip 4 according to the first embodiment, flange portions 43 are formed on peripheral walls 44, and steps S are provided on the peripheral walls 44 in the second arithmetic chip 72. Further, a thickness difference compensating for the steps S is provided between a body portion 48 and a bottom portion 47 of a via insulating film 73 of the second arithmetic chip 72, to planarize contact surfaces between the portions 48 and 47 and through-electrodes 17 so that no steps corresponding to the steps S are formed on the boundary between the body portion 48 and the bottom portion 47. The via insulating film 73 may be a single-layer film of silicon oxide, or a multilayer film of a silicon oxide film and a silicon nitride film.

In the first arithmetic chip 71, on the other hand, peripheral walls 44 are smooth planar surfaces provided with no flange portions 43. A via insulating film 74 of the first arithmetic chip 71 has a constant thickness following the peripheral walls 44. The via insulating film 74 may also be a single-layer film of silicon oxide, or a multilayer film of a silicon oxide film and a silicon nitride film.

The remaining structures of the first and second arithmetic chips 71 and 72 according to the fifth embodiment are similar to that of the arithmetic chip 4 according to the aforementioned first embodiment.

Figure 14B:
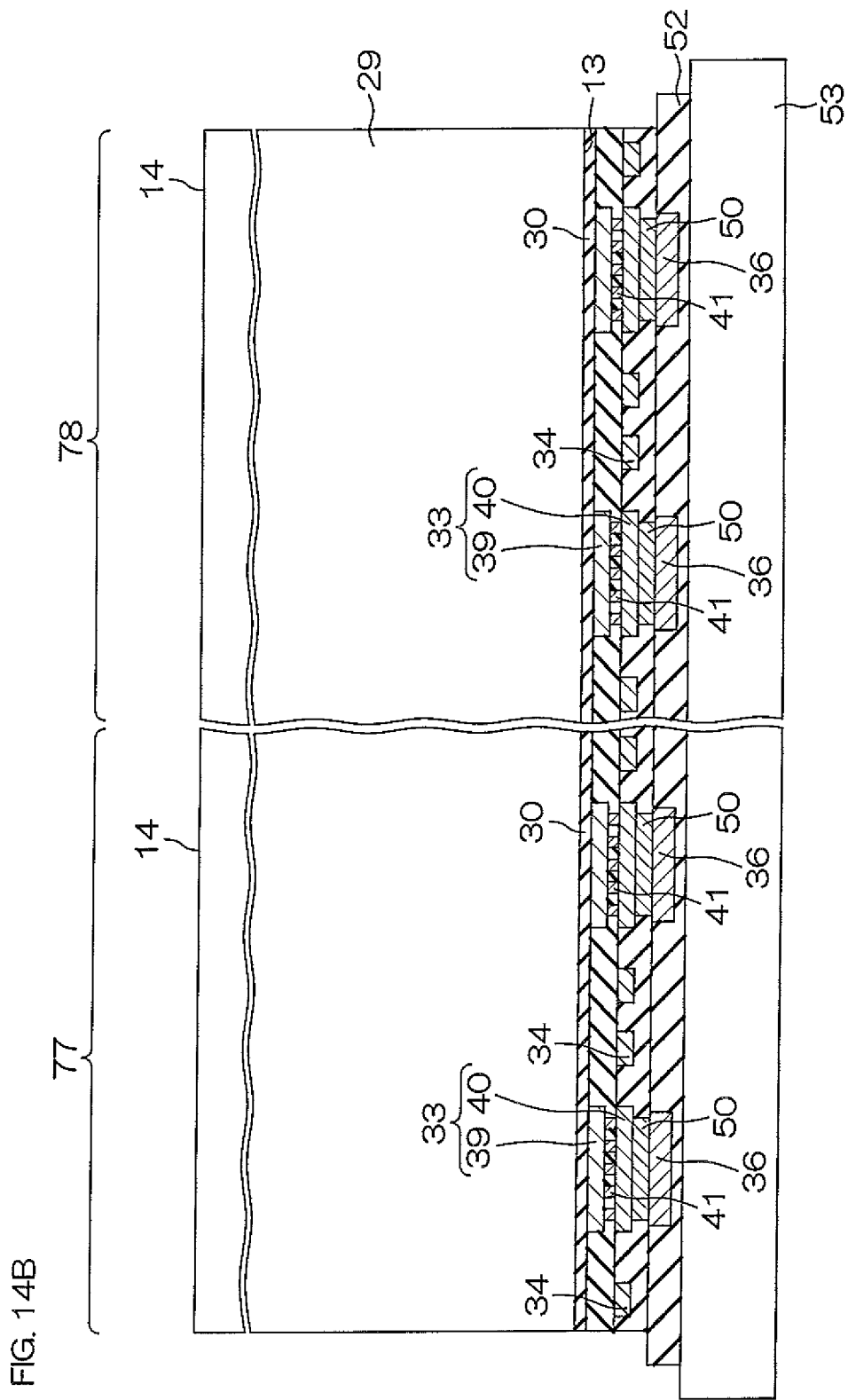
FIGS. 14A to 14N partially illustrate manufacturing steps for the arithmetic chip shown in FIG. 13 in step order.
Figure 14C:
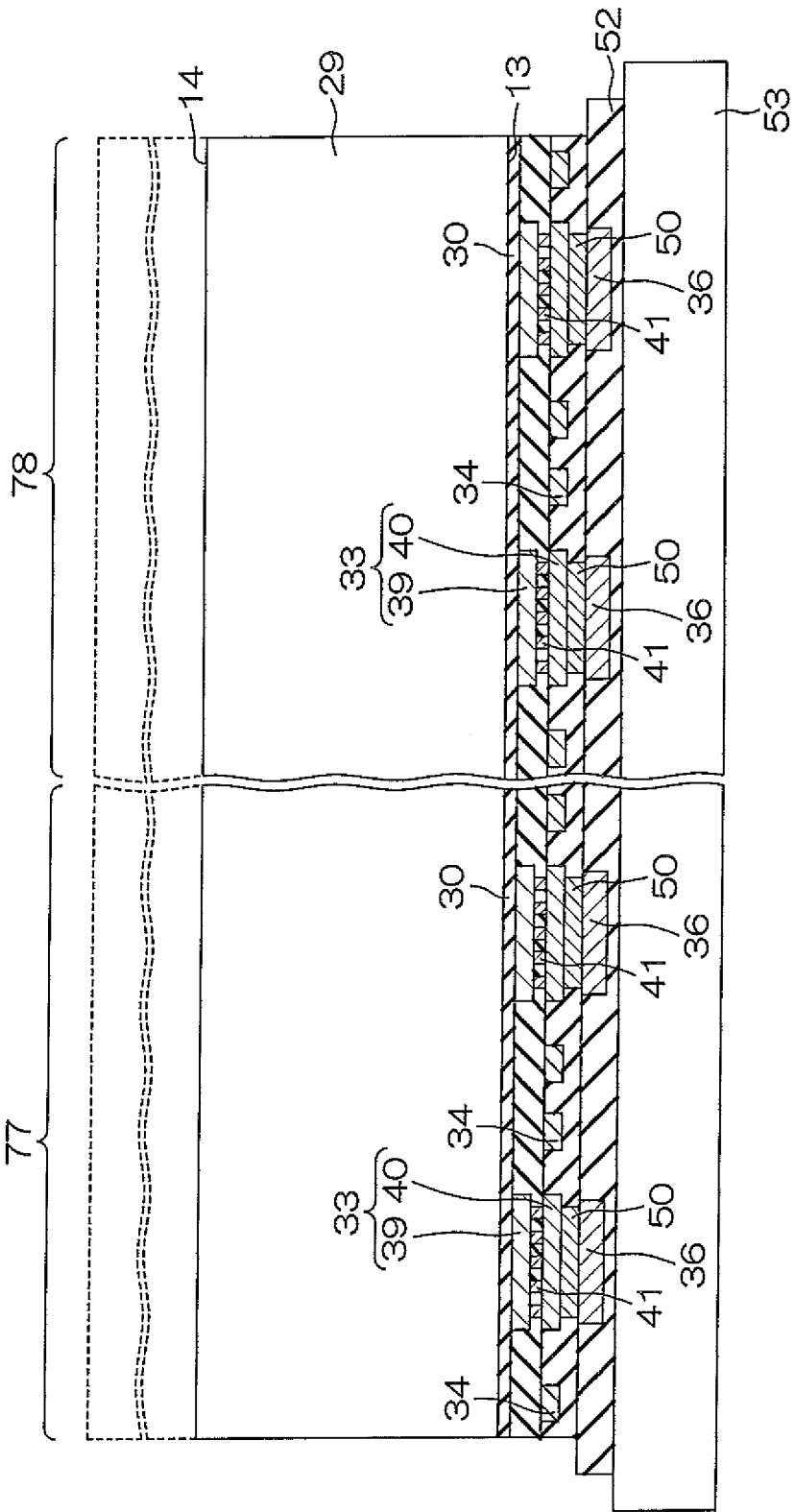
Figure 14E:
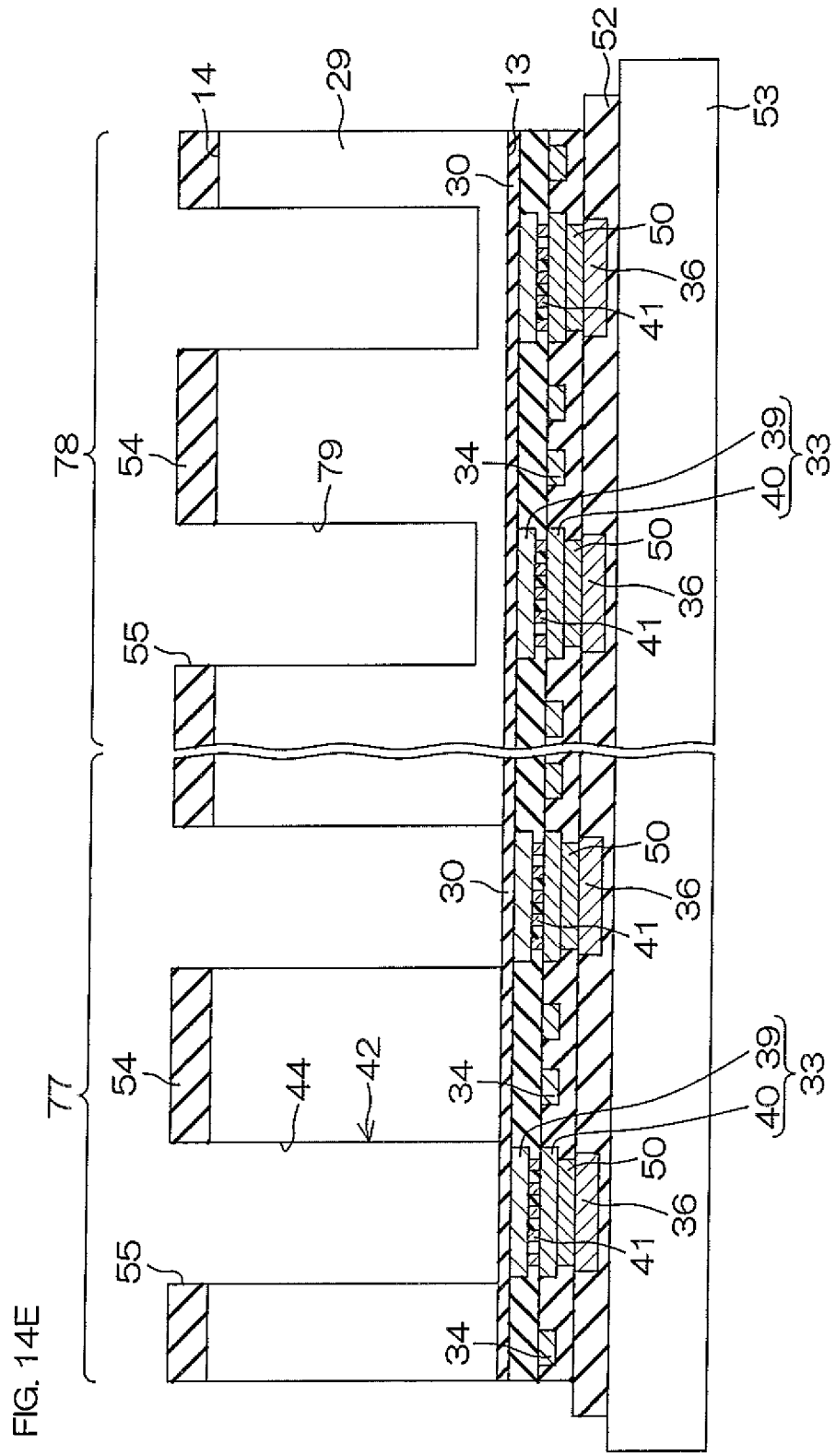
Figure 14F:
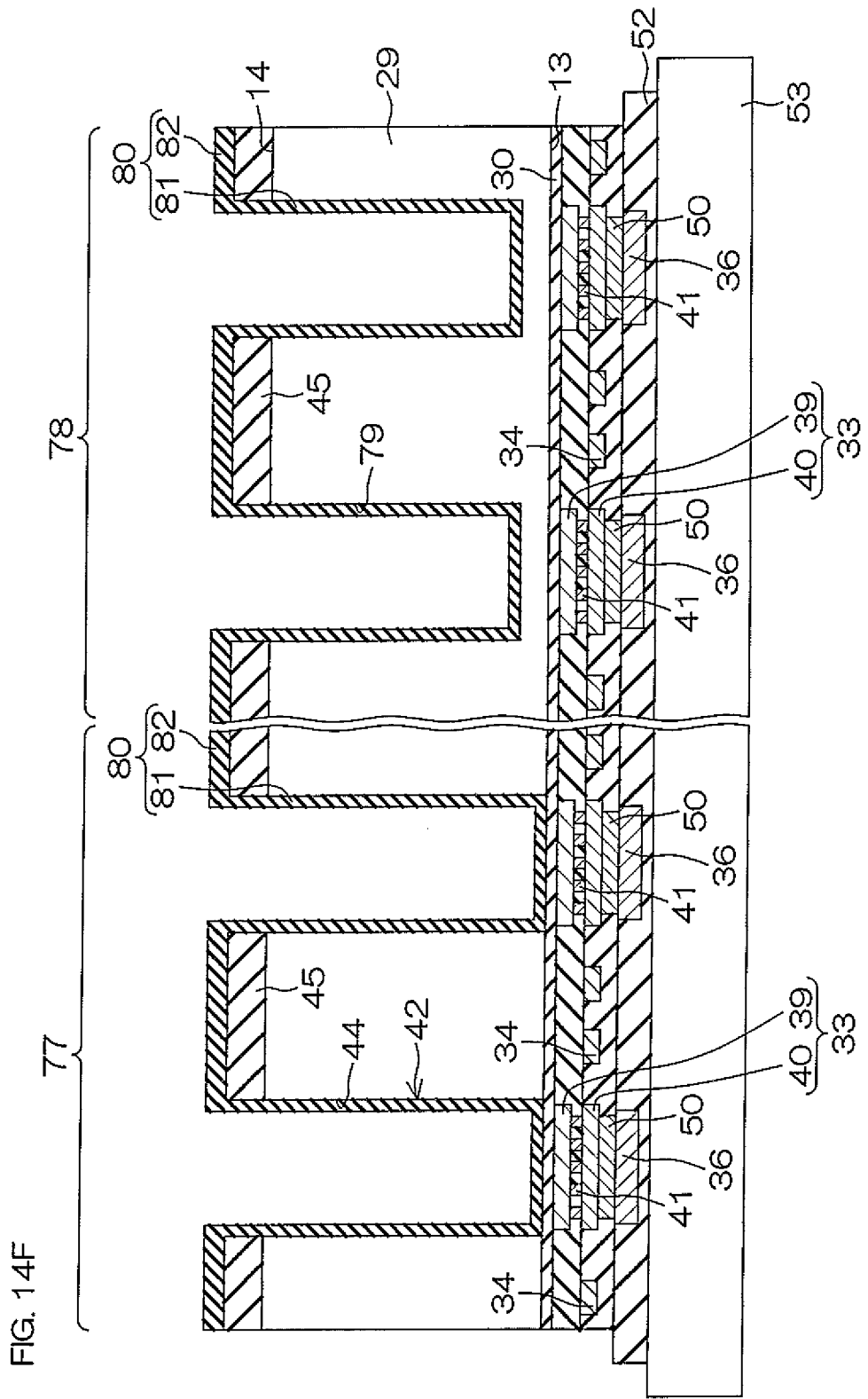
Figure 14G:
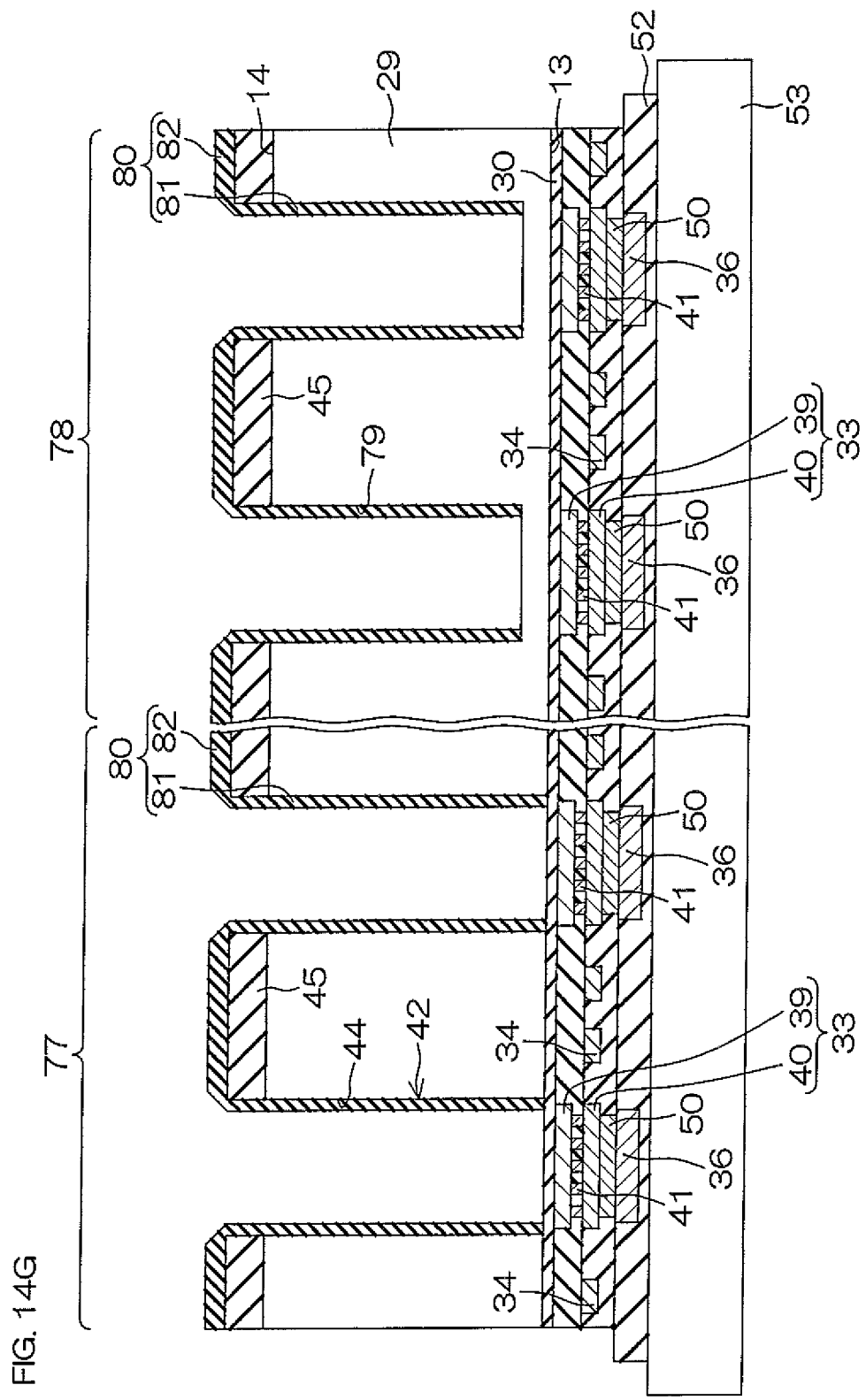
Figure 14H:
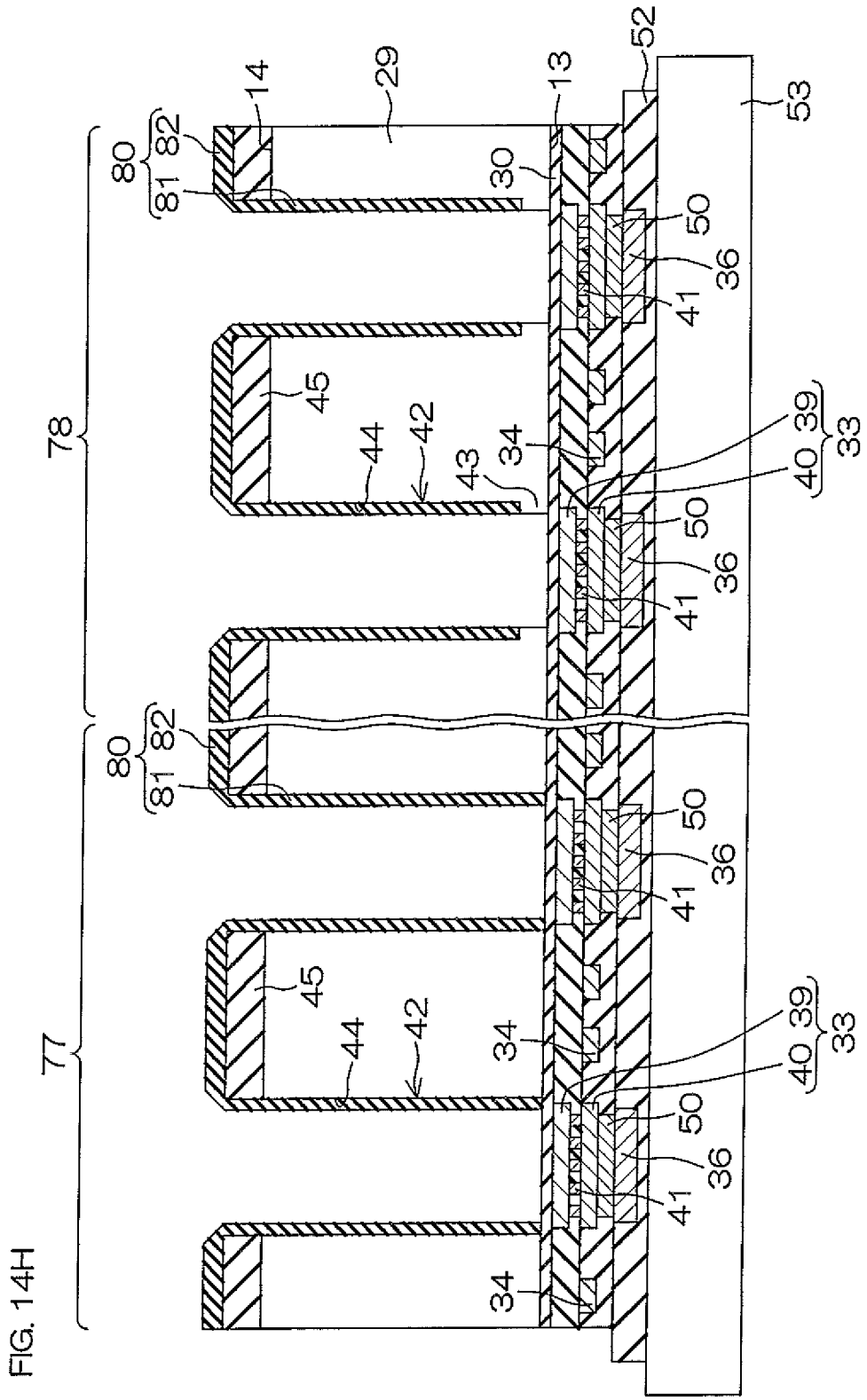
Figure 14:
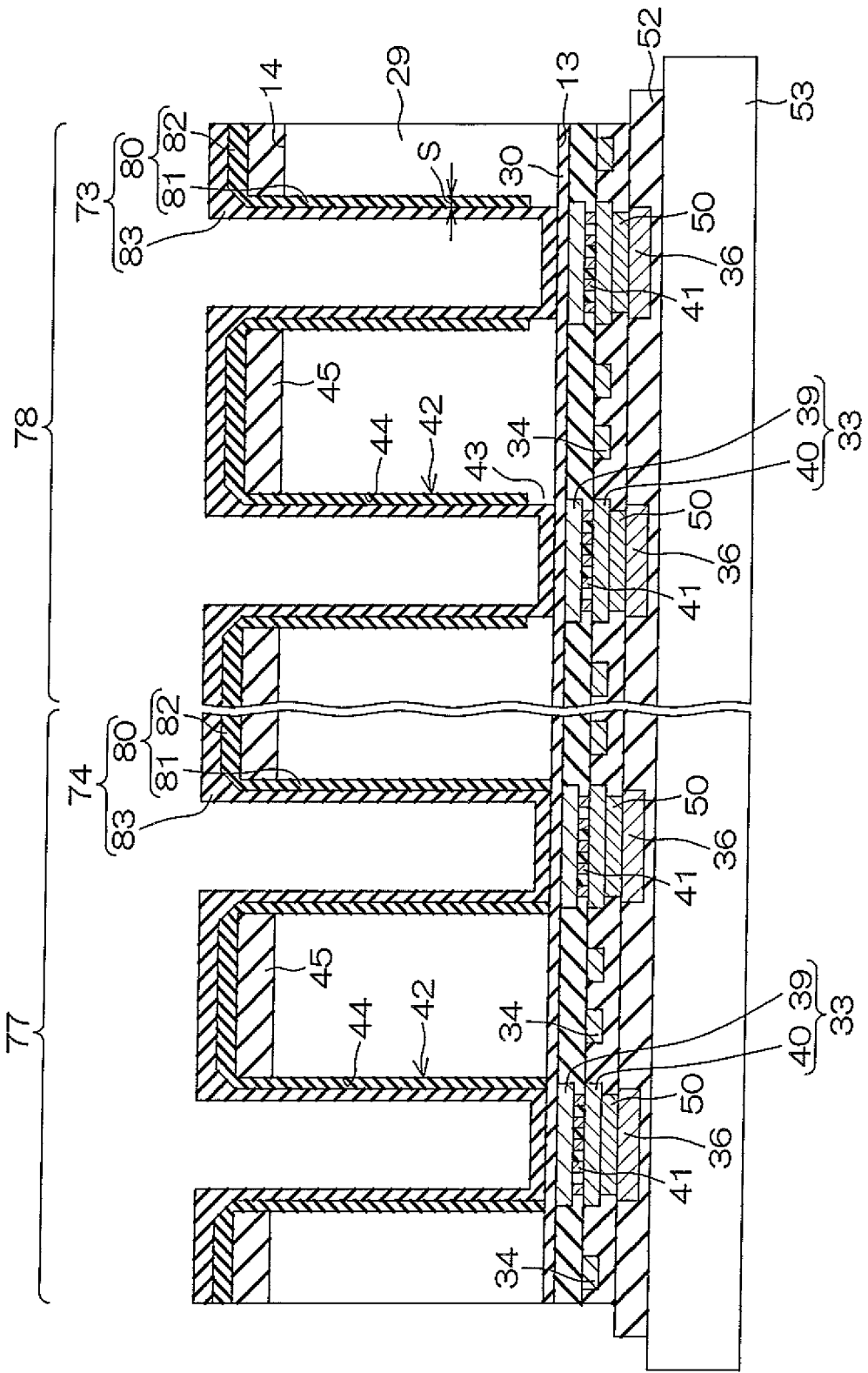
Figure 14J:
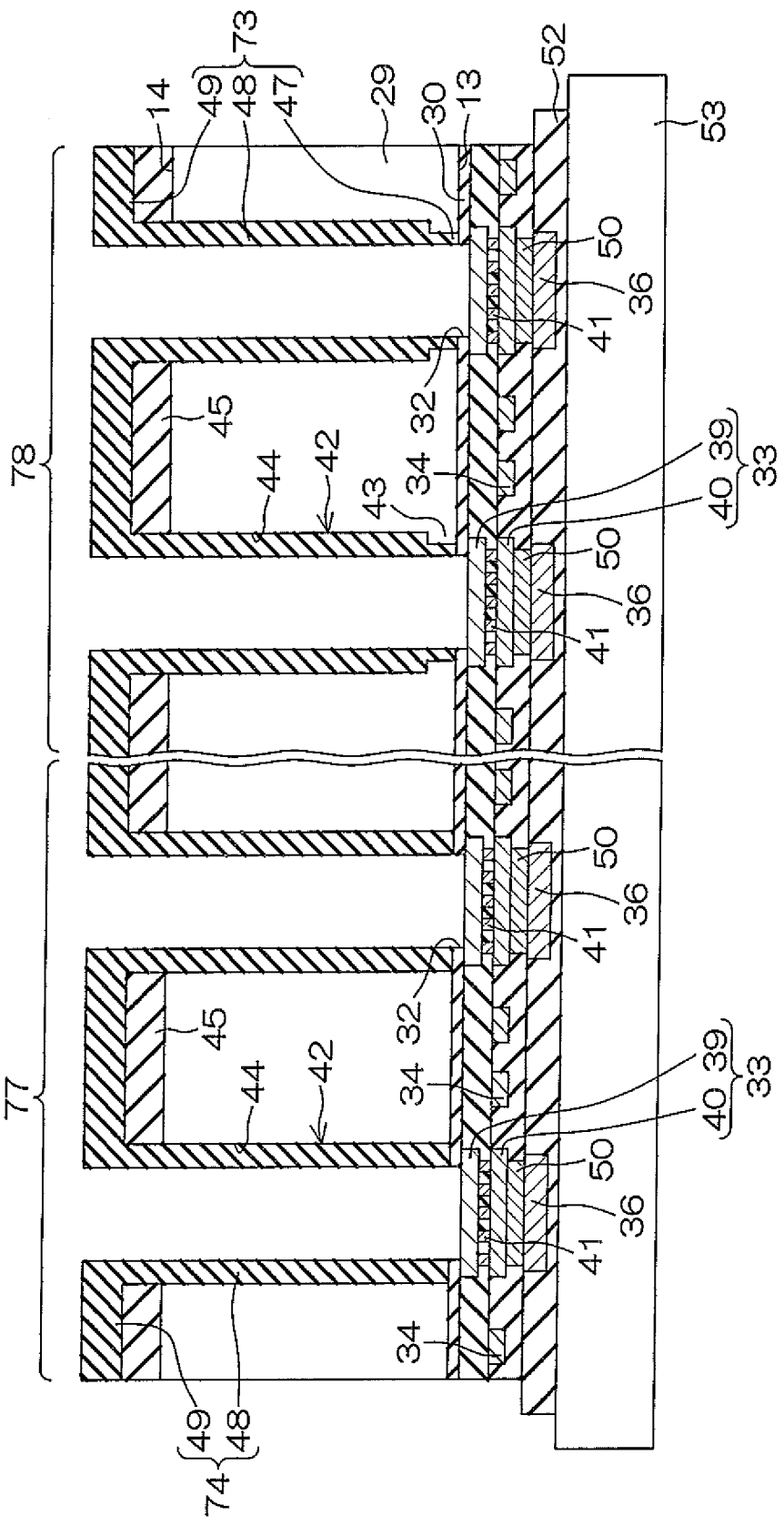
Figure 14K:
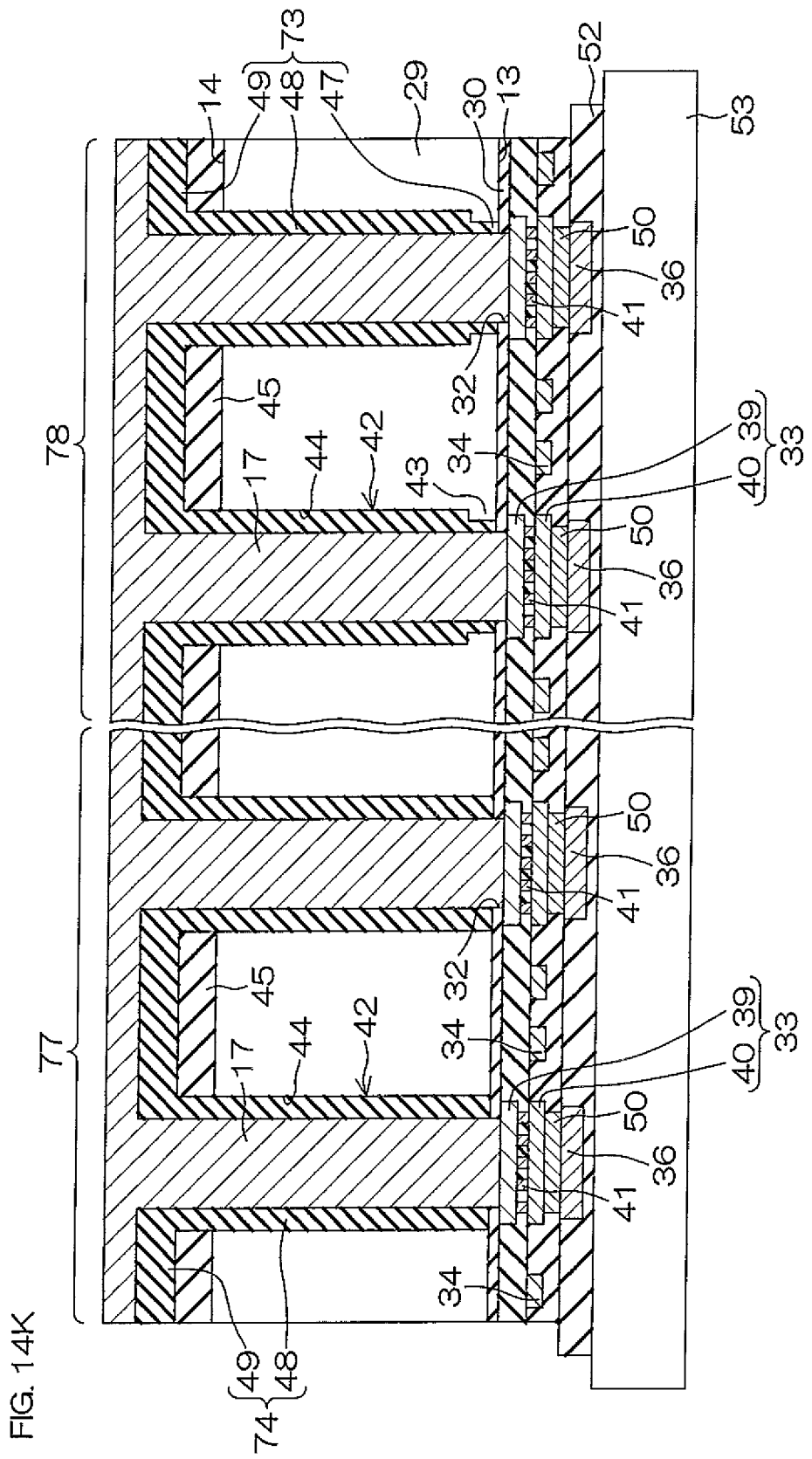
Figure 14L:
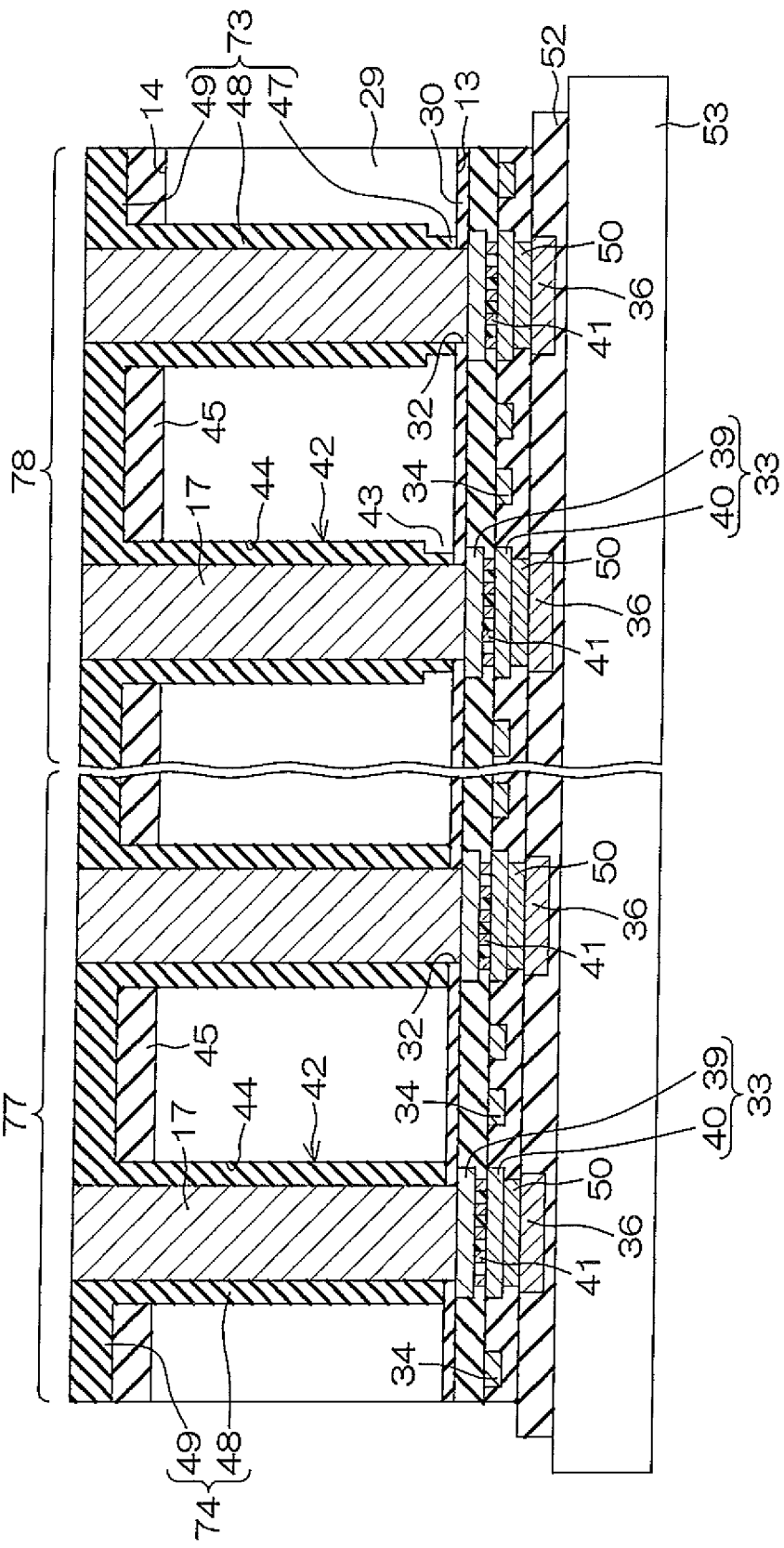
Figure 14M:
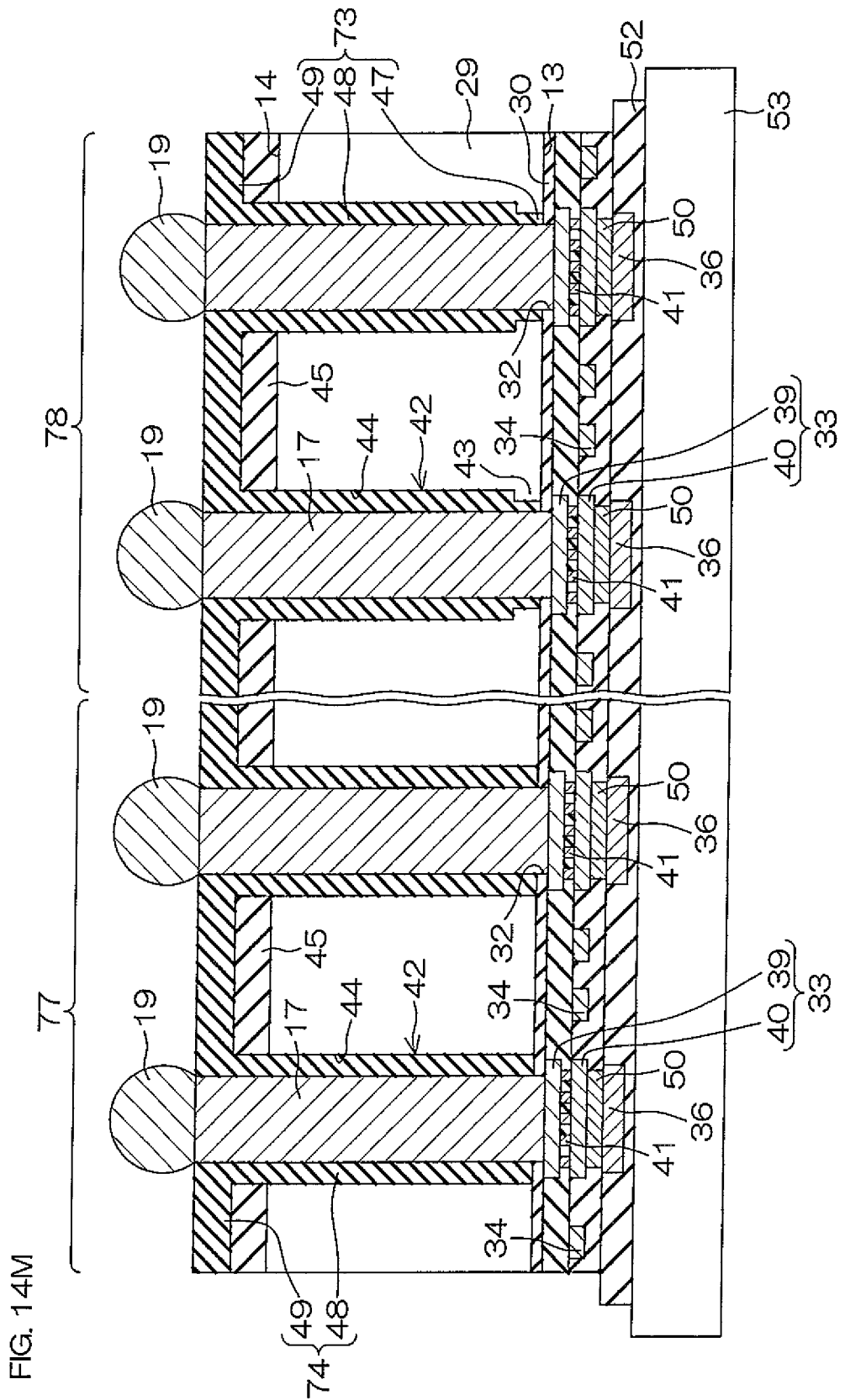
Figure 14N:
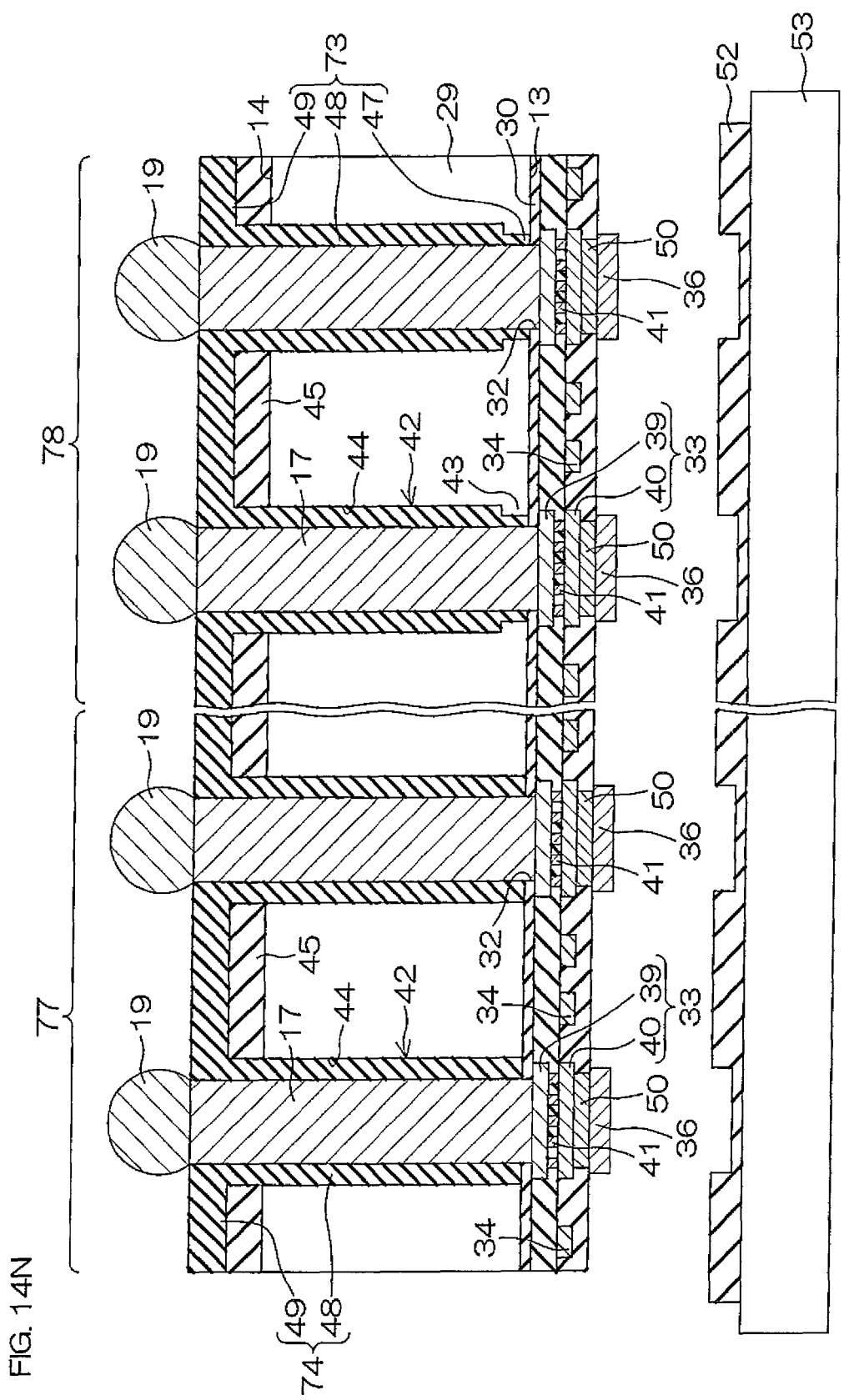

FIGS. 14A to 14N partially illustrate manufacturing steps for the arithmetic chips 71 and 72 shown in FIG. 13 in step order. In the steps described below, it is assumed that all element regions 75 including the first and second element regions 77 and 78 are collectively treated, unless otherwise stated.

In order to manufacture the first and second arithmetic chips 71 and 72, impurity ions (n-type and p-type ions, for example) are first implanted into a front surface 13 of the Si substrate 29 (the Si wafer 76) by a well-known method thereby forming impurity regions constituting semiconductor elements, although this step is now shown.

Then, agate insulating film 30 is formed by thermal oxidation, as shown in FIG. 14A. Thereafter lower pads 39, a first interlayer dielectric film 37, vias 41, upper pads 40 and inter-pad wires 34, a second interlayer dielectric film 38, vias 50 and front surface bumps 36 are successively formed on the gate insulating film 30 by a well-known technique of manufacturing a semiconductor device such as sputtering, photolithography or CVD.

Then, a glass substrate 53 (a support) is bonded to the front surface 13 of the Si substrate 29 through an adhesive 52, as shown in FIG. 14B.

Then, the thickness of the Si substrate 29 is reduced by polishing (back-grinding) the Si substrate 29 from the side of a rear surface 14 with a grinder or the like, for example, as shown in FIG. 14C. According to the fifth embodiment, the Si substrate 29 of not less than 700 μm in thickness is polished up to a thickness of 30 μm to 50 μm.

Then, a hard mask 54 (a silicon oxide film, for example) selectively having openings 55 on regions for forming through-electrodes 17 is formed on the rear surface 14 of the Si substrate 29, as shown in FIG. 14D.

Then, the first and second element regions 77 and 78 are simultaneously dry-etched from the side of the rear surface 14 of the Si substrate 29 by supplying etching gas ($SF_6/O_2$ or the like, for example) to the Si substrate 29 through the hard mask 54, as shown in FIG. 14E. The etching is stopped when an element region (assumed to be the first element region 77 in the fifth embodiment) exhibiting the highest etching rate among the plurality of element regions 75 is penetrated while the remaining element region (every element region excluding the first element region 77, assumed to be the second element region 78 in the fifth embodiment) is not penetrated. Thus, vias 42 (first vias) are formed on the first element region 77, while recesses 79 having bottom portions positioned in the vicinity of the front surface 13 are formed on the second element region 78 at the same time.

Then, a first insulating film 80 is formed on inner surfaces (bottom walls and peripheral walls) of the recesses 79 and the rear surface 14 of the Si substrate 29 by PECVD while leaving the hard mask 54 as an insulating film 45, as shown in FIG. 14F. The first insulating film 80 is made of silicon oxide, for example. In the step shown in FIG. 14F, the first insulating film 51 is so formed that a body portion 81 covering the vias 42 and the peripheral walls of the recesses 79 and a rear surface portion 82 covering the rear surface 14 of the Si substrate 29 are continuous with each other without projecting into the vias 42 and the recesses 42 in the vicinity of the rear surface 14 of the Si substrate 29. For example, the first insulating film 51 is preferably so formed that the thickness of the body portion 81 is 0.5 μm to 1 μm. At this time, differences are caused between the thicknesses of the body portion 81 and the rear surface portion 82 and those of bottom wall portions of the vias 42 and the recesses 79 and edge portions of the bottom walls, due to influence by coverage of the PECVD. The thickness differences are generally in order of the rear surface portion 82>the body portion 81>the bottom wall portions>the edge portions. When the body portion 81 is 0.5 μm to 1 μm in thickness, therefore, the thickness of the rear surface portion 82 is 2 μm to 3 μm.

Formation of overhangs is prevented by relatively thinly forming the first insulating film 80 in advance of formation of a second insulating film 83 (described later) forming the outermost layers of the via insulating films 73 and 74 as in the step shown in FIG. 14F, whereby the via insulating films 73 and 74 can be effectively prevented from formation of overhangs in the final shapes.

Then, bottom portions (located on bottom walls of the vias 42 in the first element region 77 and the bottom walls of the recesses 79 in the second element region 78) of the first insulating film 80 are selectively removed by etchback, as shown in FIG. 14G. Thus, the gate insulating film 30 is exposed in the vias 42, and the bottom walls of the recesses 79 are exposed at the same time.

Then, portions of the Si substrate 29 remaining on the bottom walls of the recesses 79 are etched while leaving the first insulating film 80 on the peripheral walls 44 of the vias 42 and the peripheral walls of the recesses 79, as shown in FIG. 14H. The etching is continued to reach the gate insulating film 30. Thus, the vias 42 (second vias) passing through the Si substrate 29 are formed also on the second element region 78, while front surface portions of the Si substrate 29 remaining under the first insulating film 80 are selectively formed as the flange portions 43 of the peripheral walls 44 of the vias 42 at the same time. In the step shown in FIG. 14H, corner portions of the first insulating film 80 where the body portion 81 and the rear surface portion 82 of the first insulating film 80 intersect with each other are preferably downwardly tapered. When the corner portions of the first insulating film 80 are tapered, the via insulating films 73 and 74 can be more effectively prevented from formation of overhangs in the final shapes.

Then, the second insulating film 83 is formed on the inner surfaces (the bottom walls and the peripheral walls 44) of the vias 42 in the first and second element regions 77 and 78 and the whole region of the rear surface 14 of the Si substrate 29 by PECVD, as shown in FIG. 14I. Thus, the via insulating film 74 consisting of the first and second insulating films 80 and 83 is formed on the first element region 77. On the other hand, the via insulating film 73 consisting of the first and second insulating films 80 and 83 is formed on the second element region 78.

The flange portions 43 are made of Si left immediately under the first insulating film 80 and not removed by the etching for forming the vias 42 (the second vias). Therefore, the thickness of the first insulating film 80 is identical to that of the steps S. When the second insulating film 83 is formed, therefore, no steps are formed on the boundaries between a front surface of the first insulating film 80 and the flange portions 43, but the same form a smooth continuous surface. In other words, the first insulating film 80 can compensate for steps between the flange portions 43 and the remaining portions of the peripheral walls 44. The second insulating film 83 is formed to extend over the front surface of the first insulating film 80 and the flange portions 43 smoothly continuous with one another as described above, to have a planar surface with no steps from opening ends up to bottom portions of the vias 42.

According to the fifth embodiment, the second insulating film 83 is made of silicon oxide, for example. In other words, both of the first and second insulating films 80 and 83 are silicon oxide films, whereby the via insulating films 73 and 74 in the manufactured first and second arithmetic chips 71 and 72 are single-layer films of silicon oxide formed by integration of the first and second insulating films 80 and 83, as shown in FIGS. 13 and 14J to 14N. The first and second insulating films 80 and 83, both made of silicon oxide, may not be completely integrated with each other but may form multilayer films of virtually overlapping silicon oxide films.

The second insulating film 83 is preferably formed with a thickness exceeding that of the first insulating film 80. The thickness of the second insulating film 83 is so increased that insulating films having sufficient strength and pressure resistance can be formed on edge portions of the vias 42 particularly reduced in thickness in the second insulating film 83. On the other hand, edge portions of the recesses 79 in the first insulating film 80 are reinforced in the formation of the second insulating film 83 even if the same are extremely reduced in thickness, and hence the same cause no particular problem, dissimilarly to the edge portions of the second insulating film 83 still remaining in the final shape.

Then, portions located on bottom walls of the via insulating films 83 and portions of the gate insulating film 30 located under these portions are selectively removed by etchback, as shown in FIG. 14J. Thus, surface pads (the lower pads 39) are exposed from openings 32 of the gate insulating film 30.

Then, a seed film (a multilayer film of Ti and Cu, for example) is sputtered onto front surfaces of the via insulating films 73 and 74, and Cu is thereafter grown from the seed film by electroplating, as shown in FIG. 14K. Thus, Cu (an electrode material) is charged into the vias 42 inside the via insulating films 73 and 74, to form the through-electrodes 17 electrically connected to the surface pads 33.

Then, excess portions (portions outside the vias 42) of the through-electrodes 17 are removed by CMP (Chemical Mechanical Polishing) until the polished surfaces are flush with rear surface portions 49 of the via insulating films 73 and 74, as shown in FIG. 14L.

Thereafter rear surface bumps 19 are formed one by one on the through-electrodes 17 as shown in FIG. 14M, and the SI substrate 29 is detached from the glass substrate 53, as shown in FIG. 14N. Thereafter the Si substrate 29 (the Si wafer 76) is cut into the respective element regions, thereby obtaining the first and second arithmetic chips 71 and 72 shown in FIG. 13.

According to the fifth embodiment, as hereinabove described, the peripheral walls 44 of the vias 42 (the first vias) of the first element region 77 are protected by the first insulating film 80 when the vias 42 (the second vias) are formed by further etching the recesses 79 formed on the second element region 78 (FIG. 14H). Even if lower portions of the vias 42 of the first element region 77 are overetched in the formation of the vias 42 of the second element region 78, therefore, the first insulating film 80 can prevent the peripheral walls 44 from etching resulting from transverse progress thereof. Consequently, the vias 42 of the first and second element regions 77 and 78 can be prevented from formation of notches, whereby sputter seed films can be excellently formed on the inner surfaces of the vias 42. Therefore, formation of voids can be prevented when the through-electrodes 17 are formed in the vias 42 by plating, whereby the yield of the through-electrodes 17 is improved. Further, the second insulating film 83 can also be excellently formed, whereby insulativity of the through-electrodes 17 can be reliably ensured.

While the embodiments of the present invention have been described, the present invention may be embodied in other ways.

For example, the through-electrodes 17 may be in the form of elliptic, quadrangular, hexagonal or octagonal columns.

The through-electrodes 17 can be formed by charging polysilicon into the vias 42 by CVD. In this case, however, the Si substrate 29 and the glass substrate 53 are exposed to a high temperature and hence a countermeasure must be so taken as not to melt the adhesive 52. In other words, electroplating is preferably employed as in the aforementioned embodiments, when the adhesive 52 has a relatively low heat-resistant temperature (about 200° C.).

The characteristics grasped from the disclosure of the aforementioned embodiments can be combined with one another between the different embodiments. Further, the elements shown in the embodiments can be combined with one another in the range of the present invention.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2012-111850 filed with the Japan Patent Office on May 15, 2012, the disclosure of which is incorporated herein by reference.

What is claimed is:

1. A semiconductor device, comprising:
   a semiconductor substrate comprised of a semiconductor material;
   a surface electrode provided on a front surface of the semiconductor substrate through an insulating film;
   a via passing through the semiconductor substrate from a rear surface thereof up to the front surface to reach the surface electrode, the via having a wall including a flange portion inwardly projecting on a front surface portion of the semiconductor substrate, the flange portion being formed from the semiconductor substrate and comprising the semiconductor material;
   a via insulating film formed on the wall of the via; and
   a through-electrode embedded inside the via insulating film and electrically connected to the surface electrode, wherein
   the via insulating film has portions having different thickness thereof compensating for a step between the flange portion and a remaining portion of the wall, to planarize a contact surface with the through-electrode, and
   a thickness of the via insulating film around the flange portion of the via being thinner than a thickness of the via insulating film on the remaining portion of the wall.

2. The semiconductor device according to claim 1, wherein
   the via insulating film includes a body portion covering the wall of the via and a rear surface portion covering the rear surface of the semiconductor substrate, and
   the body portion and the rear surface portion are continuous with each other to follow an opening shape of the via.

3. The semiconductor device according to claim 1, wherein
   an inner diameter of the flange portion of the via is smaller than a diameter of the surface electrode, and an inner diameter of the remaining portion of the wall is greater than the diameter of the surface electrode.

4. The semiconductor device according to claim 3, wherein
   the inner diameter of the flange portion of the via is 3 μm to 9 μm, and the inner diameter of the remaining portion of the wall is 5 μm to 10 μm.

5. The semiconductor device according to claim 1, wherein
   the via insulating film is a single-layer film of silicon oxide.

6. The semiconductor device according to claim 1, wherein
   the via insulating film is a multilayer film including a first silicon oxide film and a second silicon oxide film successively stacked from a side closer to the wall,
   the first silicon oxide film is formed on a portion of the wall excluding the flange portion, and has the same thickness as the step, and
   the second silicon oxide film is formed to cover the first silicon oxide film and the flange portion.

7. The semiconductor device according to claim 1, wherein
   the via insulating film is a multilayer film including a silicon oxide film and a silicon nitride film successively stacked from a side closer to the wall,
   the silicon oxide film is formed on the wall excluding the flange portion, and has the same thickness as the step, and
   the silicon nitride film is formed to cover the silicon oxide film and the flange portion.

8. The semiconductor device according to claim 7, further comprising a barrier film arranged between the via insulating film and the through-electrode.

9. The semiconductor device according to claim 8, wherein the barrier film is a tantalum film.

10. The semiconductor device according to claim 1, wherein said surface electrode comprises a plurality of surface electrodes, further comprising a wire set between the plurality of surface electrodes adjacent to each other.

11. The semiconductor device according to claim 1, wherein
    the surface electrode includes a multilayer electrode stacked through an interlayer dielectric film.

12. The semiconductor device according to claim 1, further comprising a front surface bump for external connection arranged on a position immediately above the through-electrode so that the surface electrode is placed between the front surface bump and the through-electrode.

13. The semiconductor device according to claim 1, further comprising a rear surface bump for external connection arranged on an end portion of the through-electrode closer to the rear surface of the semiconductor substrate.

14. The semiconductor device according to claim 1, wherein
the through-electrode is provided in a form of a column.

15. The semiconductor device according to claim 1, wherein
the front surface of the semiconductor substrate includes an element forming surface provided with a plurality of semiconductor elements.

16. An electronic component, comprising:
a first semiconductor device including:
   a semiconductor substrate comprised of a semiconductor material;
   a surface electrode provided on a front surface of the semiconductor substrate through an insulating film;
   a via passing through the semiconductor substrate from a rear surface thereof up to the front surface to reach the surface electrode, the via having a wall including a flange portion inwardly projecting on a front surface portion of the semiconductor substrate, the flange portion being formed from the semiconductor substrate and comprising the semiconductor material;
   a via insulating film formed on the wall of the via; and
   a through-electrode embedded inside the via insulating film and electrically connected to the surface electrode, wherein
   the via insulating film has portions having different thickness thereof compensating for a step between the flange portion and a remaining portion of the wall, to planarize a contact surface with the through-electrode, and a thickness of the via insulating film around the flange portion of the via being thinner than a thickness of the via insulating film on the remaining portion of the wall;
an interposer having a plurality of external terminals on a rear surface thereof, wherein
   the first semiconductor device is stacked above such that a rear surface thereof is facing to a front surface of the interposer;
a second semiconductor device, having a rear surface bump, stacked on a front surface of the first semiconductor device so that the rear surface bump of the second semiconductor device is electrically connected to the through-electrode of the first semiconductor device; and
a resin package sealing the first semiconductor device and the second semiconductor device.

17. A semiconductor device, comprising:
a semiconductor substrate comprised of a semiconductor material;
a surface electrode provided on a front surface of the semiconductor substrate through an insulating film;
a via passing through the semiconductor substrate from a rear surface thereof up to the front surface to reach the surface electrode, the via having a wall including a flange portion inwardly projecting into a space defined by the via on a front surface portion of the semiconductor substrate, the flange portion being formed from the semiconductor substrate and comprising the semiconductor material;
a via insulating film formed on the wall of the via; and
a through-electrode embedded inside the via insulating film and electrically connected to the surface electrode, wherein
the via insulating film has portions having different thickness thereof compensating for a step between the flange portion and a remaining portion of the wall, to planarize a contact surface with the through-electrode.

* * * * *